United States Patent
Flynn et al.

(10) Patent No.: US 10,956,258 B2
(45) Date of Patent: *Mar. 23, 2021

(54) SYSTEMS AND METHODS FOR ADAPTIVE DATA STORAGE

(71) Applicant: Unification Technologies LLC, Frisco, TX (US)

(72) Inventors: David Flynn, Sandy, UT (US); John Strasser, Syracuse, UT (US); Bill Inskeep, West Valley City, UT (US)

(73) Assignee: Unification Technologies LLC, Frisco, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/245,233

(22) Filed: Jan. 10, 2019

(65) Prior Publication Data

US 2019/0146867 A1    May 16, 2019

Related U.S. Application Data

(63) Continuation of application No. 15/284,019, filed on Oct. 3, 2016, now Pat. No. 10,216,569, which is a
(Continued)

(51) Int. Cl.
| | |
|---|---|
| H05K 7/14 | (2006.01) |
| G06F 11/10 | (2006.01) |
| G06F 12/02 | (2006.01) |
| H04L 12/46 | (2006.01) |
| H04L 12/64 | (2006.01) |

(Continued)

(52) U.S. Cl.
CPC ...... *G06F 11/1044* (2013.01); *G06F 11/1008* (2013.01); *G06F 11/108* (2013.01); *G06F 11/1068* (2013.01); *G06F 12/0253* (2013.01); *H04L 12/4625* (2013.01); *H04L 12/6418* (2013.01); *H05K 7/1444* (2013.01); *G06F 11/1092* (2013.01); *G06F 2211/109* (2013.01); *G06F 2212/2022* (2013.01); *H04L 67/1097* (2013.01)

(58) Field of Classification Search
CPC ............ G06F 11/1068; G06F 11/1072; G06F 11/10008; G06F 11/1076; G06F 11/1092; G06F 2212/2022; G11C 29/00; H05K 7/1444; H04L 12/6418; H04L 12/4625
See application file for complete search history.

(56) References Cited

U.S. PATENT DOCUMENTS

| | | | | |
|---|---|---|---|---|
| 9,116,823 | B2 * | 8/2015 | Fillingim | G06F 11/1044 |
| 9,495,241 | B2 * | 11/2016 | Flynn | G06F 12/0253 |
| 10,216,569 | B2 * | 2/2019 | Flynn | G06F 12/0253 |

* cited by examiner

*Primary Examiner* — Guy J Lamarre
(74) *Attorney, Agent, or Firm* — The Noblitt Group, PLLC

(57) ABSTRACT

A storage module is configured to store data segments, such as error-correcting code (ECC) codewords, within an array comprising two or more solid-state storage elements. The data segments may be arranged in a horizontal arrangement, a vertical arrangement, a hybrid channel arrangement, and/or vertical stripe arrangement within the array. The data arrangement may determine input/output performance characteristics. An optimal adaptive data storage configuration may be based on read and/or write patterns of storage clients, read time, stream time, and so on. Data of failed storage elements may be reconstructed by use of parity data and/or other ECC codewords stored within the array.

30 Claims, 22 Drawing Sheets

Related U.S. Application Data continuation of application No. 13/784,705, filed on Mar. 4, 2013, now Pat. No. 9,495,241, which is a continuation-in-part of application No. 13/296,834, filed on Nov. 15, 2011, now abandoned, which is a continuation-in-part of application No. 11/952,101, filed on Dec. 6, 2007, now Pat. No. 8,402,201.

(60) Provisional application No. 60/974,470, filed on Sep. 22, 2007, provisional application No. 60/873,111, filed on Dec. 6, 2006, provisional application No. 61/606,755, filed on Mar. 5, 2012, provisional application No. 61/606,253, filed on Mar. 2, 2012.

(51) Int. Cl.
    *H04L 29/08*     (2006.01)
    *G11C 29/00*     (2006.01)

606

118

| | | | | | |
|---|---|---|---|---|---|
| ECC CW 0 | ECC CW 4 | ECC CW 8 | ------ | ECC CW 92 | ⎫ Vertical Stripe 646A |
| ECC CW 1 | ECC CW 5 | ECC CW 9 | ------ | ECC CW 93 | |
| ECC CW 2 | ECC CW 6 | ECC CW 10 | ... | ECC CW 93 | |
| ECC CW 3 | ECC CW 7 | ECC CW 11 | ------ | ECC CW 95 | ⎭ |
| ECC CW 96 | ECC CW 100 | ECC CW 104 | ------ | ECC CW 184 | ⎫ Vertical Stripe 646B |
| ECC CW 97 | ECC CW 101 | ECC CW 105 | ------ | ECC CW 185 | |
| ECC CW 98 | ECC CW 102 | ECC CW 106 | ... | ECC CW 186 | |
| ECC CW 99 | ECC CW 103 | ECC CW 107 | ------ | ECC CW 187 | ⎭ |
| ⋮ | | | | | |
| ECC CW 288 | ECC CW 292 | ECC CW 296 | ------ | ECC CW 380 | ⎫ Vertical Stripe 646N |
| ECC CW 289 | ECC CW 293 | ECC CW 297 | ------ | ECC CW 381 | |
| ECC CW 290 | ECC CW 294 | ECC CW 298 | ... | ECC CW 382 | |
| ECC CW 291 | ECC CW 295 | ECC CW 299 | ------ | ECC CW 383 | ⎭ |
| 0 | 1 | 2 | | 24 | |

542 (left bracket)

SYSTEMS AND METHODS FOR ADAPTIVE DATA STORAGE

CROSS-REFERENCE TO RELATED APPLICATIONS

This application is a continuation of U.S. application Ser. No. 15/284,019 filed Oct. 3, 2016, which is a continuation of U.S. application Ser. No. 13/784,705 filed Mar. 4, 2013, now U.S. Pat. No. 9,495,241, which claims priority to U.S. Provisional Application No. 61/606,253 filed Mar. 2, 2012 and to U.S. Provisional Application No. 61/606,755 filed Mar. 5, 2012, and is a continuation-in-part of, and claims priority to, U.S. application Ser. No. 13/296,834 filed Nov. 15, 2011, which is a continuation-in-part of, and claims priority to, U.S. application Ser. No. 11/952,101 filed Dec. 6, 2007, now U.S. Pat. No. 8,402,201, which claims priority to U.S. Provisional Application No. 60/873,111 filed Dec. 6, 2006 and to U.S. Provisional Application No. 60/974,470 filed Sep. 22, 2007, all of which are incorporated herein by reference in their entirety.

TECHNICAL FIELD

This disclosure relates to data storage and, in particular, to data layout and/or arrangement on a solid-state storage medium.

BACKGROUND

Solid-state storage devices may have different read time Tr, stream time Ts, and other characteristics, which may affect device performance in different data layout configurations. Usage characteristics, such as the size of typical read and/or write operations may also impact device performance. What is needed is a storage module capable of adaptive data layout to enable the solid-state storage device to provide improved performance in accordance with different storage medium characteristics and/or device usage patterns.

SUMMARY

Disclosed herein are embodiments of an apparatus for adaptive data storage. The apparatus may comprise a storage module configured to manage storage operations on a plurality of solid-state storage elements, an error-correcting code (ECC) write module configured to generate an ECC codeword comprising data for storage on the solid-state storage elements, and an adaptive write module configured to store portions of the ECC codeword on two or more of the solid-state storage elements. The ECC write module may be configured to generate a first set of ECC codewords comprising data of a first storage request and a second set of ECC codewords comprising data of a second storage request. The adaptive write module may be configured to store the first set of ECC codewords in a first set of one or more solid-state storage elements and to store the second set of ECC codewords in a second, different set of one or more solid-state storage elements.

The apparatus may further comprise an adaptive read module configured to read ECC codewords comprising the data of the first storage request from the first set of solid-state storage elements and to read ECC codewords comprising the data of the second storage request from the second set of solid-state storage elements in a single read operation.

In some embodiments, the adaptive write module may be configured to divide the plurality of solid-state storage elements into a plurality of independent channels, each independent channel comprising a respective subset of solid-state storage elements. The adaptive write module may be configured to store ECC codewords corresponding to respective storage requests within respective independent channels.

The apparatus may comprise an adaptive profiling module configured to determine an optimal independent channel configuration based on one or more of a read time of the solid-state storage elements, a stream time of ECC codewords, and/or profiling data pertaining to storage operations performed by the storage module.

In some embodiments, the apparatus further comprises a relational module configured to mark the ECC codeword with relational information derived from a logical identifier corresponding to the data of the ECC codeword, and an ECC decode module configured to validate the mark.

Disclosed here are embodiments of an apparatus for adaptive storage comprising, a storage module configured to manage storage operations on a solid-state storage array comprising a plurality of columns, each column comprising a respective solid-state storage element, an ECC write module configured to generate ECC codewords comprising data segments for storage on the solid-state storage array, and an adaptive write module configured to format the ECC codewords into vertical stripes, wherein the vertical stripes are configured to arrange data of the ECC codewords within respective columns of the solid-state storage array, wherein two or more ECC codewords comprising one of the data segments are stored within two or more different columns.

The apparatus may further comprise an adaptive read module configured to identify two or more columns comprising ECC codewords comprising a requested data segment, and to read the ECC codewords comprising the requested data segment from the two or more columns in parallel.

In some embodiments, the apparatus further comprises a read sequence module configured to reorder the ECC codewords in accordance with an order of the requested data segment and the vertical stripe arrangement of the ECC codewords within the solid-state storage array. The apparatus may also include an adaptive schedule module configured to combine two or more read operations into a combined read operation, the two or more read operations corresponding to ECC codewords stored within different sets of columns of the solid-state storage array. The apparatus may include an ordered queue of storage requests, wherein the adaptive schedule module is configured to combine two or more read operations within the ordered queue into the combined read operation, wherein combining the two or more storage requests comprises modifying an order of the storage requests within the ordered queue. The combined read operation may comprise providing different addressing information to the different sets of columns of the solid-state storage array.

The apparatus may further include an ECC read module configured to detect an uncorrectable ECC codeword in response to a first read operation, and a data recovery module configured to recover the uncorrectable ECC codeword by reading other ECC codewords within the vertical stripe with the uncorrectable ECC codeword in a second read operation, decoding the other ECC codewords, and reconstructing the uncorrectable ECC codeword using the decoded ECC codewords and parity data of the vertical stripe.

Disclosed herein are embodiments of an apparatus, comprising a write module configured to generate data rows for storage within columns of a solid-state storage array, a parity module configured to generate respective parity data for each of the data rows, and an adaptive write module configured to stream the data rows and the corresponding parity data to respective columns of the solid-state storage array in parallel.

The apparatus may include an adaptive write module configured to arrange ECC codewords for storage within respective subsets of the columns of the solid-state storage array, wherein each of the data rows comprises data of two or more different ECC codewords. The adaptive write module may be configured to store the two or more different ECC codewords within respective subsets of columns of the solid-state storage array by streaming a plurality of data rows and corresponding parity data to the respective columns of the solid-state storage array, wherein each data row comprises data of each of the two or more different ECC codewords. In some embodiments, each data row comprises a byte of each of the two or more different ECC codewords and a corresponding parity byte.

The apparatus may further comprise a data reconstruction module configured to reconstruct an uncorrectable ECC codeword of the two or more ECC codewords by accessing data rows and corresponding parity data comprising the two or more ECC codewords from the solid-state storage array, correcting other ECC codewords within the accessed data rows, and reconstructing the uncorrectable ECC codeword using the corrected ECC codewords and the corresponding parity data. Reconstructing the uncorrectable ECC codeword may comprise a byte-wise parity substitution using the corrected ECC codewords and the corresponding parity data.

Disclosed herein are embodiments of a method for adaptive storage. The disclosed methods may comprise one or more machine-executable operations and/or steps. The disclosed operations and/or steps may be embodied as program code stored on a computer readable storage medium. Accordingly, embodiments of the methods disclosed herein may be embodied as a computer program product comprising a computer readable storage medium storing computer usable program code executable to perform one or more method operations and/or steps.

The disclosed method may comprise acquiring profiling data pertaining to storage operations performed on a solid-state storage array comprising a plurality of independent data columns, each independent data column comprising a solid-state storage element, determining performance characteristics corresponding to a plurality of different adaptive data storage configurations, wherein each of the adaptive data storage configurations corresponds to storage of data segments in one of a horizontal configuration, a vertical configuration, a hybrid configuration, and a vertical stripe configuration, and determining an optimal adaptive data storage configuration based on the determined performance characteristics. The horizontal configuration may comprise storing ECC codewords within each of the independent data columns. The vertical configuration may comprise storing ECC codewords within respective independent data columns. The hybrid configuration may comprise storing ECC codewords within respective subsets of the independent data columns. The vertical stripe configuration may comprise storing ECC codewords within respective independent data columns at a vertical stripe depth. The vertical stripe depth may be less than a page depth of the solid-state storage elements.

Disclosed herein is a method for adaptive storage comprising identifying an uncorrectable ECC codeword stored within one of a plurality of solid-state storage elements, correcting one or more ECC codewords stored within others of the plurality of solid-state storage elements, accessing parity data corresponding to the uncorrectable ECC codeword and corrected ECC codewords, and rebuilding data of the uncorrectable ECC codeword through parity substitution operations comprising the corrected ECC codewords and the accessed parity data. The method may further comprise arranging ECC codewords for storage within respective independent channels, each independent channel comprising one or more of the solid-state storage elements.

In some embodiments, the method includes buffering ECC codewords for storage within respective solid-state storage elements, and streaming data rows to the solid-state storage elements, each data row comprising a byte of a respective ECC codeword for storage on a respective one of the solid-state storage elements and a corresponding parity byte. Rebuilding data of the uncorrectable ECC codeword may comprise accessing data rows stored within the solid-state storage elements and performing byte-wise parity substitution operations to rebuild the uncorrectable ECC codeword.

Disclosed herein are methods for adaptive storage comprising, determining a storage location of a plurality of ECC codewords comprising requested data, wherein the ECC codewords are stored within a group of two or more different solid-state storage elements of a solid-state storage array, identifying ECC codewords comprising data of one or more other requests stored within different groups of solid-state storage elements of the solid-state storage array, scheduling a read operation on the solid-state storage array configured to read the ECC codewords of the requested data and ECC codewords comprising data of the one or more other requests in a single read operation on the solid-state storage array.

The method may further include queuing storage requests in an ordered request buffer, and determining a storage location of ECC codewords of one or more other requests in the request buffer. Scheduling the read operation may comprise reordering one or more storage requests in the ordered request buffer. Scheduling the read operation may further include providing different addressing information for two or more of the solid-state storage elements. In some embodiments, the method further comprises reordering contents of a read buffer to reconstruct a data packet stored within the plurality of ECC codewords comprising the requested data.

Disclosed herein are embodiments of a system for adaptive storage, comprising means for generating ECC codewords comprising data segments for storage on one or more solid-state storage elements, wherein each solid-state storage elements are communicatively coupled to a storage controller by a bus, means for arranging the ECC codewords for storage in a vertical stripe configuration, wherein the vertical stripe configuration comprises arranging each ECC codeword for storage within a respective one of the solid-state storage elements, and wherein ECC codewords comprising a data segment are arranged for storage on two or more different solid-state storage elements, and means for storing the arranged ECC codewords on the solid-state storage elements. The vertical stripe configuration may comprise arranging ECC codewords within the solid-state storage elements at a vertical stripe depth, wherein the vertical stripe depth is less than a page size of the solid-state storage elements and is an integral factor of a size of the ECC codewords.

In some embodiments, the means for arranging the ECC codewords for storage in the vertical stripe configuration comprises means for streaming data rows of the arranged ECC codewords to respective program buffers of the solid-state storage array and means for calculating parity data corresponding to each of the data rows.

The system may further include means for reconstructing a corrupt ECC codeword, comprising means for reading one or more other ECC codewords stored within a vertical stripe comprising the corrupt ECC codeword, means for correcting the one or more other ECC codewords, and means for reconstructing the corrupt ECC codeword using the corrected one or more other ECC codewords and parity data corresponding to data rows of the vertical stripe.

In some embodiments, the system may further comprise means for adaptive scheduling, including means for identifying respective sets of one or more solid-state storage elements comprising data of each of a plurality of queued read requests, and means for determining a read operation configured to perform two or more of the queued read requests in a single read operation on the plurality of solid-state storage elements.

BRIEF DESCRIPTION OF THE DRAWINGS

FIG. 6G depicts one embodiment of a vertical stripe configuration on a solid-state storage array;

DETAILED DESCRIPTION

Figure 1:
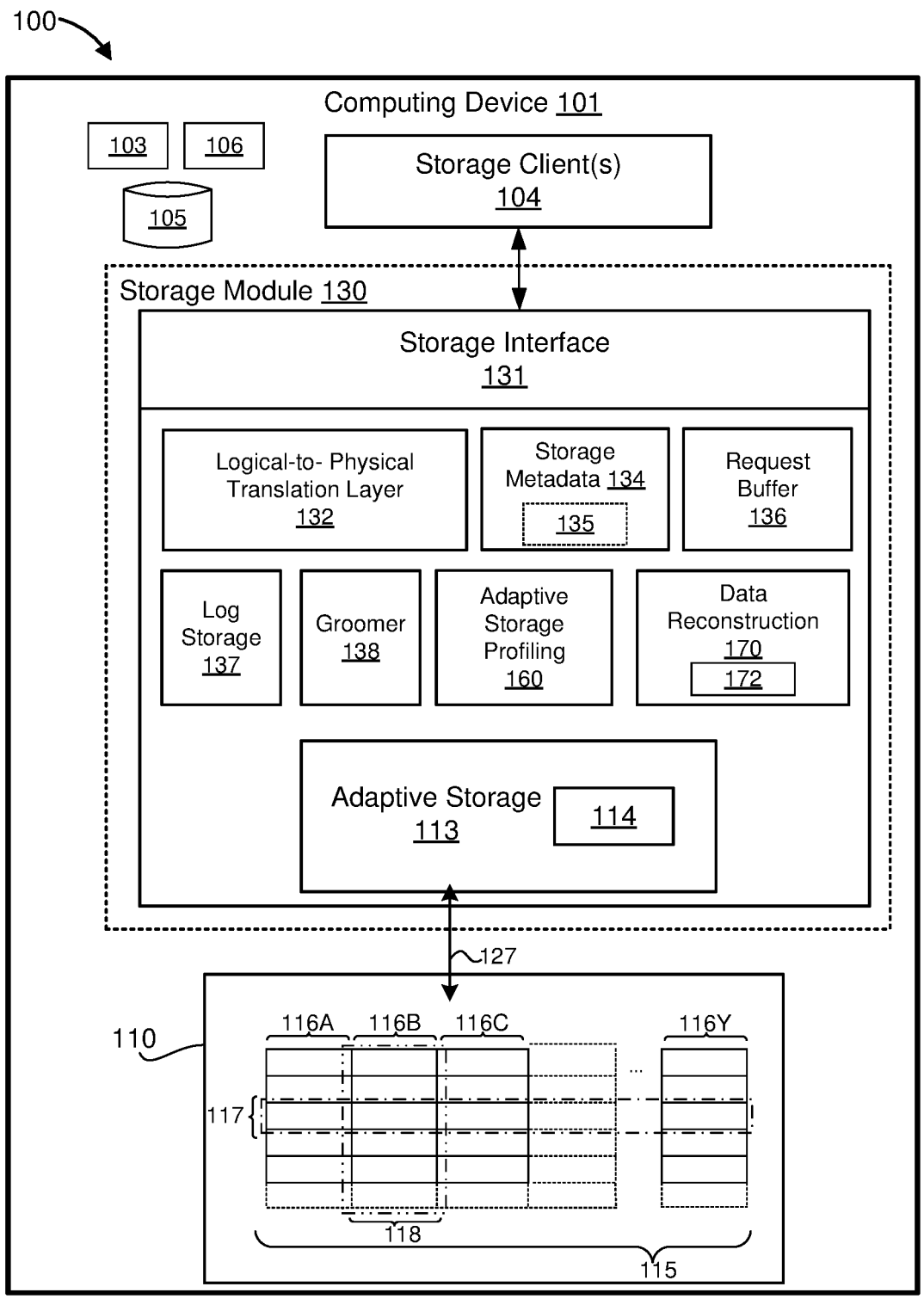
FIG. 1 is a block diagram of one embodiment of a system for adaptive storage.

FIG. 1 is a block diagram of one embodiment of a system 100 comprising a storage module 130 configured to manage a solid-state storage medium 110. The storage module 130 may comprise an adaptive storage module 113, a logical-to-physical translation layer 132, storage metadata module 134, log storage module 137, groomer module 138, a profiling module, and a data reconstruction module 170. The storage module 130 may comprise software and/or hardware components. Portions of the storage module 130 (and/or the modules and/or components thereof) may be implemented using software modules, such as drivers, services, and/or the like. Other portions of the storage module 130 (and/or the modules and/or components thereof) may be implemented using hardware resources, such as FPGAs, processors, ASICS, hardware controllers, storage controllers, and the like.

The solid-state storage medium 110 may comprise a non-volatile, solid-state storage medium, such as flash memory, nano random access memory (nano RAM or NRAM), nanocrystal wire-based memory, silicon-oxide based sub-IO nanometer process memory, graphene memory, Silicon-Oxide-Nitride-Oxide-Silicon (SONOS), Resistive Random-Access Memory (RRAM), Programmable Metallization Cell (PMC), Conductive-Bridging RAM (CBRAM), Magneto-Resistive RAM (MRAM), Dynamic RAM (DRAM), Phase change RAM (PRAM), or the like. The solid-state storage medium 110 may comprise a plurality of physical storage units (e.g., storage cells) configured for persistent data storage. The physical storage units may be arranged in groups, such as pages, which may be partitioned into storage divisions, such as erase blocks. The solid-state storage medium 110 may comprise pages of any suitable size. The page size of a solid-state storage medium 110 may range from 512 b to 32 kb.

The adaptive storage module 113 may be configured to write data to and/or read data from the solid-state storage medium 110 via a bus 127. The adaptive storage module 113 may comprise one or more hardware components, such as bus controllers, DMA controllers, storage controllers, storage media controllers, and the like. The adaptive storage module 113 may further comprise firmware, software modules, drivers, interface modules, and/or and the like.

The bus 127 may comprise a storage I/O bus for communicating data to/from the solid-state storage medium 110, and may further comprise a control I/O bus for communicating addressing and other command and control information to the solid-state storage medium 110.

The storage module 130 may comprise and/or be implemented on a computing device 101. In some embodiments, portions of the storage module 130 may be internal to the computing device 101; for example, portions of the storage module 130 and/or solid-state storage medium 110 may be connected using a system bus, such as a peripheral component interconnect express (PCI-e) bus, a Serial Advanced Technology Attachment (serial ATA) bus, or the like. The disclosure is not limited in this regard; in some embodiments, components of the storage module 130 may be external to the computing device 101, and may be connected via a universal serial bus (USB) connection, an Institute of Electrical and Electronics Engineers (IEEE) 1394 bus (FireWire), an external PCI bus, Infiniband, or the like.

The computing device 101 may comprise a processor 103, volatile memory 106, and/or persistent storage 105. The processor 103 may comprise one or more general and/or special purpose processing elements. The processor 103 may be configured to execute instructions loaded into the volatile memory 106 from the persistent storage 105. Portions of one or more of the modules of the storage module 130 may be embodied as machine-readable instructions stored on the persistent storage 105. The instructions may be configured for execution by the processor 103 to implement one or more of the modules and/or methods described herein.

One or more storage clients 104 may access storage services provided by the storage module 130 through a storage interface 131. The storage interface 131 may comprise a block device interface, a virtualized storage interface, an object storage interface, a database storage interface, and/or other suitable interface and/or Application Programming Interface (API). The storage module 130 may further comprise a logical-to-physical translation layer 132 to map and/or associate identifiers of the storage client 104 with physical storage locations (e.g., physical addresses) on the solid-state storage medium 110. The logical-to-physical translation layer 132 may provide for "any-to-any" mappings between logical identifiers and physical storage locations, such that data may be written and/or updated "out-of-place" on the solid-state storage medium 110. As used herein, a physical address refers to an address (or other reference) capable of referencing a particular storage location on the solid-state storage medium 110. Accordingly, a physical address may be a "media address."

The storage module 130 may comprise a storage metadata module 134 configured to maintain storage metadata 135 pertaining to storage operations performed on the solid-state storage medium 110. The storage metadata 135 may include, but is not limited to: an index comprising any-to-any mappings between logical identifiers of a logical address space and physical storage locations on the solid-state storage medium 110, a reverse index pertaining to the contents of the solid-state storage medium 110, one or more validity bitmaps, reliability testing and/or status metadata, status information, such as error rate, retirement status, and so on. Portions of the metadata 135 may be stored on a volatile memory 106. Alternatively, or in addition, portions of the metadata 135 may be periodically stored on a persistent storage medium, such as the persistent storage 105, solid-state storage medium 110, or the like.

The storage module 130 may comprise a request buffer 136 configured to buffer storage requests received via the storage interface 131. The request buffer 136 may comprise an ordered buffer, such as a first-in-first-out (FIFO) or the like. The request buffer 136 may, therefore, be configured to maintain the order of incoming storage requests. As used herein, a storage request refers to one or more of a request to store, write, overwrite, modify, cache, delete, erase, read, and/or otherwise manage data by use of the storage module 130. The storage module 130 may be configured to service the storage requests in the request buffer 136. The storage module 130 may be configured to service the storage requests in the order they were received. Alternatively, the storage module 130 may be configured to reorder the storage requests to improve throughput and/or efficiency. The storage module 130 may be configured to reorder the storage requests to avoid data hazards, such as read-before-write, write-before-read, and so on.

The storage module 130 may comprise a log storage module 137 configured to store data in a "contextual format" on the solid-state storage medium 110. As used herein, a "contextual format" refers to a data format in which a logical interface of a data segment is associated with the data segment on the solid-state storage medium 110. For example, a contextual format may comprise a packet format that includes a header indicating one or more logical identifiers of a data segment, or the like. The contextual format may be used to reconstruct the mappings of the logical-to-physical translation layer 132 (and/or storage metadata 135), such as any-to-any mappings between logical identifiers and physical storage locations, reverse index metadata, and the like.

In some embodiments, the storage module 130 comprises a groomer module 138 configured to perform grooming operations on the solid-state storage medium 110. Grooming operations may include, but are not limited to: reclaiming storage resources, erasure, wear leveling, refreshing data stored on the solid-state storage medium 110, and so on. The groomer module 138 may operate outside of the path for servicing other, higher-priority storage operations and/or requests. Therefore, the groomer module 138 may operate as an autonomous, background process, which may be suspended and/or deferred while other storage operations are in process. Alternatively, the groomer module 138 may operate in the foreground while other storage operations are being serviced. The groomer 138 may wear-level the non-volatile storage medium 110, such that data is systematically spread throughout different storage locations, which may improve performance, data reliability, and avoid overuse and/or underuse of particular storage locations, thereby lengthening the useful life of the solid-state storage medium 110. Grooming an erase block (or logical erase block) may comprise relocating valid data (if any) to other storage locations, erasing the erase block, and/or initializing the erase block for storage operations (e.g., marking the erase block with a sequence indicator, sequence number, timestamp, or the like). The groomer module 138 may operate within a driver of the storage module 130. Alternatively, or in addition, portions of the groomer module 138 may be implemented on the adaptive storage module 113 (e.g., as hardware components, firmware, programmable hardware components, or the like).

In some embodiments, the solid-state storage medium 110 may comprise one or more arrays 115 of solid-state storage elements 116A-Y. As used herein, a solid-state storage array (or array) refers to a set of two or more independent columns 118. A column 118 may comprise a solid-state storage element 116A-Y that is communicatively coupled to the storage module 130 in parallel by the adaptive storage module 113 using, inter alia, the bus 127. Rows 117 of the array 115 may comprise physical storage units of the respective columns 118 (solid-state storage elements 116A-Y). As used herein, a solid-state storage element 116A-Y includes, but is not limited to solid-state storage resources embodied as: a package, a chip, die, plane, printed circuit board, and/or the like. The solid-state storage elements 116A-Y comprising the array 115 may be capable independent operation. Accordingly, a first one of the solid-state storage elements 116A may be capable of performing a first storage operation while a second solid-state storage element 116B performs a different storage operation. For example, the solid-state storage element 116A may be configured to read data at a first physical address, while another solid-state storage element 116B reads data at a different physical address.

A solid-state storage array 115 may also be referred to as a logical storage element (LSE). As disclosed in further detail below, an array or logical storage element 115 may comprise logical storage units (rows 117). As used herein, a "logical storage unit" or row 117 refers to a logical construct combining two or more physical storage units, each physical storage unit on a respective column 118 of the array 115. A logical erase block refers to a set of two or more physical erase blocks, a logical page refers to a set of two or more pages, and so on. In some embodiments a logical erase block may comprise erase blocks within respective logical storage elements 115 and/or banks. Alternatively, a logical erase block may comprise erase blocks within a plurality of different arrays 115 and/or may span multiple banks of solid-state storage elements.

The storage module 130 may further comprise an adaptive storage module 113 configured arrange data for storage on the solid-state storage array 115 according to an adaptive data layout. As used herein, an adaptive data layout refers to the layout of storage data segments within different portions of the solid-state storage array 115. As used herein, a data segment refers to a quantum of structured or unstructured data; a data segment may, therefore, include, but is not limited to: data pertaining to a storage request, data corresponding to one or more logical identifiers, one or more data blocks, a data structure, such as a data packet, container, or the like, a data set, such as a data range, extent, or the like, an ECC codeword, such as an ECC syndrome, an ECC symbol, an ECC chunk, or the like, unstructured data, structured data, a data record, or the like.

The adaptive storage module 113 may be configured to store data in a horizontal layout, which may comprise storing data segments horizontally within rows 117 of the array (e.g., across a plurality of the solid-state storage elements 116A-Y of the array 115). A vertical layout may comprise storing data segments within respective columns 118 of the array 115 (e.g., within a single solid-state storage elements 116A-Y). Other layouts may comprise storing data on subsets of the solid-state storage elements 116A-Y (e.g., sets of two, four, or more solid-state storage elements 116A-Y). The storage module 130 may comprise an adaptive storage profiling module 160 configured to determine an optimal data layout for the array 115 based on one or more of data read latency, stream latency, data access patterns, profiling information, desired data recovery characteristics, usage and/or the like.

In some embodiments, the storage module 130 further comprises a data recovery module 170. The data recovery module 170 may be configured to recover data stored on the solid-storage medium 110. The storage module 130 may be configured to generate error recovery data, such as ECC data, parity data, and/or the like. The error recovery data may be stored on the solid-state storage medium 110. The ECC data may be used to detect and/or correct errors in data read from the array 115. Data comprising uncorrectable errors may be reconstructed by use of parity data. Uncorrectable errors may result from failure of a portion of a particular column 118 (e.g., failure of an erase block, plane, die, or other portion of a particular solid-state storage element 116A-Y). As disclosed in further detail herein, data corresponding to the failed column 118 may be reconstructed by use of data stored on other solid-state storage elements 116A-Y. In some embodiments, reconstructing data of a failed solid-state storage element 116A-Y may comprise reading one or more ECC codewords stored on other columns 118 of the array 115, correcting errors within the one or more other ECC codewords (e.g., decoding the ECC codewords), and using the corrected ECC codewords to reconstruct data of the failed element 116A-Y. The data reconstruction module 170 may comprise a parity substitution module 172 configured to reconstruct data of a failed column by use of error-corrected ECC codewords and/or parity data stored within the array 115. In some embodiments, data of the failed column may be reconstructed without decoding and/or correcting the other ECC codewords; if the other columns 118 have low error rates (and/or low levels of wear), the reconstruction module 170 may be configured to perform the parity substitution operations without first decoding and/or correcting the other ECC codewords.

Figure 2:
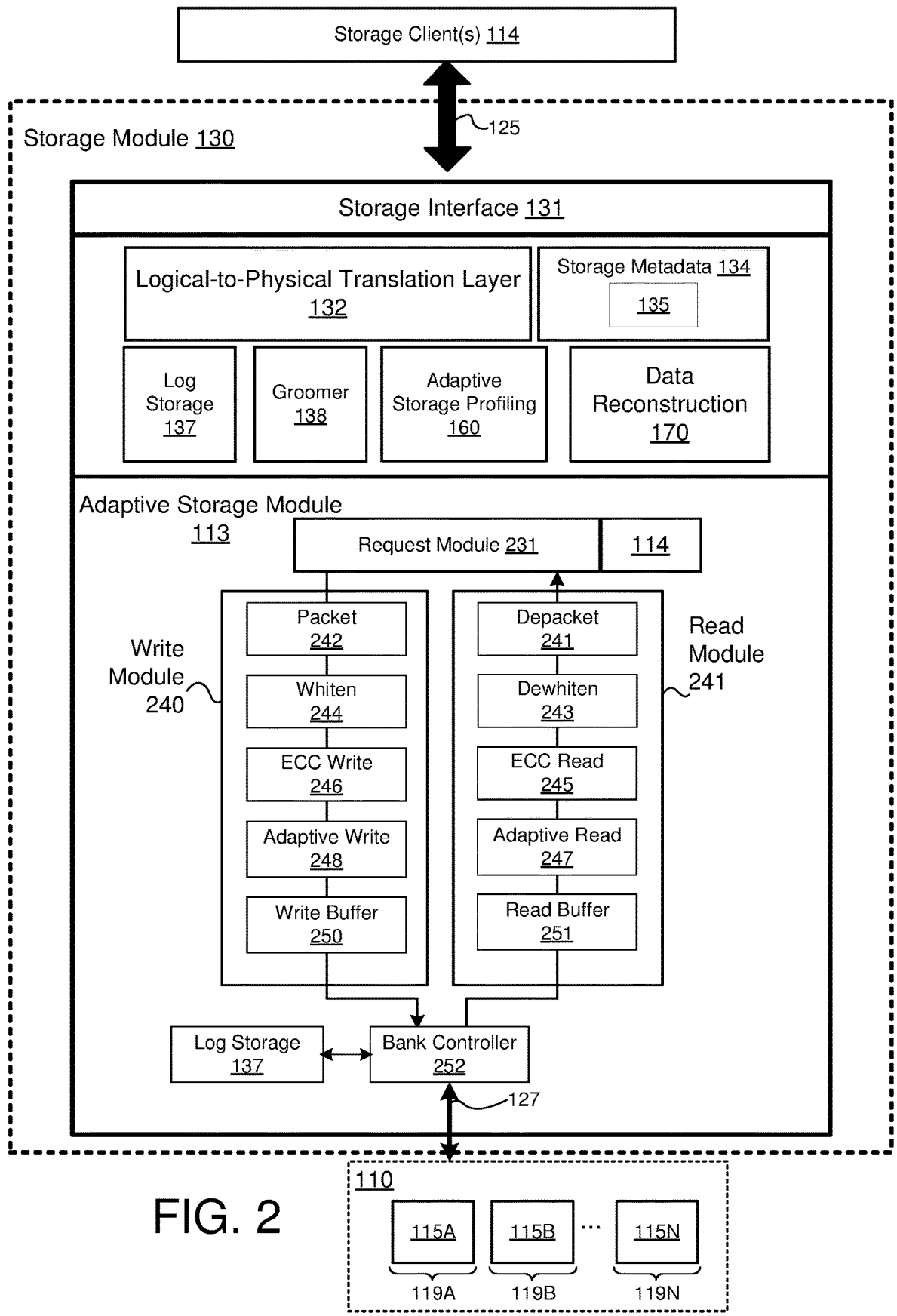
FIG. 2 is a block diagram of one embodiment of a storage module.

FIG. 2 is a block of one embodiment of a storage module 130 configured to manage data storage operations on a solid-state storage medium 110. In some embodiments, the solid-state storage medium 110 may comprise one or more independent banks 119A-N of solid-state storage arrays 115A-N. As disclosed above, each array 115A-N may comprise a plurality of solid-state storage elements communicatively coupled to the adaptive storage module 113 in parallel via a bus 127.

The adaptive storage module 113 may comprise a request module 231 configured to receive storage requests from the storage module 130 and/or other storage clients 104. The request module 231 may be configured to perform storage operations on the solid-state storage medium 110 in response to the requests, which may comprise transferring data to/from the storage module 130 and/or storage clients 104. Accordingly, the request module 231 may comprise one or more direct memory access (DMA) modules, remote DMA modules, bus controllers, bridges, buffers, and the like.

The adaptive storage module 113 may comprise a write module 240 configured to process data for storage on the solid-state storage medium 110. In some embodiments, the write module 240 comprises one or more modules configured to process and/or format data for storage on the solid-state storage medium 110, which may include, but are not limited to: a packet module 242, a whiten module 244, an ECC write module 246, an adaptive write module 248, and a write buffer 250. In some embodiments, the write module 240 may further comprise a compression module, configured to compress data for storage on the solid-state storage medium 110, one or more encryption modules configured to encrypt data for storage on the solid-state storage medium 110, and so on. The read module 241 may comprise one or more modules configured to process and/or format data read from the solid-state storage medium 110, which may include, but are not limited to: a read buffer 251, an adaptive read module 245, an ECC read module 245, a dewhiten module 243, and a depacket module 241.

In some embodiments, the write module 240 comprises a write pipeline configured to process data for storage in a plurality of pipeline stages or modules, as disclosed herein. Similarly, in some embodiments, the read module 241 may comprise a read pipeline configured to process data read from the solid-state storage array 115 in a plurality of pipeline stages or modules, as disclosed herein.

The packet module 242 may be configured to generate data packets comprising data to be stored on the solid-state storage medium 110. The write module 240 may be configured to store data in a contextual format, as disclosed above. The contextual format may comprise storing data in a packet format in which a logical interface of the data is associated with the data on the solid-state storage medium 110. In some embodiments, the packet format may include a packet header comprising one or more logical identifiers of the data contained within the packet, or the like. The contextual format may further comprise associating data packets with sequence information, to define, inter alia, a log-order of data packets on the solid-state storage medium 110. The sequence information may comprise sequence numbers, timestamps, or other indicators that indicate an order of the data packet relative to other data packets stored on the solid state storage medium 110. The storage module 130 may use the log-based, contextual format of data stored on the solid-state storage medium 110 to reconstruct portions of the storage metadata 135, which may include, but is not limited to: reconstructing any-to-any mappings between logical identifiers and physical storage locations maintained by the logical-to-translation layer 132, a forward index, a reverse index, and/or the like.

In some embodiments, the packet module 242 may be configured to generate packets of arbitrary lengths and/or sizes in accordance with the size of storage requests received via the request receiver module 231 and/or configuration preferences. The packet module 242 may be configured to generate packets of one or more pre-determined sizes. In one embodiment, in response to a request to write 24*k* of data to the solid-state storage medium 110, the packet module 242 may be configured to generate 6 packets, each packet comprising 4 k of the data; in another embodiment, the packet module 242 may be configured to generate a single packet comprising 24 k of data in response to the request.

Figure 3:
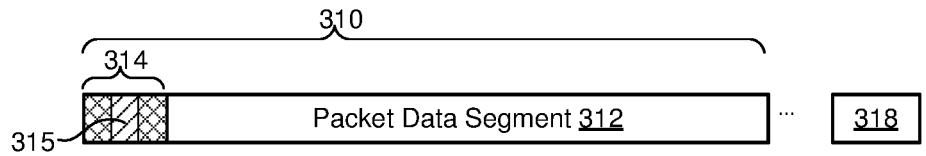
FIG. 3 depicts one embodiment of a packet.

FIG. 3 depicts one embodiment of a packet format. A packet 310 may comprise a packet data segment 312 and a header 314. As disclosed above, the packet data segment 312 may comprise an arbitrary amount of data to be stored on the solid-state storage medium 110. The header 314 may comprise contextual metadata pertaining to the packet 310. In some embodiments, the header 314 includes a logical identifier indicator 315, which may indicate one or more logical identifier(s) associated with the data segment. The header 315 may include other metadata, which may include, but is not limited to: a packet type metadata, a packet size and/or length metadata, access control metadata, and so on. The packet 310 may be associated with sequence information 318, which may determine a log order of the packet 310 relative to other packets on the solid-state storage medium 110. As depicted in FIG. 3, the sequence information 318 may be stored separately from the packet 310. In some embodiments, the sequence information 318 may be marked the section of the solid-state storage medium 110 comprising the data packet 310 (e.g., erase block, logical erase block, row, or the like). Alternatively, or in addition, the sequence information 318 may be stored as part of the packet 310 (e.g., as a field within the header 314 of the packet 310).

The whiten module 244 may be configured to perform one or more whitening transformations on the data packets generated by the packet module 242. Data whitening may comprise decorrelating the data, which may provide wear-leveling benefits for certain types of solid-state storage medium 110. In some embodiments, the whiten module 244 is configured to encrypt data for storage on the solid-state storage medium 110 in one or more of a media encryption key, a user encryption key, or the like.

The ECC write module 246 may be configured to encode data packets generated by the packet module 242 into respective ECC codewords. As used herein, an ECC codeword refers data and corresponding error detection and/or correction information. The ECC write module 246 may be configured to implement any suitable ECC algorithm and may be configured to generate corresponding ECC information (e.g., ECC codewords), which may include, but are not limited to: data segments and corresponding ECC syndromes, ECC symbols, ECC chunks, and/or other structured and/or unstructured ECC information. ECC codewords may comprise any suitable error-correcting encoding, including, but not limited to: block ECC encoding, convolutional ECC encoding, Low-Density Parity-Check (LDPC) encoding, Gallager encoding, Reed-Solomon encoding, Hamming codes, Multidimensional parity encoding, Hamming codes, cyclic error-correcting codes, BCH codes, or the like. The ECC read module 245 may be configured to decode and/or correct ECC codewords generated by the ECC write module 246.

The ECC write module 246 may be configured to generate ECC codewords of a pre-determined size. Accordingly, a single packet may be encoded into a plurality of different ECC codewords and/or a single ECC codeword may comprise portions of two or more packets.

In some embodiments, the ECC write module 246 is configured to generate ECC codewords, each of which may comprise a data segment of length N and a syndrome of length S. For example, the ECC write module 246 may be configured to encode data segments into 240 byte ECC codewords, each ECC codeword comprising 224 bytes of data and 16 bytes of ECC data. In this embodiment, the ECC encoding may be capable of correcting more bit errors than the manufacturer of the solid-state storage medium 110 requires. In other embodiments, the ECC write module 246 may be configured to encode data in a symbolic ECC encoding, such that each data segment of length N produces a symbol of length X. The ECC write module 246 may encode data according to a selected ECC "strength." As used herein, the "strength" of an error-correcting code refers to the number of errors that can be detected and/or corrected by use of the error correcting code. In some embodiments, the strength of the ECC encoding implemented by the ECC write module 246 may be adaptive and/or configurable. In some embodiments, the strength of the ECC encoding may be selected according to the reliability and/or error rate of the solid-state storage medium 110. As disclosed in further detail herein, the strength of the ECC encoding may be independent of the partitioning of the solid-state storage medium 110, which may allow the storage module 130 to select a suitable ECC encoding strength based on the conditions of the solid-state storage medium 110, user requirements, and the like, as opposed to static and/or pre-determined ECC settings imposed by the manufacturer of the medium 110.

Figure 4:
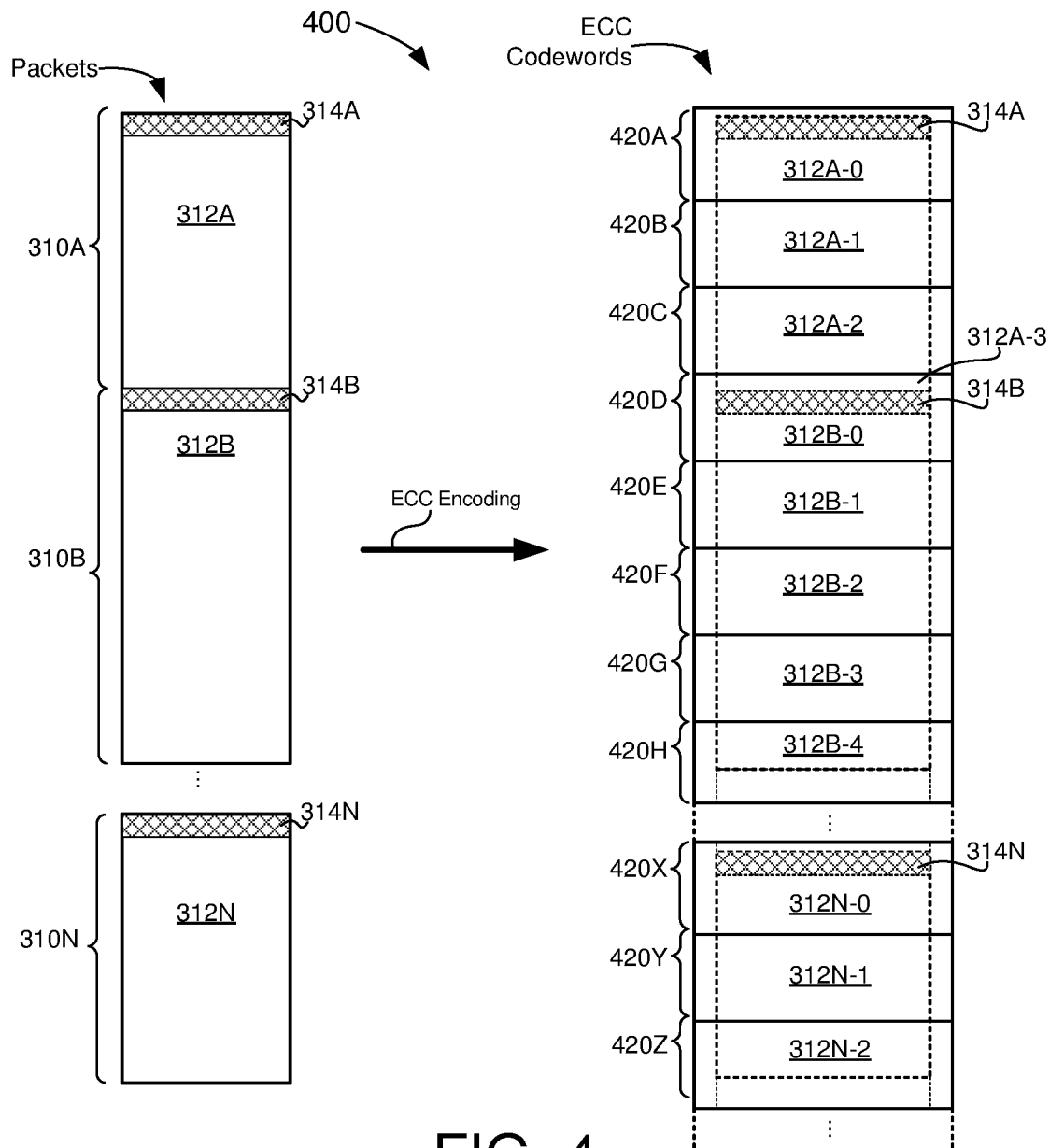
FIG. 4 depicts one embodiment of ECC codewords comprising one or more data segments.

FIG. 4 depicts one embodiment of data flow 400 between the packet module 242 and an ECC write module 246. For clarity, and to avoid obscuring the details of the depicted embodiment, other modules of the write module 240 are omitted (e.g., whitener module 244). The packet module 242 may be configured to generate packets 310A-310N in response to one or more requests to store data on the solid-state storage medium 110. The packets 310A-N may comprise respective packet data segments 312A, 312B, and 314N. The packets 310A-N may further comprise contextual metadata embodied in respective headers 314A, 312B, and 314N. The packets 310A-N may be processed by, inter alia, the ECC write module 246 to generate ECC codewords. In the FIG. 4 embodiment, the ECC codewords comprise ECC codewords 420A-420X, each of which may comprise a portion of one or more of the packets 310A-N and a syndrome (not shown). In other embodiments, the ECC codewords may comprise ECC symbols or the like.

As illustrated in FIG. 4, the packets 310A-N may vary in size in accordance with the size of the respective packet data segments 312A-N and/or header information 314A-N. Alternatively, in some embodiments, the packet module 242 may be configured to generate packets 310A-N of a fixed, uniform size.

The ECC write module 246 may be configured to generate ECC codewords 420A-N having a uniform, fixed size; each ECC codeword 420A-N may comprise N bytes of packet data and S syndrome bytes, such that each ECC codeword 420A-N comprises N+S bytes. In some embodiments, each ECC codeword comprises 240 bytes, and includes 224 bytes of packet data (N) and 16 byes of error correction code (S). The disclosed embodiments are not limited in this regard, however, and could be adapted to generate ECC codewords 420A-N of any suitable size, having any suitable ratio between N and S. Moreover, the ECC write module 242 may be further adapted to generate ECC symbols, or other ECC codewords, comprising any suitable ratio between data and ECC information.

As depicted in FIG. 4, the ECC codewords 420A-N may comprise portions of one or more packets 310A-N; ECC codeword 420D comprises data of packets 310A and 310B. The packets 310A-N may be spread between a plurality of different ECC codewords 420A-N: ECC codewords 420A-D comprise data of packet 310A; ECC codewords 420D-H comprise data of packet 310B; and ECC codewords 420X-420Z comprise data of packet 310N.

Referring back to FIG. 2, the write module 240 may further comprise an adaptive write module 248 configured to buffer data to storage on one or more of the solid-state storage arrays 115A-N. As disclosed in further detail below, the adaptive write module 248 may be configured to store data within one or more columns 118 of a solid-state storage array 115. The adaptive write module 248 may be further configured to generate parity data associated corresponding to the layout and/or arrangement of the data. As disclosed in further detail below, the parity data may be configured to protect data stored within respective rows 117 of the solid-state storage array 115A-N, and may be generated in accordance with an adaptive storage layout implemented by the adaptive storage module 113.

In some embodiments, the write module 240 further comprises a write buffer 250 configured to buffer data for storage within respective page write buffers of the solid-state storage medium 110. The write buffer 250 may comprise one or more synchronization buffers to synchronize a clock domain of the adaptive storage module 113 with a clock domain of the solid-state storage medium 110 (and/or bus 127).

The log storage module 137 may be configured to select storage location(s) for data storage and/or may provide addressing and/or control information to the solid-state storage medium 110 via the bus 127. Accordingly, the log storage module 137 may provide for storing data sequentially at an append point within the physical address space of the solid-state storage medium 110. The physical address at which a particular data segment is stored may be independent of the logical interface (e.g., logical identifier) of the data segment. The logical-to-physical translation layer 132 may be configured to associate the logical interface of data segments (e.g., logical identifiers of the data segments) with the physical address(es) of the data segments on the solid-state storage medium 110. In some embodiments, the logical-to-physical translation layer 132 may leverage storage metadata 135 to perform logical-to-physical translations; the storage metadata 135 may include a forward index comprising arbitrary, any-to-any mappings between logical identifiers and physical addresses. The storage metadata 135 may be maintained in volatile memory, such as the volatile memory 106. In some embodiments, the storage metadata module 134 is configured to periodically store portions of the storage metadata 135 on a persistent storage medium, such as the solid-state storage medium 110, persistent storage 105, or the like.

The adaptive storage module 113 may further comprise a read module 241 that is configured to read data from the solid-state storage medium 110 in response to requests received via the request module 231. The read module 241 may be configured to process data read from the solid-state storage medium 110, and provide the processed data to the storage module 130 and/or a storage client 104 (by use of the request module 231). The read module 241 may comprise one or more modules configured to process and/or format data stored on the solid-state storage medium 110, which may include, but are not limited to: read buffer 251, an adaptive read module 247, ECC read module 245, a dewhiten module 243, and a depacket module 241. In some embodiments, the read module further includes a decompression module, configured to decompress compressed data stored on the solid-state storage medium 110, one or more decryption modules configured to decrypt encrypted data stored on the solid-state storage medium 110, and so on. Data processed by the read module 241 may flow to the storage module 130 and/or storage client 104 via the request module 231, and/or other interface or communication channel (e.g., the data may flow directly to/from a storage client via a DMA or remote DMA module of the storage module 130).

Read requests may comprise and/or reference the logical interface of the requested data, such as a logical identifier, a range and/or extent of logical identifiers, a set of logical identifiers, or the like. The physical addresses associated with data of the request may be determined based, at least in part, upon the logical-to-physical translation layer 132 (and/or the storage metadata 135), metadata pertaining to the layout of the data on the solid-state storage medium 110, and so on. Data may stream into the read module 241 via a read buffer 251. The read buffer 251 may correspond page read buffers to a solid-state storage array 115A-N of one of the banks 119A-N. The read buffer 251 may comprise one or more synchronization buffers configured to synchronize a clock domain of the adaptive storage module 113 with a clock domain of the solid-state storage medium 110 (and/or bus 127).

The adaptive read module 247 may be configured to reconstruct one or more data segments from the contents of the read buffer 251. Reconstructing the data segments may comprise recombining and/or reordering contents of the read buffer (e.g., ECC codewords) read from various columns 118 in accordance with a layout of the data on the solid-state storage arrays 115A-N as indicated by the storage metadata 135. In some embodiments, reconstructing the data may comprise stripping data associated with one or more columns 118 from the read buffer, reordering data of one or more columns 118, and so on.

The read module 241 may comprise an ECC read module 245 configured to detect and/or correct errors in data read from the solid-state storage medium 110 using, inter alia, the ECC encoding of the data (e.g., as encoded by the ECC write module 246), parity data (e.g., using parity substitution), and so on. As disclosed above, the ECC encoding may be capable of detecting and/or correcting a pre-determined number of bit errors, in accordance with the strength of the ECC encoding. The ECC read module 245 may be capable of detecting more bit errors than can be corrected.

The ECC read module 245 may be configured to correct any "correctable" errors using the ECC encoding. In some embodiments, the ECC read module 245 may attempt to correct errors that cannot be corrected by use of the ECC encoding using other techniques, such as parity substitution, or the like. Alternatively, or in addition, the ECC read module 245 may attempt to recover data comprising uncorrectable errors from another source. For example, in some embodiments, data may be stored in a RAID configuration. In response to detecting an uncorrectable error, the ECC read module 245 may attempt to recover the data from the RAID, or other source of redundant data (e.g., a mirror, backup copy, or the like).

In some embodiments, the ECC read module 245 may be configured to generate an interrupt in response to reading data comprising uncorrectable errors. The interrupt may comprise a message indicating that the requested data is in error, and may indicate that the ECC read module 245 cannot correct the error using the ECC encoding. The message may comprise the data that includes the error (e.g., the "corrupted data").

The interrupt may be caught by the storage module 130 or other process. In some embodiments, the interrupt is received by the data reconstruction module 170, which, in response, may be configured to reconstruct the data using parity substitution, or other reconstruction technique, as disclosed herein. Parity substitution may comprise iteratively replacing portions of the corrupted data with a "parity mask" (e.g., all ones) until a parity calculation associated with the data is satisfied. The masked data may comprise the uncorrectable errors, and may be reconstructed using other portions of the data in conjunction with the parity data. Parity substitution may further comprise reading one or more ECC codewords from the solid-state storage array 115A-N (in accordance with an adaptive data structure layout on the array 115), correcting errors within the ECC codewords (e.g., decoding the ECC codewords), and reconstructing the data by use of the corrected ECC codewords and/or parity data. In some embodiments, the corrupted data may be reconstructed without first decoding and/or correcting errors within the ECC codewords.

Alternatively, data reconstruction module 170 may be configured to replace the corrupted data with another copy of the data, such as a backup or mirror copy, and then may use the replacement data of the requested data packet or return it to the read module 241. In another embodiment, the storage module 130 stores data in a RAID configuration, from which the corrupted data may be recovered, as described above.

As depicted in FIG. 2, the solid-state storage medium 110 may be arranged into a plurality of independent banks 119A-N. Each bank may comprise a plurality of solid-state storage elements arranged into respective solid-state storage arrays 115A-N, as disclosed above. The banks 119A-N may be configured to operate independently; the adaptive storage module 113 may configure a first bank 119A to perform a first storage operation while a second bank 119B is configured to perform a different storage operation. The adaptive storage module 113 may further comprise a bank controller 252 configured to selectively route data and/or commands between the adaptive storage module 113 and the banks 119A-N. In some embodiments, adaptive storage module 113 may be configured to read data from a bank 119A while filling the write buffer 250 for storage on another bank 119B and/or may interleave one or more storage operations between one or more banks 119A-N. Further embodiments of multi-bank storage operations and data pipelines are disclosed in U.S. Patent Application Publication No. 2008/0229079 (U.S. patent application Ser. No. 11/952,095), entitled, "Apparatus, System, and Method for Managing Commands of Solid-State Storage Using Bank Interleave," filed Dec. 6, 2007 for David Flynn et al., which is hereby incorporated by reference in its entirety.

As disclosed above, the groomer module 138 may be configured to reclaim storage resources of the solid-state storage medium 110. The groomer module 138 may operate as an autonomous, background process, which may be suspended and/or deferred while other storage operations are in process. The log storage module 137 and groomer module 138 may manage storage operations so that data is systematically spread throughout a physical address space of the solid-state storage medium 110, which may improve performance, data reliability, and avoid overuse and underuse of any particular storage locations, thereby lengthening the useful life of the solid-state storage medium 110 (e.g., wear-leveling, etc.). Accordingly, in some embodiments, the storage module 130 treats the physical address space of the solid-state storage medium 110 as a cycle. Data is incrementally appended to the solid-state storage medium 110 from an initial append point, which may correspond to a particular physical address within one or more of the banks 119A-N (e.g., physical address 0 of bank 119A). Upon reaching the end of the physical address space (e.g., physical address N of bank 119N), the append point reverts to the initial position (or next available storage location).

Operations to overwrite and/or modify data stored on the solid-state storage medium 110 may be performed "out-of-place." The obsolete version of the data may remain on the storage medium 110 while the updated version of the data may be appended at the append point. Similarly, an operation to delete, erase, or TRIM data from the solid-state storage medium 110 may comprise indicating that the data is invalid (e.g., does not need to be retained on the solid-state storage medium 110). Marking data as invalid may comprise modifying a mapping between the logical identifier of the data and the physical address of the invalid data, marking the physical address as invalid in a reverse index, or the like.

The groomer module 138 may be configured to select selections of the solid-state storage medium 110 for recovery. As used herein, a "section" of the solid-state storage medium 110 may include, but is not limited to: an erase block, a logical erase block, a die, a plane, one or more pages, a portion of a solid-state storage element 116A-Y, a portion of a row 117 of a solid-state storage array 115, or the like. A section may be selected for grooming in response to various criteria, which may include, but are not limited to: age criteria (e.g., data refresh), error metrics, reliability metrics, wear metrics, resource availability criteria, an invalid data threshold, or the like. A grooming or storage recovery operation may comprise relocating valid data on the section (if any). The operation may further comprise preparing the section for reuse, which may comprise erasing the section, marking the section with a sequence indicator, such as the sequence indicator 318, and/or placing the section in a queue of storage sections that are available to store data. The groomer module 138 may be configured to schedule grooming operations with other storage operations and/or requests. In some embodiments, The adaptive storage module 113 may comprise a groomer bypass (not shown) configured to relocate data from a storage section by transferring data read from the section from the read module 241 directly into the write module 240 without being routed out of the adaptive storage module 113.

The adaptive write module 248 may be further configured to manage out-of-service conditions on the solid-state storage medium 110. As used herein, a section of the solid-state storage medium 110 that is "out-of-service" (OOS) refers to a section that is not currently being used to store valid data. The storage module 130 may be configured to monitor storage operations performed on the solid-state storage medium 110 and/or actively scan the solid-state storage medium 110 to identify sections that should be taken out of service. The storage metadata 135 may comprise OOS metadata that identifies OOS sections of the solid-state storage medium 110. The adaptive write module 248 may be configured to avoid OOS section by, inter alia, stream padding (and/or nonce) data to the write buffer such that padding data will map to the identified OOS sections. In some embodiments, the adaptive storage module 113 may be configured to manage OOS conditions by replacing OOS sections of the solid-state storage medium 110 with replacement sections. Alternatively, or in addition, a hybrid OOS approach may be employed. The padding approach to managing OOS conditions may be used in portions of the solid-state storage medium 110 comprising a relatively small number of 00S storage divisions; as the number of OOS sections increases, the solid-state adaptive storage module 113 may replace one or more of the OOS sections with replacements. Further embodiments of apparatus, systems, and methods for detecting and/or correcting data errors, and managing OOS conditions, are disclosed in U.S. Patent Application Publication No. 2009/0287956 (U.S. application Ser. No. 12/467,914), entitled, "Apparatus, System, and Method for Detecting and Replacing a Failed Data Storage," filed May 18, 2009, and U.S. Patent Application Publication No. 2013/0019072 (U.S. application Ser. No. 13/354,215), entitled, "Apparatus, System, and Method for Managing Out-of-Service Conditions," filed Jan. 19, 2012 for John Strasser et al, each of which is hereby incorporated by reference in its entirety.

As disclosed above, the solid-state storage medium 110 may comprise one or more solid-state storage arrays 115A-N. A solid-state storage array 115A-N may comprise a plurality of independent columns 118 (respective solid-state storage elements 116A-Y), which may be coupled to the adaptive storage module 113 in parallel via the bus 127. Accordingly, storage operations performed on an array 115A-N may be performed on each of the solid-state storage elements 116A-Y comprising the array 115A-N. Performing a storage operation on an array 115A-N may comprise performing the storage operation on each of the plurality of solid-state storage elements 116 comprising the array 115A-N: a read operation may comprise reading a physical storage unit (e.g., page) from a plurality of solid-state storage elements 116A-Y; a program operation comprise programming a physical storage unit (e.g., page) on a plurality of solid-state storage elements 116A-Y; an erase operation may comprise erasing a section (e.g., erase block) on a plurality of solid-state storage elements 116A-Y; and so on. Accordingly, a program operation may comprise the write module 240 streaming data to program buffers of a plurality of solid-state storage elements 116A-Y (via the write buffer 250 and bus 127) and, when the respective program buffers are sufficiently full, issuing a program command to the solid-state storage elements 116A-Y. The program command may cause one or more storage units on each of the storage elements 116A-Y to be programmed in parallel.

Figure 5A:
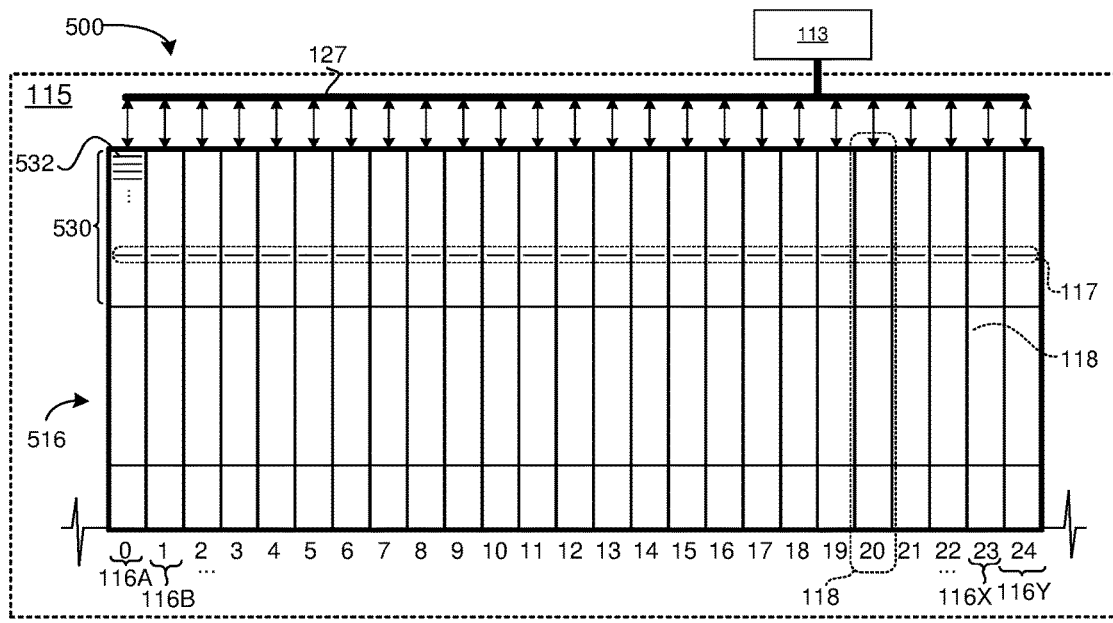
FIG. 5A is a block diagram depicting one embodiment of a solid-state storage array.

FIG. 5A depicts one embodiment 500 of a solid-state storage array 115. As disclosed above, the solid-state storage array 115 may comprise a plurality of independent columns 118, each of which may correspond to a respective solid-state storage element 116A-Y. The embodiment for a solid-state storage array 115 depicted in FIG. 5 comprises twenty five columns 118 (e.g., solid-state storage element 0 116A through solid-state storage element 24 116Y). The solid-state storage elements 116A-Y comprising the array may be communicatively coupled to the adaptive storage module 113 in parallel by the bus 127. The bus 127 may be capable of communicating data, address, and/or control information to each of the solid-state storage elements 116A-Y. The parallel connection may allow the adaptive storage module 113 to manage the solid-state storage elements 116A-Y as a single, logical storage element (array 115), as described above.

The solid-state storage elements 116A-Y may be partitioned into sections, such as physical storage divisions 530 or physical erase blocks. Each erase block may comprise a plurality of physical storage units 532, such as pages. The physical storage units 532 within a physical storage division 530 may be erased as a group. Although FIG. 5A depicts a particular partitioning scheme, the disclosed embodiments are not limited in this regard, and could be adapted to use solid-state storage elements 116A-Y partitioned in any suitable manner.

As depicted in FIG. 5A, the columns 118 of the array 115 may correspond to respective solid-state storage elements 116A-Y. Accordingly, the array 115 of FIG. 5A comprises twenty five columns 118. Rows of the array 117 may correspond to physical storage units 532 and/or 530 of a plurality of the columns 118.

Figure 5B:
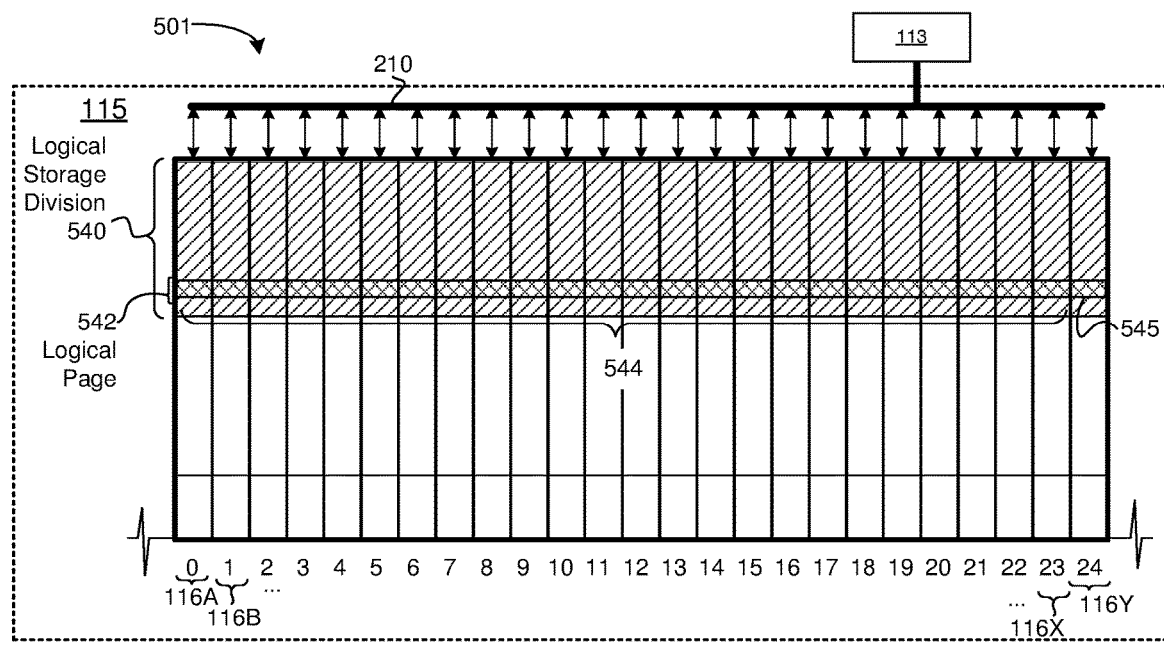
FIG. 5B is a block diagram depicting another embodiment of a solid-state storage array.

FIG. 5B is a block diagram 501 of another embodiment of a solid-state storage array 115. As disclosed above, the solid-state storage array 115 may comprise a plurality of rows 117, which may correspond to storage units on a plurality of different columns 118 within the array 115. The rows 117 of the solid-state storage array 115 may include logical storage divisions 540, which may comprise physical storage divisions on a plurality of the solid-state storage elements 116A-Y. In some embodiments, a logical storage division 540 may comprise a logical erase block, comprising physical erase blocks on each of the solid-state storage elements 116A-Y in the array 115. A logical page 542 may comprise physical storage units (e.g., pages) on a plurality of the solid-state storage elements 116A-Y.

Storage operations performed on the solid-state storage array 515 may operate on multiple solid-state storage elements 516: an operation to program data to a logical storage unit 542 may comprise programming data to each of twenty-five (25) physical storage units (e.g., one storage unit per non-volatile storage element 116A-Y); an operation to read data from a logical storage unit 542 may comprise reading data from twenty-five (25) physical storage units (e.g., pages); an operation to erase a logical storage division 540 may comprise erasing twenty-five physical storage divisions (e.g., erase blocks); and so on. Since the columns 118 are independent, storage operations may be performed across different sets and/or portions of the array 115. For example, a read operation on the array 115 may comprise reading data from physical storage unit 532 at a first physical address of solid-state storage element 116A and reading data from a physical storage unit 532 at a different physical address of one or more other solid-state storage elements 116B-N.

Arranging non-volatile storage elements 116A-Y into a solid-state storage array 115 may be used to address certain properties of the solid-state storage medium 110. Some embodiments may comprise asymmetric solid-state storage medium 110; it may take longer to program data onto the solid-state storage elements 116A-Y than it takes to read data therefrom (e.g., ten times as long). Moreover, in some cases, data may only be programmed to physical storage divisions 530 that have first been initialized (e.g., erased). Initialization operations may take longer than a program operations (e.g., ten times as long as a program, and by extension one hundred times as long as a read operation). Managing groups of solid-state storage elements 116A-Y in an array 115 (and/or interleaved banks 119A-N as disclosed herein), may allow the storage module 130 to address the asymmetric properties of the solid-state storage medium 110. In some embodiments, the asymmetry in read, program, and/or erase operations is addressed by performing these operations on multiple solid-state storage elements 116A-Y in parallel. In the embodiment depicted in FIG. 5B, programming asymmetry may be addressed by programming twenty-five (25) storage units in a logical storage unit 542 in parallel. Initialization operations may also be performed in parallel. Physical storage divisions 530 on each of the solid-state storage elements 116A-Y may be initialized as a group (e.g., as logical storage divisions 542), which may comprise erasing twenty-five (25) physical erase blocks in parallel.

In some embodiments, portions of the solid-state storage array 115 may be configured to store data and other portions of the array 115 may be configured to store error detection and/or recovery information. Columns 118 used for data storage may be referred to as "data columns" and/or "data solid-state storage elements." Columns used to store data error detection and/or recovery information may be referred to as a "parity column" and/or "recovery column." The array 515 may be configured in an operational mode in which one of the solid-state storage elements 116Y is used to store parity data, whereas other solid-state storage elements 116A-X are used to store data. Accordingly, the array 115 may comprise data solid-state storage elements 116A-X and a recovery solid-state storage element 116Y. In this operational mode, the effective storage capacity of the rows (e.g., logical pages 542) may be reduced by one physical storage unit (e.g., reduced from 25 physical pages to 24 physical pages). As used herein, the "effective storage capacity" of a storage unit refers to the number of storage units or divisions that are available to store data and/or the total amount of data that can be stored on a logical storage unit. The operational mode described above may be referred to as a "24+1" configuration, denoting that twenty-four (24) physical storage units 532 are available to store data, and one (1) of the physical storage units 532 is used for parity. The disclosed embodiments are not limited to any particular operational mode and/or configuration, and could be adapted to use any number of the solid-state storage elements 116A-Y to store error detection and/or recovery data.

Figure 5C:
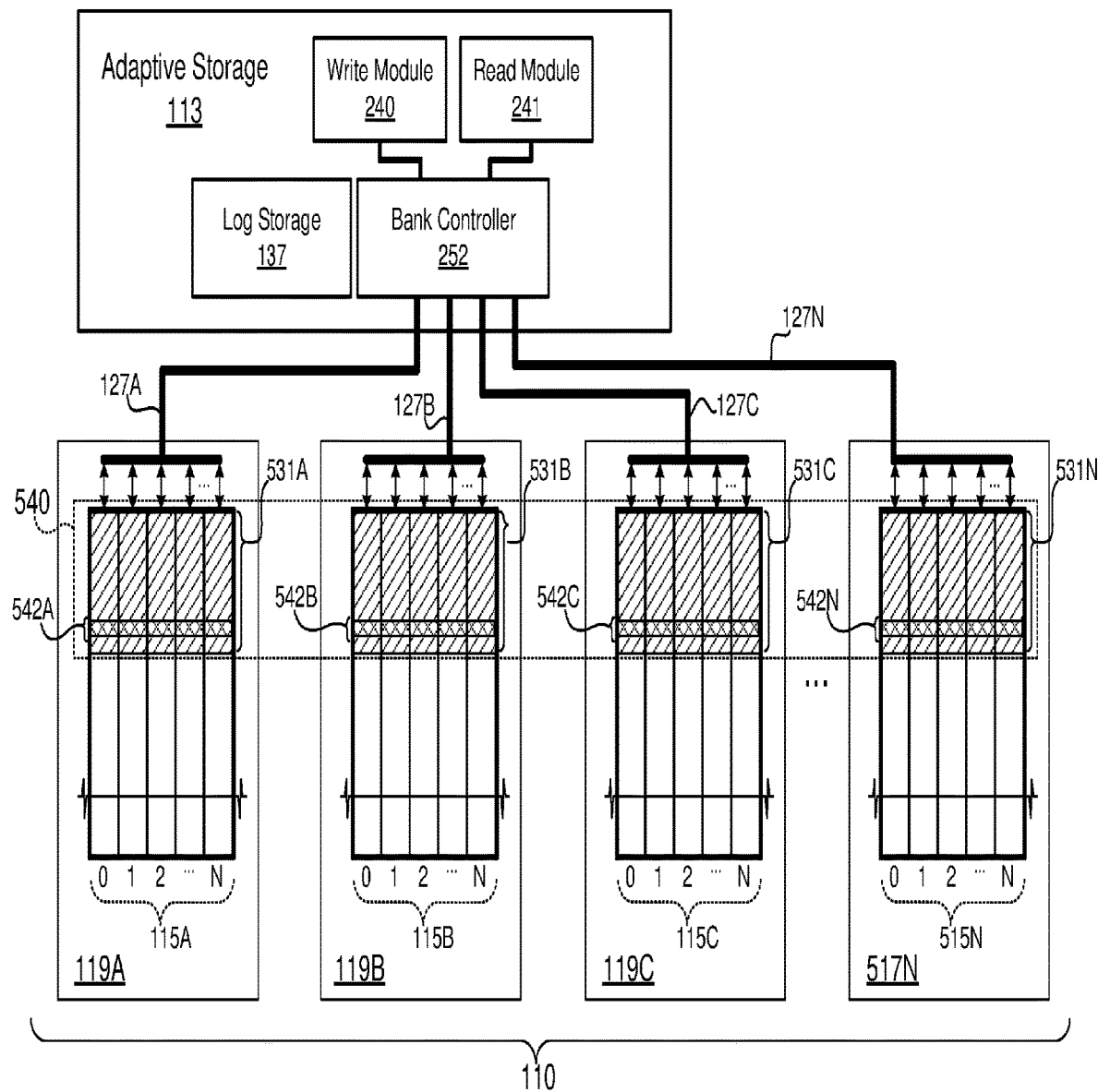
FIG. 5C is a block diagram depicting another embodiment of banks of solid-state storage arrays.

As disclosed above, the adaptive storage module 113 may be configured to interleave storage operations between a plurality of solid-state storage arrays 115A-N of independent banks 119A-N, which may further ameliorate asymmetry between erase, program, and read operations on the solid-state storage medium 110. FIG. 5C depicts one embodiment of a adaptive storage module 113 configured to manage logical erase blocks 540 that span multiple arrays 115A-N of multiple banks 119A-N. Each bank 119A-N may comprise one or more solid-state storage arrays 115A-N, which, as disclosed herein, may comprise a plurality of solid-state storage elements 116A-Y coupled in parallel by a respective bus 127A-N. The adaptive storage module 113 may be configured to perform storage operations on the storage elements 116A-Y of the arrays 119A-N in parallel and/or in response to a single command and/or signal.

Some operations performed by the adaptive storage module 113 may cross bank boundaries. The adaptive storage module 113 may be configured to manage groups of logical erase blocks 540 that include erase blocks of multiple arrays 115A-N within different respective banks 119A-N. Each group of logical erase blocks 540 may comprise erase blocks 531A-N on each of the arrays 115A-N. The erase blocks 531A-N comprising the logical erase block group 540 may be erased together (e.g., in response to a single erase command and/or signal or in response to a plurality of separate erase commands and/or signals). Performing erase operations on logical erase block groups 540 comprising large numbers of erase blocks 531A-N within multiple arrays 115A-N may further mask the asymmetric properties of the solid-state storage medium 110, as disclosed above.

The adaptive storage module 113 may be configured to perform some storage operations within boundaries of the arrays 115A-N and/or banks 119A-N. In some embodiments, the read, write, and/or program operations may be performed within rows 117 of the solid-state storage arrays 115A-N (e.g., on logical pages 542A-N within arrays 115A-N of respective banks 119A-N). As depicted in FIG. 5C, the logical pages 542A-N of the arrays 115A-N may not extend beyond single arrays 115A-N and/or banks 119A-N. The log storage module 137 and/or bank interleave module 252 may be configured to append data to the solid-state storage medium 110 by interleaving and/or scheduling storage operations sequentially between the arrays 15A-N of the banks 119A-N.

Figure 5D:
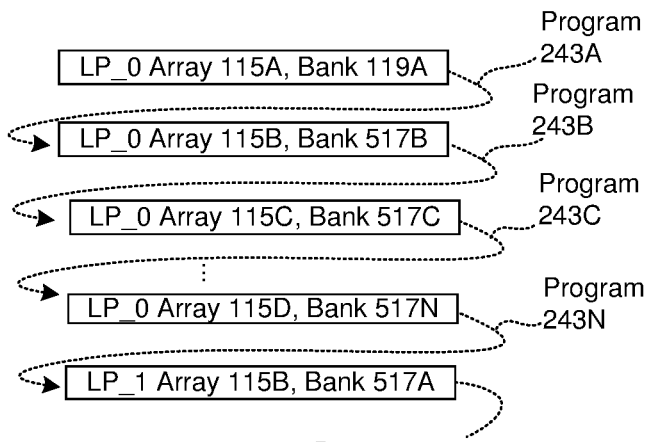
FIG. 5D depicts one embodiment of sequential bank interleave.

FIG. 5D depicts one embodiment of storage operations that are interleaved between a solid-state storage arrays 115A-N of respective banks 119A-N. In the FIG. 5D embodiment, the bank interleave module 252 is configured to interleave programming operations between logical pages 542A-N (rows 117) of the arrays 115A-N within the banks 119A-N. As disclosed above, the write module 240 may comprise a write buffer 250, which may have sufficient capacity to fill write buffers one or more logical pages 542A-N of an array 115A-N. In response to filling the write buffer 250 (e.g., buffering data sufficient to fill a portion of a logical page 542A-N), the adaptive storage module 113 may be configured to stream the contents of the write buffer 250 to program buffers of the solid-state storage elements 116A-Y comprising one of the banks 119A-N. The solid-state adaptive storage module 113 may then issue a program command and/or signal to the solid-state storage array 115A-N to store the contents of the program buffers to a specified logical page 542A-N. The log storage module 137 and/or bank interleave module 252 may be configured to provide control and addressing information to the solid-state storage elements 116A-Y of the array 115A-N using a bus 127A-N, as disclosed above.

The bank interleave module 252 may be configured to append data to the solid-state storage medium 110 by programming data to the arrays 115A-N in accordance with a sequential interleave pattern. The sequential interleave pattern may comprise programming data to a first logical page (LP_0) of array 115A within bank 119A, followed by the first logical page (LP_0) of array 115B within the next bank 119B, and so on, until data is programmed to the first logical page LP_0 of each array 115A-N within each of the banks 119A-N. As depicted in FIG. 5D, data may be programmed to the first logical page LP_0 of array 115A in bank 119A in a program operation 243A. The bank interleave module 252 may then stream data to the first logical page (LP_0) of the array 115B in the next bank 119B. The data may then be programmed to LP_0 of array 115B bank 119B in a program operation 243B. The program operation 243B may be performed concurrently with the program operation 243A on array 115A of bank 19A; the adaptive storage module 113 may stream data to array 115B and/or issue a command and/or signal for the program operation 243B, while the program operation 243A is being performed on the array 115A. Data may be streamed to and/or programmed on the first logical page (LP_0) of the arrays 115C-N of the other banks 119C-119N following the same sequential interleave pattern (e.g., after data is streamed and/or programmed to LP_0 of array 115A of bank 119B, data is streamed and/or programmed to LP_0 of array 115C of bank 119C in program operation 243C, and so on). Following the programming operation 243N on LP_0 of array 115N within the last bank 119N, the bank interleave controller 252 may be configured to begin streaming and/or programming data to the next logical page (LP_1) of array 115A within the first bank 119A, and the interleave pattern may continue accordingly (e.g., program LP_I of array 115B bank 119B, followed by LP_I of array 115C bank 119C through LP_I of array 115N bank 119N, followed by LP_2 of array 115A bank 119A, and so on).

Sequentially interleaving programming operations as disclosed herein may increase the time between concurrent programming operations on the same array 115A-N and/or bank 119A-N, which may reduce the likelihood that the adaptive storage module 113 will have to stall storage operations while waiting for a programming operation to complete. As disclosed above, programming operations may take significantly longer than other operations, such as read and/or data streaming operations (e.g., operations to stream the contents of the write buffer 250 to an array 115A-N via the bus 127A-N). The interleave pattern of FIG. 5D may be configured to avoid consecutive program operations on the same array 115A-N and/or bank 119A-N; programming operations on a particular array 115A-N may be separated by N−1 programming operations on other banks (e.g., programming operations on array 115A are separated by programming operations on arrays 115A-N). As such, programming operations on array 119A are likely to be complete before another programming operation needs to be performed on the array 119A.

Figure 5E:
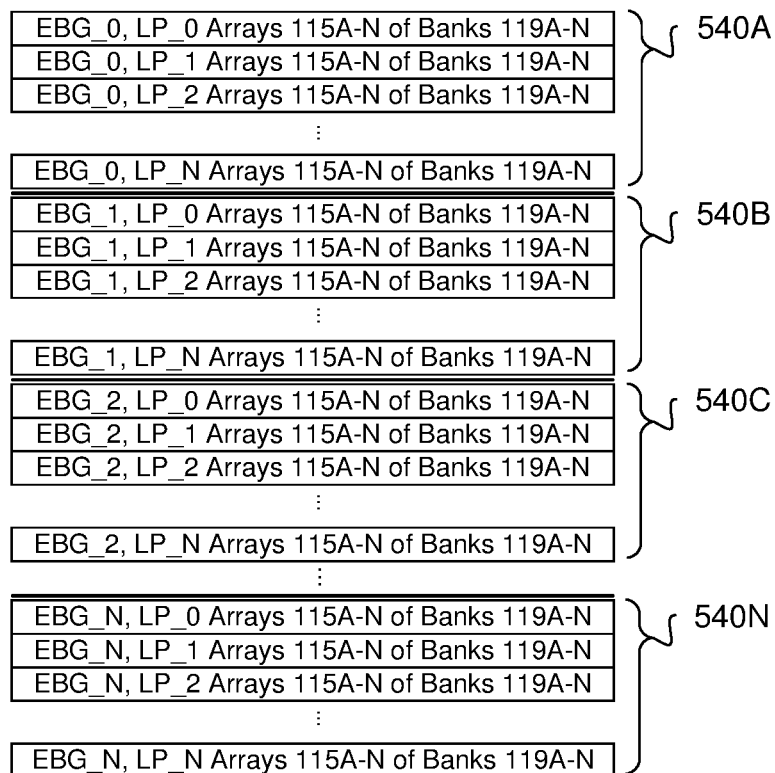
FIG. 5E depicts another embodiment of sequential bank interleave.

As depicted in FIG. 5D, the interleave pattern for programming operations may comprise programming data sequentially across rows 117 (e.g., logical pages 542A-N) of a plurality of arrays 115A-N. As depicted in FIG. 5E, the interleave pattern may result in interleaving programming operations between arrays 115A-N of banks 119A-N, such that the erase blocks of each array 115A-N (erase block groups EBG_0-N) are filled at the same rate. The sequential interleave pattern programs data to the logical pages of the first erase block group (EBG_0) in each array 115A-N before programming data to logical pages LP_0 through LP_N of the next erase block group (EBG_1), and so on (e.g., wherein each erase block comprises 0-N pages). The interleave pattern continues until the last erase block group EBG_N is filled, at which point the interleave pattern continues back at the first erase block group EBG_0.

The erase block groups of the arrays 115A-N may, therefore, be managed as logical erase blocks 540A-N that span the arrays 115A-N. Referring to FIG. 5C, a logical erase block group 540 may comprise erase blocks 531A-N on each of the arrays 115A-N within the banks 119A-N. As disclosed above, managing groups of erase blocks (e.g., logical erase block group 540) may comprise erasing each of the erase blocks 531A-N included in the group 540. In the FIG. 5E embodiment, erasing the logical erase block group 540A may comprise erasing EBG_0 of arrays 115A-N in banks 119A-N, erasing a logical erase block group 540B may comprise erasing EBG_1 of arrays 115A-N in banks 517A-N, erasing logical erase block group 540C may comprise erasing EBG_2 of arrays 115A-N in banks 517A-N, and erasing logical erase block group 540N may comprise erasing EBG_N of arrays 115A-N in banks 517A-N. Other operations, such as grooming, recovery, and the like may be performed at the granularity of the logical erase block groups 540A-N; recovering the logical erase block group 540A may comprise relocating valid data (if any) stored on EBG_0 on arrays 115A-N in banks 517A-N, erasing the erase blocks of each EBG_0 in arrays A-N, and so on. Accordingly, in embodiments comprising four banks 119A-N, each bank 119A-N comprising a respective solid-state storage array 115A-N comprising twenty five storage elements 116A-Y, erasing, grooming, and/or recovering a logical erase block group 540 comprises erasing, grooming, and/or recovering one hundred physical erase blocks 530. Although particular multi-bank embodiments are described herein, the disclosure is not limited in this regard and could be configured using any multi-bank architecture comprising any number of banks 119A-N of arrays 115A-N comprising any number of solid-state storage elements 116A-Y.

Referring back to FIG. 1, the storage module 130 may be configured to store data segments in one or more different arrangements and/or layouts within a solid-state storage array 115. In some embodiments, data may be stored "horizontally" within rows 117 of the array 115 (e.g., horizontally within logical storage units 542 of the array 115). Accordingly, a data structure, such as an ECC codeword or packet, may be spread across a plurality of the storage elements 116A-Y comprising the array 115. In some embodiments, data may be stored horizontally within one or more "channels" within the array 115. As used herein, a channel refers to a subset of one or more independent columns 118 of the array 115. Data may be arranged horizontally within the channels. An array 115 comprising N columns 118 used for storing data may be divided into a configurable number of independent channels X, each comprising Y columns 118 of the array 115. In the FIG. 1 embodiment having a "24+1" configuration that comprises twenty four columns 118 for storing data, the channel configurations may include, but are not limited to: 24 channels each comprising a single column 118; twelve channels each comprising two solid-state storage elements; eight channels each comprising three solid-state storage elements; six channels each comprising 6 columns 118; and so on. In some embodiments, the array 115 may be divided into heterogeneous channels, such as a first channel comprising twelve columns 118 and six other channels each comprising two columns 118.

Figure 6A:
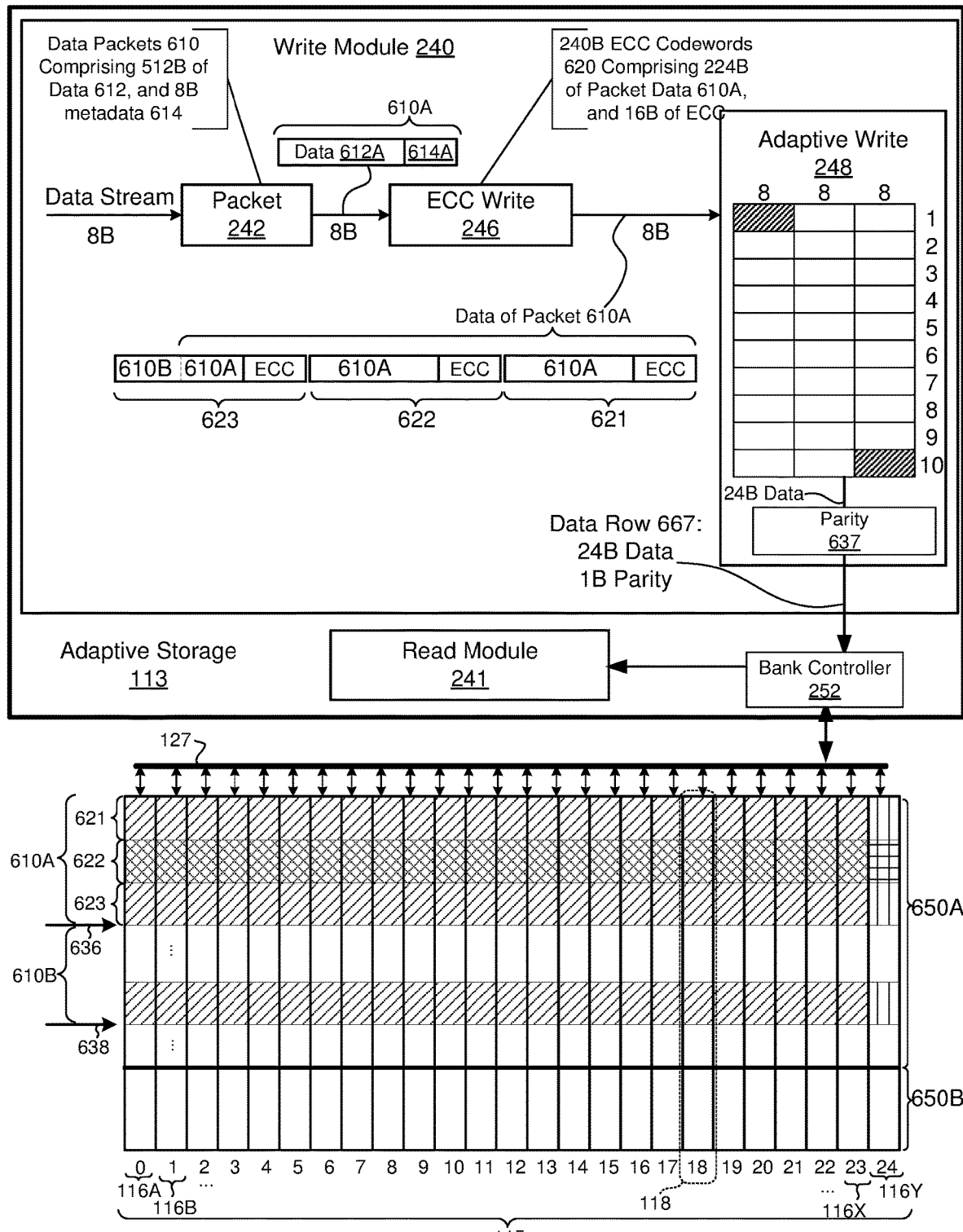
FIG. 6A is a block diagram of one embodiment of a system for adaptive data storage.

FIG. 6A is a block diagram of one embodiment of a system 600 for adaptive data storage. The system 600 may comprise a solid-state storage array 115 comprising twenty five solid-state storage elements 116A-Y operating in a "24+1" configuration, in which twenty four of the solid-state storage elements 116A-X are used to store data, and one storage element (116Y) is used to store parity data.

The write module 240 may comprise a packet module 242 configured to generate data packets comprising data for storage on the array 115, as disclosed above. In the FIG. 6A embodiment, the packet module 242 is configured to format data into a packet format 610, comprising a packet data segment 612 and metadata 614 (e.g., header). The header 614 may comprise a logical identifier associated with the packet data segment 612, a sequence number, or the like, as disclosed above. In the FIG. 6A embodiment, the packet module 242 is configured to generate packets 610 of a fixed size (520 byte packet data segment 612 and 8 bytes of metadata 614).

The ECC write module 246 is configured to generate ECC data structures (ECC codewords 620) comprising portions of one or more packets 610 as disclosed above. The ECC codewords 620 may be of a fixed size. In the FIG. 6A example, each ECC codeword 620 comprises 224 bytes of packet data and a 16 byte error-correcting code or syndrome. Although particular sizes and/or configurations of packets 610 and ECC codewords are disclosed herein, the disclosure is not limited in this regard and could be adapted to use any size packets 610 and/or ECC codewords 620. Moreover, in some embodiments, the size of the data structures (e.g., packets 610 and/or ECC codewords 620) may vary. For example, the size and/or contents of the packets 610 and/or ECC codewords 620 may be adapted according to out-of-service conditions, as disclosed above.

Data of the packet 610A may be included in a plurality of ECC codewords 620 (e.g., ECC codewords 621, 622, and 623). The ECC codeword 621 may comprise 224 bytes of the packet 610A, the ECC codeword 622 may comprise another 224 bytes of the packet 610A, and the ECC codeword 623 may comprise the remaining 72 bytes of the packet 610A and 152 bytes of the next packet 610B.

The adaptive write module 248 may be configured to layout data horizontally within rows of the array 115. The adaptive write module 248 may be configured to buffer and/or arrange data segments (e.g., the ECC codewords 621, 622, and 623) into 24 byte segments. The adaptive write module 248 may be capable of buffering one or more ECC codewords 620. For example, the write buffer 320 may comprise ten, 24 byte rows, which is sufficient to buffer a full 240 byte ECC codeword 620.

The adaptive write module 248 may be further configured to stream 24 byte segments to a parity module 637, which may be configured to generate a parity byte for each 24 byte segment. The adaptive write module 248 streams the resulting 25 bytes to the array 115 via the bank controller 252 and bus 127 (and/or write buffer 250, as disclosed above). The adaptive storage module 113 may be configured to stream data from the adaptive write module 248 to program buffers of the solid-state storage array 115 (e.g., stream to a program buffer of one of the solid-state storage elements 116A-Y). Accordingly, each cycle of bus 127 may comprise transferring a byte to the program buffer of a respective column 118; solid-state storage elements 116A-X receive data bytes and solid-state storage element 116Y receives the parity byte generated by the parity module 637. Data of the ECC codewords 620 may be byte-wise interleaved between the solid-state storage elements 116A-X; each solid-state storage element 116A-X receives 10 bytes of each 240 byte ECC codeword 620. Accordingly, the adaptive write module 248 may be configured to stream "data rows" 667 to the solid-state storage array 115. As used herein, a data row 667 refers to a data set comprising data for each of a plurality of columns 118 within the array 115. The data row 667 may comprise a byte of data for each column 0-23. The data row 667 may further comprise a parity byte corresponding to the data bytes (e.g., a parity byte corresponding to the data bytes for columns 0-23). The data row 667 may be streamed to respective program buffers of the solid-state storage elements 116A-Y on the bus 127. In the horizontal data configuration of FIG. 6A, streaming a 240 byte ECC codeword 620 to the array 115 may comprise streaming ten separate data rows 667 to the array 115, each data row comprising 24 data bytes (one for each data solid-state storage element 116A-X) and a corresponding parity byte.

The storage location or offset 636 of the packet 610A within the logical page 650A may be determined based upon the horizontal layout of the data 610A of the packet. The offset 636 may identify the location of the ECC codewords 621, 622, and/or 623 comprising the packet 610A (and/or may identify the location of the last ECC codeword 623 comprising data of the packet 610A). Accordingly, in some embodiments, the offset may be relative to one or more data structures on the logical storage element 515 (e.g., a packet offset and/or ECC codeword offset). Another offset 638 may identify the location of the last ECC codeword of a next packet 620 (e.g., packet 610B), and so on.

As depicted in FIG. 6A, each of the ECC codewords 621, 622, and 623 are horizontally spread across the storage elements 116A-Y comprising the logical page 650A (e.g., 10 bytes of the ECC codewords 621, 622, and 623 are stored on each solid-state storage element 116A-X). Accessing the packet 610A may, therefore, comprise accessing each of the ECC codewords 621, 622, and 623 (and each of the storage elements 116A-X).

Figure 6B:
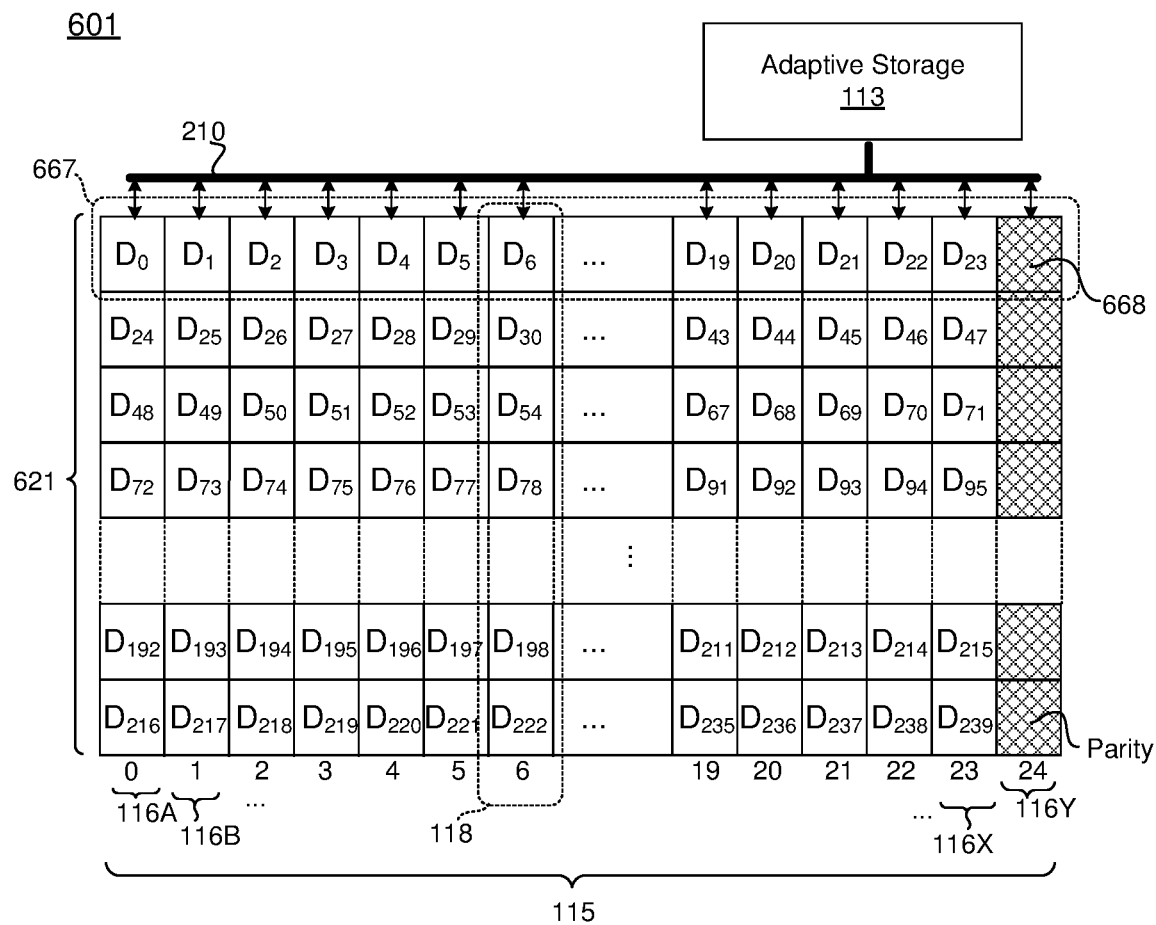
FIG. 6B depicts one embodiment of horizontal, adaptive data storage.

FIG. 6B depicts one embodiment of horizontal, adaptive data storage 601. The FIG. 6B embodiment depicts a horizontal layout 601 of the ECC codeword 621 on the array 115 of FIG. 6A. Data $D_0$ denotes a first byte of the ECC codeword 621, and data D239 denotes the last byte (byte 240) of the ECC codeword 621. As illustrated in FIG. 6B, each column 118 of the solid-state storage array 115 comprises ten (10) bytes of the ECC codeword 621, and the data of the ECC codeword 621 is horizontally spread across a row 117 of the array 115 (e.g., horizontally spread across solid-state storage elements 116A-X of the array 115). FIG. 6B also depicts a data row 667 as streamed to (and stored on) the solid-state storage array 115. As illustrated in FIG. 6B, the data row 667 comprises a bytes 0 through 23 of the ECC codeword D, each stored on a respective one of the columns 118. The data row 667 further comprises a parity byte 668 corresponding to the contents of the data row 667 (bytes $D_0$ through $D_{23}$).

Since the data is spread across the columns 0-23 (solid-state storage elements 116A-X), reading data of the ECC codeword 621 may require accessing a plurality of columns 118. Moreover, the smallest read unit may be an ECC codeword 620 (and/or packet 610). Reading a packet 310 stored horizontally on the solid-state storage array 115 may, therefore, incur significant overhead. Referring back to FIG. 6A, reading the packet 610A may require transferring data of the logical page 650A into respective read buffers of the storage elements 116A-X (e.g., storage elements 0 through 23). Transferring the contents of a page into the read buffer may incur a latency of Tr (read latency). As used herein, read time or read latency Tr refers to the time needed to transfer the contents of a physical storage unit (e.g., physical page) into a read buffer of a solid-state storage element 116A-Y. In the FIG. 6A embodiment, the read time Tr may, therefore, refer to the time required to transfer a physical page of each of the solid-state storage elements 116A-X into a respective read buffer. Accordingly, the read time Tr of a logical storage unit 650 may correspond to the "slowest" read time of the constituent storage elements 116A-X.

In the FIG. 6A embodiment, each ECC codeword comprises 240 bytes, and each packet comprises 520 bytes. The size of a logical page, however, may be much larger. For example, each page may comprise 2 kbytes (or more), and as such, a logical page may comprise forty-eight (48) Kbytes. Accordingly, reading a packet may require transferring 48 kbytes of data to access 520 bytes (or less) of data.

Upon transferring the data into the respective read buffers, data may be streamed into the read module 241 by way of the 24 byte storage bus 127 (and bank controller 252). The stream time (Ts) may refer to the time required to stream the ECC codeword 620 (or packet 610) into the pipeline 241. In the horizontal layout of FIG. 6A, the stream time Ts may be ten (10) cycles of the bus 127 because, as disclosed above, each column 118 comprises ten (10) bytes of the ECC codeword 620. Therefore, although the horizontal arrangement incurs a high retrieval overhead, the stream overhead is relatively low (only ten (10) clock cycles).

Given the data arrangement within the solid-state storage array 115, and the latencies disclosed herein, an input/output operations per second (IOPS) metric may be quantified. The IOPS to read an ECC codeword 620 may be expressed as:

$$IOPS_r = \frac{C}{(T_r + T_s)} \qquad \text{Eq. 1}$$

In Equation 1, Tr is the read time of the solid-state storage elements 116A-Y, Ts is the stream time (e.g., the clock speed times the number of cycles required), and C is the number of independent columns used 118 to store the data. Equation 1 may be scaled by the number of independent banks 119A-N available to the adaptive storage module 113. In the Horizontal data structure layout of FIGS. 6A and 6B, Equation 1 may be expressed as:

$$IOPS_r = \frac{24}{(T_r + 10 * S_c)} \qquad \text{Eq. 2}$$

In Equation 2, the number of columns is twenty-four (24), and Sc is the cycle time of the bus 127. The cycle time is scaled by ten (10) since, as disclosed above, a horizontal 240 byte ECC codeword 620 may be streamed in ten (10) cycles of the bus 127.

The storage module may be configured to store data in different configurations, layouts, and/or arrangements on the solid-state storage medium 110. As disclosed above, in some embodiments, the adaptive write module 248 is configured to arrange data within respective independent columns, each comprising a subset of the columns 118 of the solid-state storage array 115 (e.g., subsets of the solid-state storage elements 116A-Y). Alternatively, or in addition, the adaptive write module 248 may be configured to store data vertically within respective "vertical stripes." The vertical stripes may have a configurable depth, which may a factor of the page size of the solid-state storage elements 116A-Y comprising the array 115.

Figure 6C:
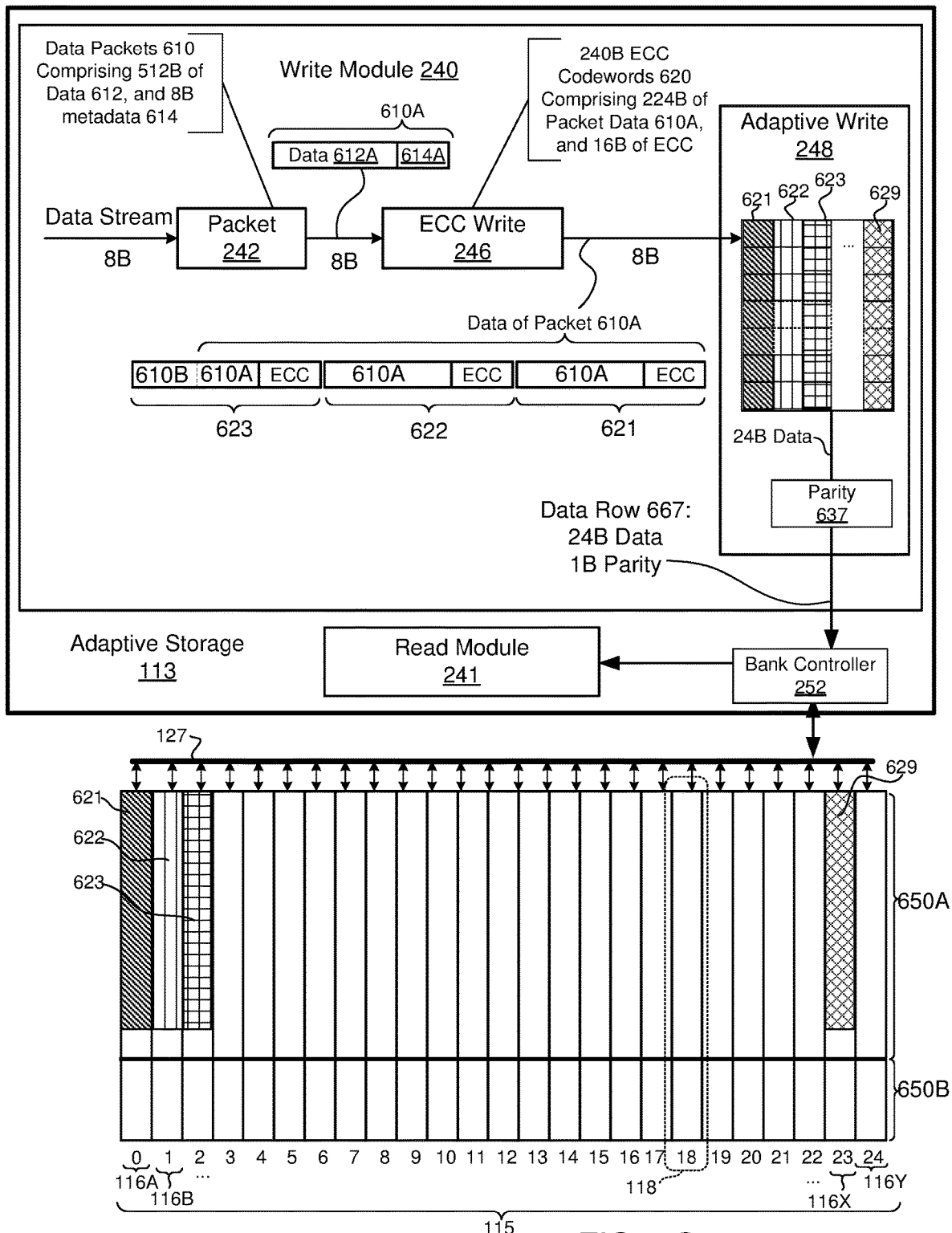
FIG. 6C is a block diagram of another embodiment of a system for adaptive data storage.

FIG. 6C depicts another embodiment of a system 602 for adaptive data layout. In the FIG. 6C embodiment, the adaptive write module 248 may be configured to store data in a vertical layout within the array 115. The adaptive write module 248 may be configured to buffer ECC codewords 620 for storage on respective columns 118 of the solid-state storage array 115 (including the ECC codewords 621, 622, and 623 disclosed herein). The ECC codewords 610 may be streamed to respective columns 118 of the array through a write buffer 250 (not shown). Accordingly, each cycle of the bus 127 may comprise streaming a byte of a different respective ECC codeword 610 to each of the columns 116A-X. The adaptive write module 248 may be further configured to generate parity data 637 corresponding to the different ECC codewords 610 for storage on a parity column (e.g., solid-state storage element 116Y). Accordingly, each stream cycle may comprise streaming a byte of a respective ECC codeword 610 to a respective column 118 along with a corresponding parity byte to a parity column 118.

As depicted in FIG. 6C, the adaptive write module 248 may be configured to buffer and rotate ECC codewords for vertical storage within respective columns 118 of the array 115: the ECC codeword 621 may stream to (and be stored vertically on) column 0 (solid-state storage element 116A), the ECC codeword 622 may be stored vertically on column I (solid-state storage element 116B), the ECC codeword 623 may be stored vertically on column 2 (solid-state storage element 116C), and so on (the ECC codeword 629 may be stored vertically in the column 23, solid-state storage element 116X). Column 24 (solid-state storage element 116Y) may be configured to store parity data corresponding to the ECC codewords, as disclosed above. Alternatively, the parity column 24 may be used to store additional ECC codeword data.

In some embodiments, the adaptive storage module 113 may comprise a plurality of packet modules 242 and/or ECC write modules 246 (e.g., multiple, independent write modules 240) configured to operate in parallel. Data of the parallel write modules 240 may flow into the adaptive write module 248 in a checkerboard pattern such that the data is arranged in the vertical format disclosed herein.

The vertical arrangement of FIG. 6C may store data of each ECC codeword 620 within a respective column 118 of the array 115. Accordingly, each data row 667 streamed to the array 115 may comprise a byte corresponding to a respective ECC codeword 620. The data row 667 may further comprise a corresponding parity byte; the data rows 667 may be configured to stream data of respective ECC codewords 660 to program buffers of respective data columns (e.g., solid-state storage elements 116A-Y), and a corresponding parity byte to a parity column (e.g., column 116Y). Accordingly, the data rows 667 may be stored with byte-wise parity information, each byte of a row 667, and stored within the solid-state storage elements 116A-X, may be reconstructed by use of the other bytes in the row 667 (and stored in other solid-state storage elements 116A-X) and the corresponding parity byte.

Figure 6D:
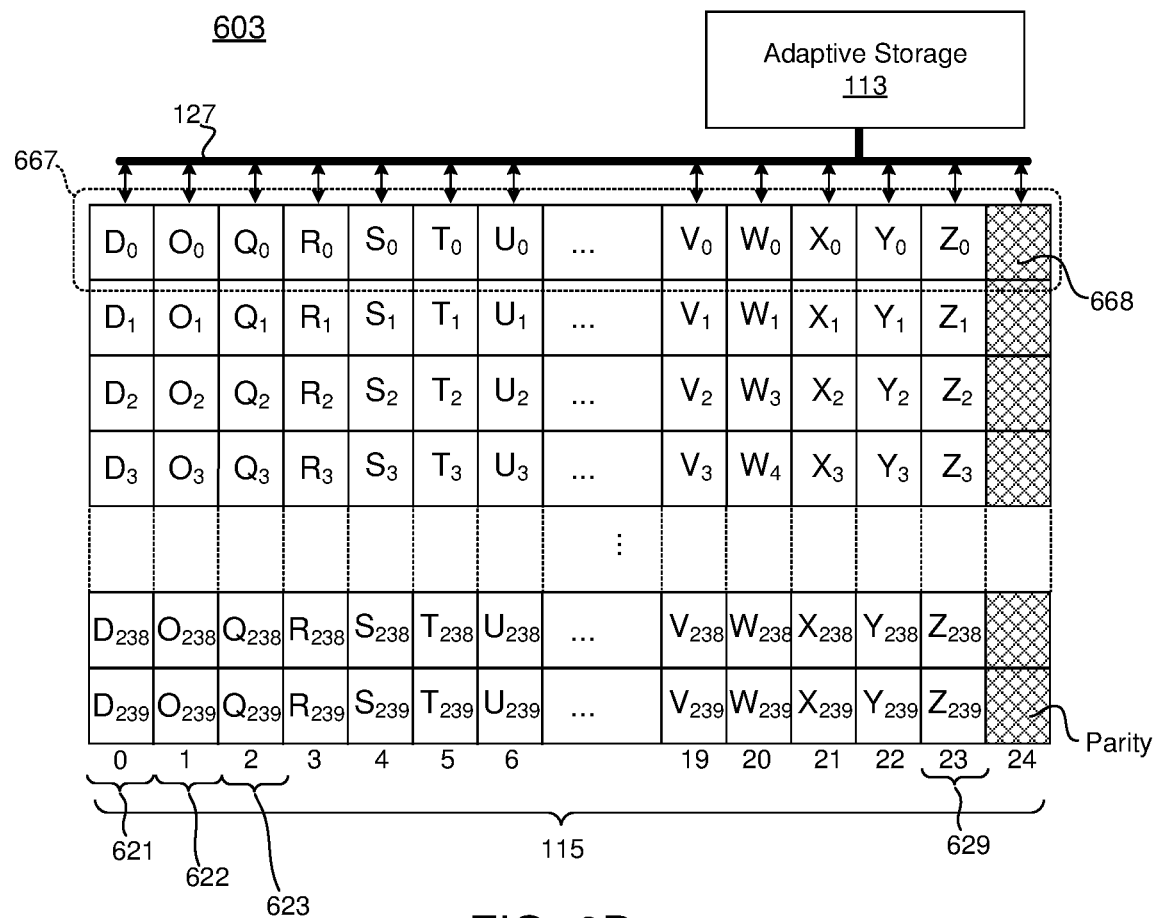
FIG. 6D depicts one embodiment of vertical, adaptive data storage.

FIG. 6D depicts one embodiment of vertical, adaptive data storage 603. The FIG. 6D embodiment illustrates a vertical storage configuration within the solid-state storage array 115. As illustrated in FIG. 6D, data Do through D239 of the ECC codeword 621 is stored vertically in column 0, Data $O_0$ through $O_{239}$ of ECC codeword 622 is stored vertically in column 1, Data $Q_0$ through $Q_{239}$ of ECC codeword 623 is stored vertically in column 2, and data $Z_0$ through $Z_{239}$ of ECC codeword 629 is stored vertically in column 23. The vertical storage configuration of other data of other ECC codewords 620 (R-Y) is also depicted.

FIG. 6D also depicts one embodiment of a data row 667 as streamed to, and stored on, the solid-state storage array 115. As illustrated in FIG. 6D, the data row 667 comprises a byte of each of a plurality of ECC codewords 620 (ECC codewords D, O, R, S, T, U . . . V, W, X, Y, and Z), each of which is streamed to, and stored within, a respective column 118 (respective solid-state storage element 116A-X). The data row 667 further comprises a parity byte 668 corresponding to the data within the data row 667. Accordingly, the parity byte 668 corresponds to byte 0 of ECC codewords D, O, R, S, T, U . . . V, W, X, Y, and Z.

The vertical configuration of FIGS. 6C and 6D may result in a different IOPS metric. The vertical arrangement of the ECC codewords 620 may reduce overhead due to read time Tr, but may increase the stream overhead Ts. As data is streamed from a logical storage element 116A-Y, each byte on the bus 127 may correspond to a different, respective data segment (e.g., different ECC codeword 620). As such, twenty-four different ECC codewords 620 may be streamed in parallel (as opposed to streaming a single ECC codeword 620 as in the horizontal arrangement example). Moreover, since each column may be independently addressable, each transferred logical page may comprise data of a separate request (e.g., may represent data of twenty-four different read requests). However, since each ECC codewords is arranged vertically, the stream time Ts for an ECC codeword 620 may be increased; the stream time of 240 byte ECC codewords 620 in a vertical configuration may be 240 cycles, as opposed to 10 cycles in the fully horizontal layout of FIGS. 6A and 6B. The IOPS metric for a single ECC codeword 620, therefore may be represented as:

$$IOPS_r = \frac{1}{(T_r + 240 * S_c)} \qquad \text{Eq. 3}$$

The reduced IOPS metric may be offset by the increased throughput (reduced read overhead) and/or different Tr and Ts latency times. These considerations may vary from device to device and/or application to application. Moreover, the IOPS metric may be ameliorated by the fact that multiple, independent ECC codewords 620 can be streamed simultaneously. Therefore, in some embodiments, the data layout used by the storage module 130 (and adaptive write module 248) may be configurable (e.g., by a user setting or preference, firmware update, or the like).

Figure 6E:
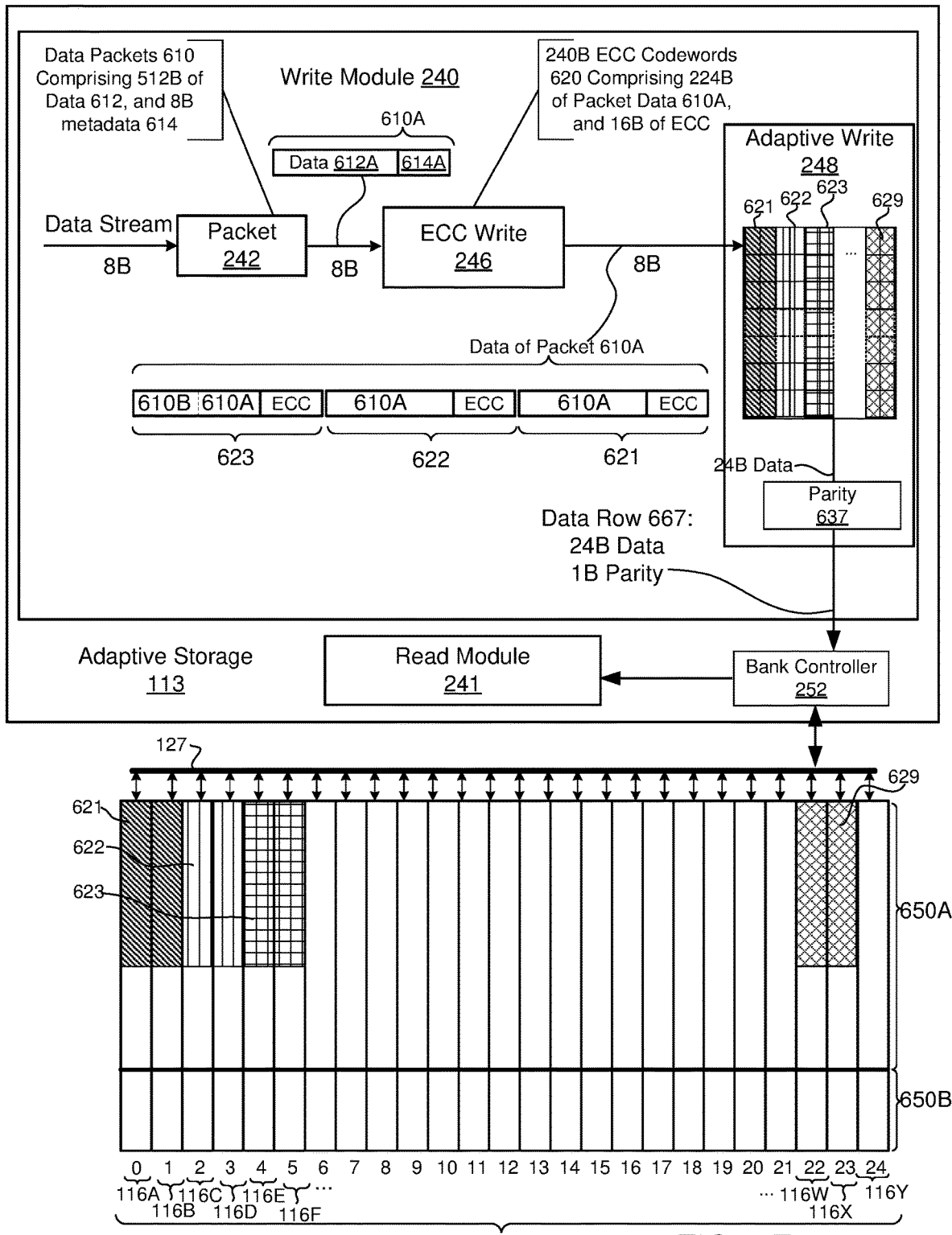
FIG. 6E is a block diagram of another embodiment of a system for adaptive data storage.

As disclosed above, in some embodiments, the adaptive write module 248 may be configured to layout and/or arrange data in an adaptive channel configuration. As used herein, an adaptive channel configuration refers to a data layout in which the columns 118 of the array 115 are divided into a plurality of independent channels, each channel comprising a set of columns 118 of the solid-state storage array 115. The channels may comprise subsets of the solid-state storage elements 116A-Y. In some embodiments, an adaptive channel configuration may comprise a fully horizontal data layout, in which data segments are stored within a channel comprising 24 columns 118 of the array 115, as disclosed in conjunction with FIGS. 6A and 6B. In other embodiments, the adaptive channel configuration may comprise a vertical configuration, in which data segments are stored within one of 24 different channels, each comprising a single column 118 of the array 115, as disclosed in conjunction with FIGS. 6C and 6D. In other embodiments, the adaptive storage module 248 may be configured to store data in other adaptive channel configurations and/or layouts on the solid-state storage array 115. FIG. 6E depicts another embodiment of a system 604 for adaptive data storage. In the FIG. 6E embodiment, the adaptive storage module 113 is configured to store data structures adaptive channels comprising two solid-state storage elements 116A-Y (two independent columns 118 per channel). Accordingly, data segments may be stored within two columns 118 of the array. In the FIG. 6E embodiment, the adaptive write module 248 may be configured to buffer twelve (12) ECC codewords 620 to stream to the array 115. Each of the twelve ECC codewords 620 may stream to a respective set of two columns 118 within the array 115.

In alternative adaptive channel configurations, the adaptive write module 248 may be configured to buffer 24/N ECC codewords 620, where N corresponds to the configuration of the adaptive channels used for each ECC codeword 620. ECC codewords 620, may be stored within channels comprising N independent columns 118. Accordingly, the horizontal arrangement of FIGS. 6A and 6B could be referred to as an adaptive channel configuration comprising 24 column channels, and the vertical data structure configuration of FIGS. 6C and 6D may be referred to as an adaptive channel configuration comprising single column channels. The adaptive storage module 113 may be configured to arrange data in any suitable hybrid arrangement, including heterogeneous virtual columns. For example, the adaptive write module 248 may be configured to buffer six (6) ECC codewords 620 in a four (4) column adaptive channel configuration (e.g., store ECC codewords 620 across each of four (4) columns), buffer four (4) ECC codewords 620 in a six (6) column adaptive channel configuration (e.g. store ECC codewords 620 across each of six (6) columns), and so on.

In some embodiments, data structures may be arranged in adjacent columns 118 within the array 115 (e.g., a data structure may be stored in columns 0-4). Alternatively, columns may be non-adjacent and/or interleaved with other data structures (e.g., a data structure may be stored on columns 0, 2, 4, and 6 and another data structure may be stored on columns 2, 3, 5, and 7). The adaptive write module 248 may be configured to adapt the data arrangement to out-of-service conditions; if a column 118 (or portion thereof) is out of service, the adaptive storage module 113 may be configured to adapt the data arrangement accordingly (e.g., arrange data to avoid the out of service portions of the array 115, as disclosed above).

FIG. 6E depicts an embodiment of data layout within channels comprising two column of the array 115 (e.g., two solid-state storage elements 116A-X per channel). Accordingly, each data row 667 may comprise two bytes of each of twelve different ECC codewords 620 and a corresponding parity byte. The data row 667 may comprise two bytes of ECC codeword 621, two bytes of ECC codeword 622, two bytes of ECC codeword 623, and so on. On each cycle of the bus 127, two bytes of each ECC codeword 620 (e.g., ECC codewords 621, 622, 623, 629, and so) on are transferred to program buffers of respective solid-state storage elements 116A-X. Data of the ECC codeword D 621 may be streamed to a first channel comprising columns O and 1 (solid-state storage elements 116A-B), the ECC codeword 622 may be streamed to a second channel comprising columns 2 and 3 (solid-state storage elements 116C-D), the ECC codeword 623 may be streamed to a third channel comprising columns 4 and 5 (solid-state storage elements 116E-F), the ECC codeword 629 may be streamed to a last channel comprising columns 22 and 23 (solid-state storage elements 116W-X), and so on.

Figure 6F:
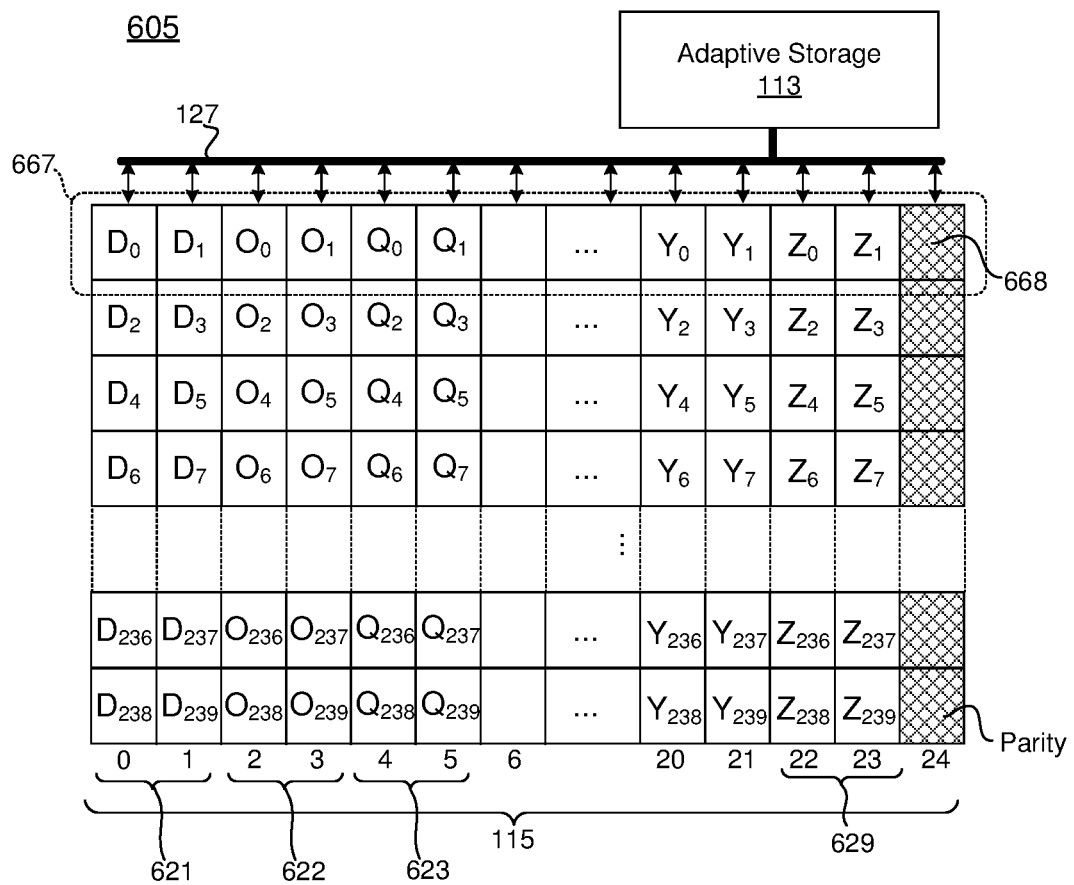
FIG. 6F depicts another embodiment of adaptive data storage on a solid-state storage array.

FIG. 6F depicts one embodiment 605 of a data structure configuration for the two column channel embodiment of FIG. 6E. As illustrated in FIG. 6F, data of ECC codeword D 621 may be stored within a channel comprising columns 0 and 1, data of ECC codeword O 622 may be stored within a channel comprising columns 2 and 3, data of ECC codeword Q 623 may be stored within a channel comprising columns 4 and 5, and so on. FIG. 6F further depicts a data row 667. The data row 667 of FIG. 6F may include two bytes of each of twelve different ECC codewords D, O, Q . . . Y, and Z. The data row 667 may further comprise a parity byte 668 corresponding to the contents of the data row 667, as disclosed above.

The stream time Ts of an ECC codeword 620 in the FIG. 6E embodiment may be 120 cycles of the bus 127 (e.g., 240/N cycles). An IOPS metric of the two (2) column hybrid arrangement of FIG. 6E may be represented as:

$$IOPS_r = \frac{2}{(T_r + 240 * S_c)} \quad \text{Eq. 4}$$

The IOPS metric may be modified according to a number of data structures that can be read in parallel. The two-column channel configuration of FIG. 6E may enable 12 different ECC codewords (and/or packets) to be read from the array 115 concurrently.

The adaptive data structure configurations disclosed herein may affect error detection and/or data recovery operations. In a horizontal data alignment, data of each ECC codeword 620 may be spread across the columns 118 of the array 115 (e.g., ten bytes on each of twenty four solid-state storage elements 116A-X). Therefore, if an uncorrectable ECC error is encountered, identifying the source of the error may comprise performing an iterative parity substitution across each of the twenty four storage elements 116A-X (e.g., reconstruct the ECC codeword 620 from parity data while omitting data of a respective storage element 116A-X until the source of the error is identified). Moreover, since the ECC codewords 620 cannot be corrected until data of the failed column is recovered, parity reconstruction may aggregate errors in other columns 118.

By contrast, when data is arranged vertically as in FIGS. 6C and 6D, the source of the error may be immediately determined without iterative parity substitution; since all of the data of the ECC codeword 620 is stored within a single solid-state storage element 116A-X, failure to validate an ECC codeword 620 by the ECC read module 245 indicates that the corresponding column 118 within the array is the source of the uncorrectable error.

As disclosed above, a suitable data arrangement may be selected, at least in part, based upon the ECC algorithm in use (e.g., the size of the ECC codewords 620, ratio between data and syndrome, and so on). In some embodiments, the adaptive storage module 113 may be configured to implement a symbolic ECC algorithm. For example, the ECC write module 246 may be configured generate ECC symbols (e.g., 8 bit ECC symbols), which may be individually streamed to solid-state storage array 115, as disclosed herein. Since the ECC symbols each fall within a single column, the adaptive storage module 113 may be configured to arrange the ECC symbols in any of the horizontal, vertical, and/or hybrid arrangements described above. Alternatively, or in addition, the data arrangement may be selected according to other data structures within the ECC symbols, such as packets 610, or the like. For example, an ECC symbol arrangement may be configured to store ECC symbols of a packet 610 horizontally, vertically, and/or in a hybrid arrangement, as described above. Other ECC symbol sizes (e.g., 16 bit symbols, 32 bit symbols, and so on), may be arranged according to a horizontal, vertical, and/or hybrid arrangement, as disclosed herein.

In some embodiments, vertical data structure configuration may provide benefits for data reconstruction. In particular, vertical data structure layout and/or arrangement may avoid error aggregation issues. Referring back to FIG. 6D, the data recovery module 170 may be configured to reconstruct data of a vertically arranged ECC codeword 620 by reading ECC codewords 620 on other columns 118 of the array 115, correcting errors in the other ECC codewords 620 (if any) by, inter alia, decoding the other ECC codewords 620 using the ECC read module 245, and using the corrected and/or decoded ECC codewords and parity data of column 24 to reconstruct the ECC codeword 620 within the failed column 118. Use of corrected and/or decoded ECC codewords, as opposed to portions of uncorrected ECC codeword data 620, may prevent errors from being aggregated and/or included in the reconstructed ECC codeword.

In the FIG. 6D data structure configuration, if column O comprising ECC codeword D 621 fails, such that the ECC codeword D 621 cannot be read from the array, the reconstruction module 170 may be configured to reconstruct the ECC codeword 621 by: reading ECC codewords O through Z from columns 1 through 23 (and parity data of column 24); correcting errors in the ECC codewords O through Z (if any) by use of the ECC read module 245; and reconstructing data of the ECC codeword D 621 using the corrected ECC codewords O through Z and the parity data of column 24. Accordingly, the data used to correct ECC codeword D 621 (ECC codewords O through Z) may be free from correctable errors, and as such, such errors may not be reflected in the reconstructed data comprising ECC codeword D 621.

Hybrid, independent channel data structure layouts may provide similar benefits. For example, identifying errors in a two (2) column hybrid may only require iterative substitution between two (2) columns, errors in a four (4) column hybrid may only require iterative substitution between four (4) columns, and so on. Referring back to FIG. 6F, identifying the source of an uncorrectable error in the ECC codeword D 621 may comprise iterative parity substitution between two columns 0 and 1.

Hybrid, independent channel configurations may also benefit from reduced error aggregation during data reconstruction. Referring to the two column channel embodiment of FIGS. 6E and 6F, ECC codewords 620 may be stored within channels comprising two columns 118 of the array 115. Accordingly, reconstructing data of a failed column of one of the channels may comprise reading data of other ECC codewords 620 on other columns of the array 115, correcting errors within the other ECC codewords 620 (if any), and using the corrected ECC codewords 620, data of the valid column of the channel, and the parity data to reconstruct data of the failed column 118. For example, reconstructing data of failed column 0 comprising ECC codeword D 621 may comprise: reading data of ECC codewords O through Z on columns 2 through 23, correcting errors within the ECC codewords 622, 623, through 629 (if any) by use of the ECC read module 245; and reconstructing data of column 0 by use of data read from column 1, the corrected ECC codewords of columns 2 through 23, and the parity data of column 24. The only source of potential uncorrected errors is the other columns within the channel with the failed column 0 (column 1). Accordingly, data reconstructing in the FIGS. 6E and 6F embodiment incorporates errors from only a single column, as opposed to aggregating errors from 23 other columns as in the horizontal data structure layout of FIGS. 6A and 6B.

The size of the data structures, such as the ECC codewords 620 and/or packets 610, may be adapted according to the data arrangement implemented by adaptive write module 248. For example, the size of the ECC codewords 620 may be selected to minimize wasted overhead when ECC codewords 620 are stored in a horizontal arrangement on twenty four storage elements 515. However, in other data arrangement embodiments, other data structure sizes may be selected. For example, in the vertical layout of FIGS. 6C and 6D, the size of the ECC codeword 620 may be adapted according to the "depth" of the columns (e.g., the page size of each solid-state storage element). Hybrid, independent channel configurations may involve similar sizing considerations. In some embodiments, the size of the ECC codewords 620 (e.g., the ratio of data to syndrome) may be used to determine a suitable data arrangement. For example, given a particular ECC codeword size, a data arrangement that minimizes wasted overhead, while providing an acceptable IOPS metric, may be identified based on, inter alia, the depth of physical storage units of the solid-state storage medium 110.

Table 1 illustrates various configurations of adaptive channel data layout embodiments used with different data structure sizes (240 and 960 byte ECC codewords 620), as disclosed herein:

| Adaptive Data Configuration | Independent Channels, Codewords/Read | Ts: 240 Byte Data Structures | Ts: 960 Byte Data Structures |
|---|---|---|---|
| 1 of 24 (vertical, FIGS. 6C and 6D) | 1 | 240 | 960 |
| 2 of 12 (hybrid, FIGS. 6E and 6F) | 2 | 120 | 480 |
| 3 of 8 | 3 | 80 | 320 |
| 4 of 6 | 4 | 60 | 240 |
| 2 of 3 and 3 of 6 | 5 | 48 | 192 |
| 6 of 4 | 6 | 40 | 160 |
| 4 of 3 and 3 of 4 | 7 | 34 | 137 |
| 8 of 3 | 8 | 30 | 120 |
| 4 of 3 and 5 of 2 and extra 2 of 1 | 9 | 27 | 107 |
| 4 of 3 and 6 of 2 | 10 | 24 | 96 |
| 4 of 3 and 5 of 2 and 2 of 1 | 11 | 22 | 87 |
| 12 of 2 | 12 | 20 | 80 |
| 4 of 3 and 3 of 2 and 6 of 1 | 13 | 18 | 74 |
| 4 of 3 and 2 of 2 and 8 of 1 | 14 | 17 | 69 |
| 4 of 3 and 1 of 2 and 10 of 1 | 15 | 16 | 64 |
| 4 of 3 and 12 of 1 | 16 | 15 | 60 |
| 3 of 3 and 14 of 1 and extra 1 of 1 | 17 | 14 | 56 |
| 3 of 3 and 15 of 1 | 18 | 13 | 53 |
| 2 of 3 and 18 of 1 | 20 | 12 | 48 |
| 1 of 3 and 20 of 1 and extra 1 of 1 | 21 | 11 | 46 |
| 1 of 3 and 21 of 1 | 22 | 11 | 44 |
| 1 of 2 and 22 of 1 | 23 | 10 | 42 |
| 24 of 1 (horizontal, FIGS. 6A and 6B) | 24 | 10 | 40 |

As disclosed herein, storage of data structures in vertical configurations may improve error detection, error correction and/or data reconstruction performance. However, horizontal storage configurations may provide performance benefits in certain situations (e.g., reduce stream time). Accordingly, in some embodiments, the storage module may be configured to store data structures in an adaptive vertical stripe configuration. As used herein, a vertical stripe configuration refers to storing data structures vertically within vertical stripes having a predetermined depth. Multiple vertical stripes may be stored within rows 117 of the array 115. The depth of the vertical stripes may, therefore, determine read-level parallelism, whereas the vertical ECC configuration may maximize error detection, correction, and/or reconstruction benefits.

FIG. 6G depicts one embodiment of a vertical stripe data configuration 606 within a logical page 542 (row 117) of a solid-state storage array 115. As disclosed above, a vertical stripe may comprise vertically arranged data structures within respective columns 118 of the array 115. The vertical stripes 646A-N have a configurable depth or length. In the FIG. 6G embodiment, the vertical stripes 646A-N are configured to have a depth sufficient to store four ECC codewords. In some embodiments, the depth of the vertical stripes 646A-N corresponds to an integral factor of ECC codeword size relative to a page size of the solid-state storage medium 110.

In the FIG. 6G embodiment, the page size of the solid-state storage medium 110 may be 16 kb, each page may be configured to hold four vertical stripes 646A-N, and each vertical stripe may be configured to hold four 1 kb vertically aligned ECC codewords. The disclosed embodiments are not limited in this regard, however, and could be adapted to use any solid-state storage medium 110 having any page size in conjunction with any ECC codeword size and/or vertical stripe depth.

The depth of the vertical stripes 646A-N and the size of typical read operations, may determine, inter alia, the number of channels (columns) needed to perform read operations (e.g., determine the number of channels used to perform a read operation, stream time Ts, and so on). For example, a 4 kb data packet may be contained within 5 ECC codewords, including ECC codewords 3 through 7. Reading the 4 kb packet from the array 115 may, therefore, comprise reading data from two columns (columns 0 and 1). A larger 8 kb data structure may span ten ECC codewords (ECC codewords 98-107), and as such, reading the 8 kb data structure may comprise reading data from three columns of the array (columns 0, 1, and 2). Configuring the vertical stripes 646A-N with an increased depth may decrease the number of columns needed for a read operation, which may increase the stream time Ts for the individual read, but may allow for other independent read operations to be performed in parallel. Decreasing depth may increase the number of columns needed for read operations, which may decrease stream time Ts, but result in decreasing the number of other, independent read operations that can be performed in parallel.

Figure 6H:
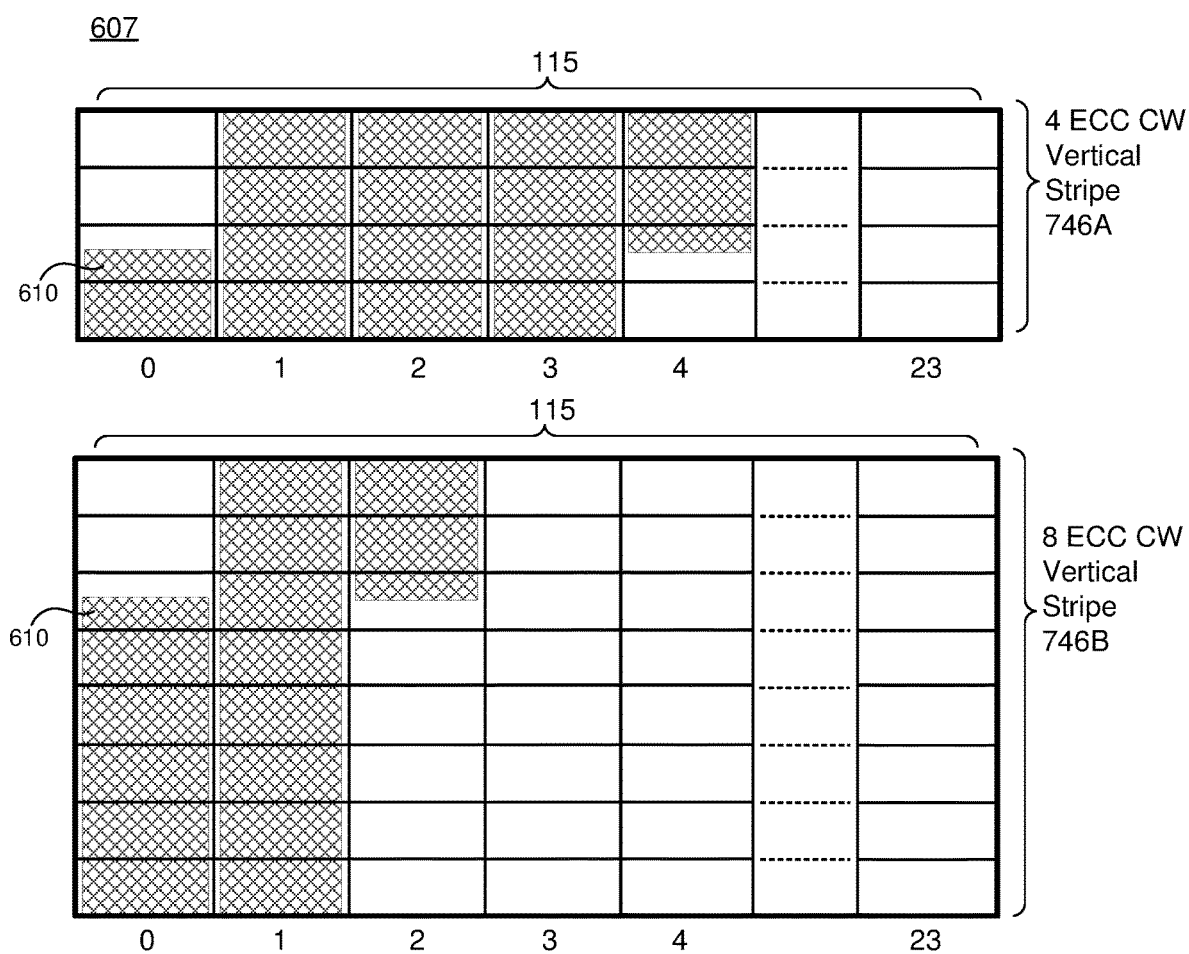
FIG. 6H depicts another embodiment of a vertical stripe configuration on a solid-state storage array.

FIG. 6H depicts embodiments of vertical stripes 607, each having a different respective depth. The vertical stripes 607 may comprise 1 kb, vertically aligned ECC codewords as disclosed above in conjunction with FIG. 6G. A 16 kb data structure 610 (packet) may be stored within a 4 k deep vertical stripe 746. The data structure 610 may be contained within seventeen separate ECC codewords spanning five columns of the array 115 (columns 0 through 5). Accordingly, reading the data structure 610 may comprise reading data from an independent channel comprising six columns. The stream time Ts of the read operation may correspond to the depth of the vertical stripe 746A (e.g., the stream time of four ECC codewords).

The depth of the vertical stripe 746B may be increased to 8 kb, which may be sufficient to hold eight vertically aligned ECC codewords. The data structure 610 may be stored within seventeen ECC codewords, as disclosed above. However, the modified depth of the vertical stripe 746B may result in the data structure occupying three columns (columns 0 through 2) rather than six. Accordingly, reading the data structure 610 may comprise reading data from an independent channel comprising three columns, which may increase the number of other, independent read operations that can occur in parallel on other columns (e.g., columns 3 and 4). The stream time Ts of the read operation may double as compared to the stream time of the vertical stripe 746A.

Figure 6I:
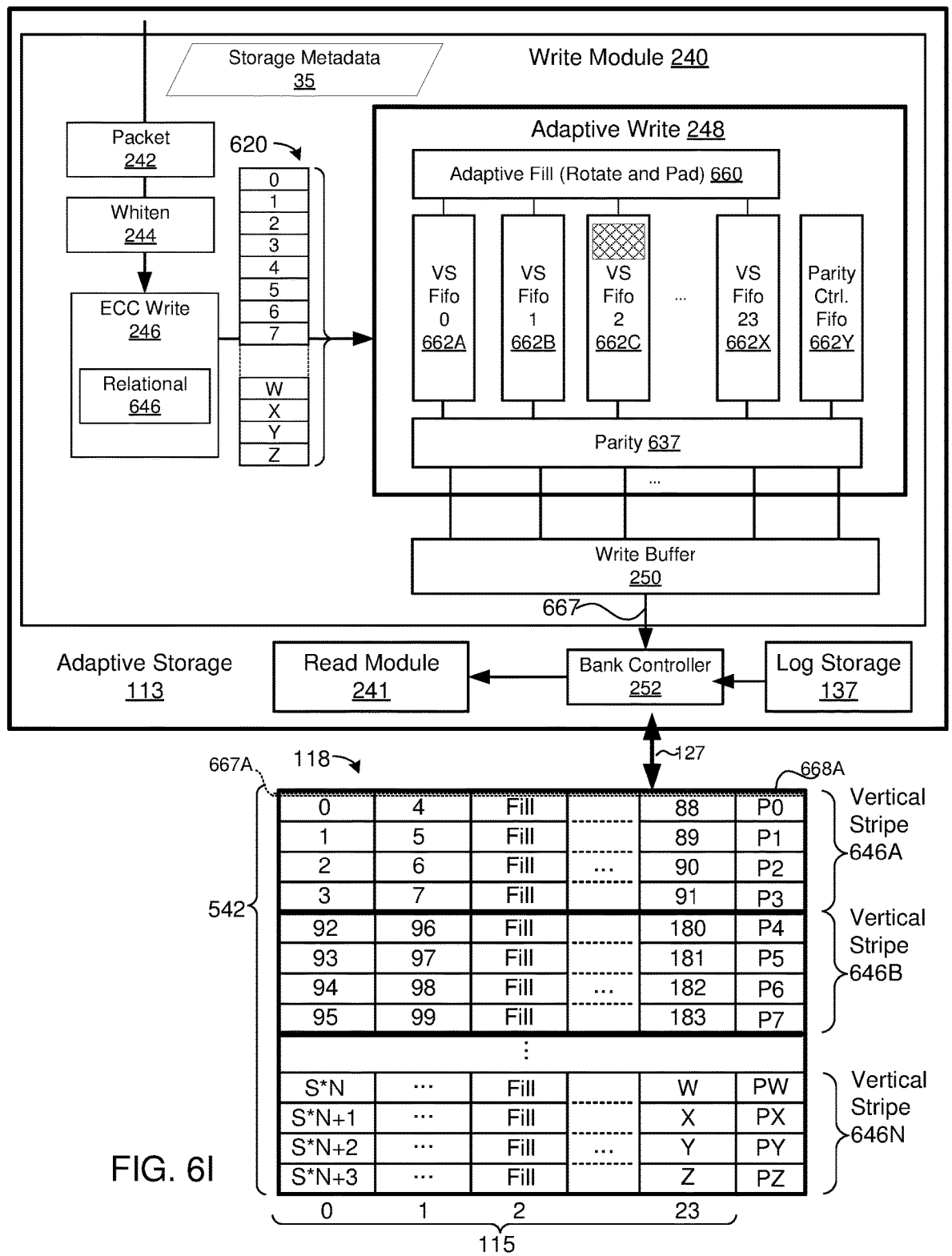
FIG. 6I is a block diagram of another embodiment of a system for adaptive data storage.

FIG. 6I is a block diagram of another embodiment of a system 608 for adaptive data storage. In the FIG. 6I embodiment, the adaptive write module 248 may be configured to store data in a vertical stripe configuration within logical pages 542 of the solid-state storage array 115. The write module 240 may comprise one or more processing modules, which as disclosed above, may include, but are not limited to: a packet module 242, a whiten module 244, and an ECC write module 246. The ECC write module 246 may be configured to generate ECC codewords 620 (ECC codewords 0 through Z) in response to data for storage on the solid-state storage array 115, as disclosed above. The ECC codewords 620 may flow into the adaptive write module 248 serially via a 128 bit data path of the write module 240. As disclosed in further detail herein, the ECC write module 246 may further comprise a relational module 646 configured to include relational information in one or more of the ECC codewords 620.

The adaptive write module 248 may be configured to buffer the ECC codewords 620 for storage in vertical stripes, as disclosed herein. The adaptive write module 248 may comprise an adaptive fill module 660 that is configured to rotate the serial stream of ECC codewords 620 into vertical stripes by use of, inter alia, one or more cross point switches, FIFO buffers 662A-X, and the like. The FIFO buffers 662A-X may each correspond to a respective column of the array 115. The adaptive fill module 660 may be configured to rotate and/or buffer the ECC codewords 620 according to a particular vertical code word depth, which may be based on the ECC codeword 620 size and/or size of physical storage units of the array 115.

The adaptive write module 248 may be further configured to manage OOS conditions within the solid-state storage array 115. As disclosed above, a OOS condition may indicate that one or more columns 118 of the array are not currently in use to store data. The storage metadata 135 may identify columns 118 that are out of service within various portions (e.g., rows 117, logical erase blocks 540, or the like) of the solid-state storage array 115. In the FIG. 6I embodiment, the storage metadata 135 may indicate that column 2, of the current logical page 542, is out of service. In response, the adaptive fill module 660 may be configured to avoid column 2 by, inter alia, injecting padding data into the FIFO buffer of the OOS column (e.g., FIFO buffer 662C).

In some embodiments, the adaptive write module 248 may comprise a parity module 637 that is configured to generate parity data in accordance with the vertical strip data configuration. The parity data may be generated horizontally, on a byte-by-byte basis within rows 117 of the array 115 as disclosed above. The parity data P0 may correspond to ECC codewords 0, 4, through 88; the parity data P1 may correspond to ECC codewords 1, 5, through 89, and so on. The adaptive write module 248 may include a parity control FIFO 662Y configured to manage OOS conditions for parity calculations (e.g., ignore data within OOS columns for the purposes of the parity calculation).

The vertical stripe data configuration generated by the adaptive write module 248 (and parity module 637) may flow to write buffers of the solid-state storage elements 116A-Y within the array 115 through the write buffer and/or bank controller 252, as disclosed above. In some embodiments, data rows 667 generated by the adaptive write module 247 may comprise on byte for each data column in the array 115 (columns 116A-X). Each byte in a data row 667 may correspond to a respective ECC codeword 620 and may include a corresponding parity byte. Accordingly, each data row 667 may comprise horizontal byte-wise parity information from which any of the bytes within the row 667 may be reconstructed, as disclosed herein. A data row 667A may comprise a byte of ECC codeword 0 for storage on column 0, a byte of ECC codeword 4 for storage on column 1, padding data for column 1, a byte of ECC codeword 88 for storage on column 23, and so on. The data row 667 may further comprise a parity byte 668A for storage on column 24 (or other column), as disclosed above.

The data may be programmed unto the solid-state storage array 115 as a plurality of vertical stripes 646A-N within a logical page 542, as disclosed above (e.g., by programming the contents of program buffers to physical storage units of the solid-state storage elements 116A-Y within the array 115). In the FIG. 6I embodiment, the indexing S*N may correspond to vertical stripes configured to hold S ECC codewords in an array 115 comprising N columns for storing data.

Figure 6J:
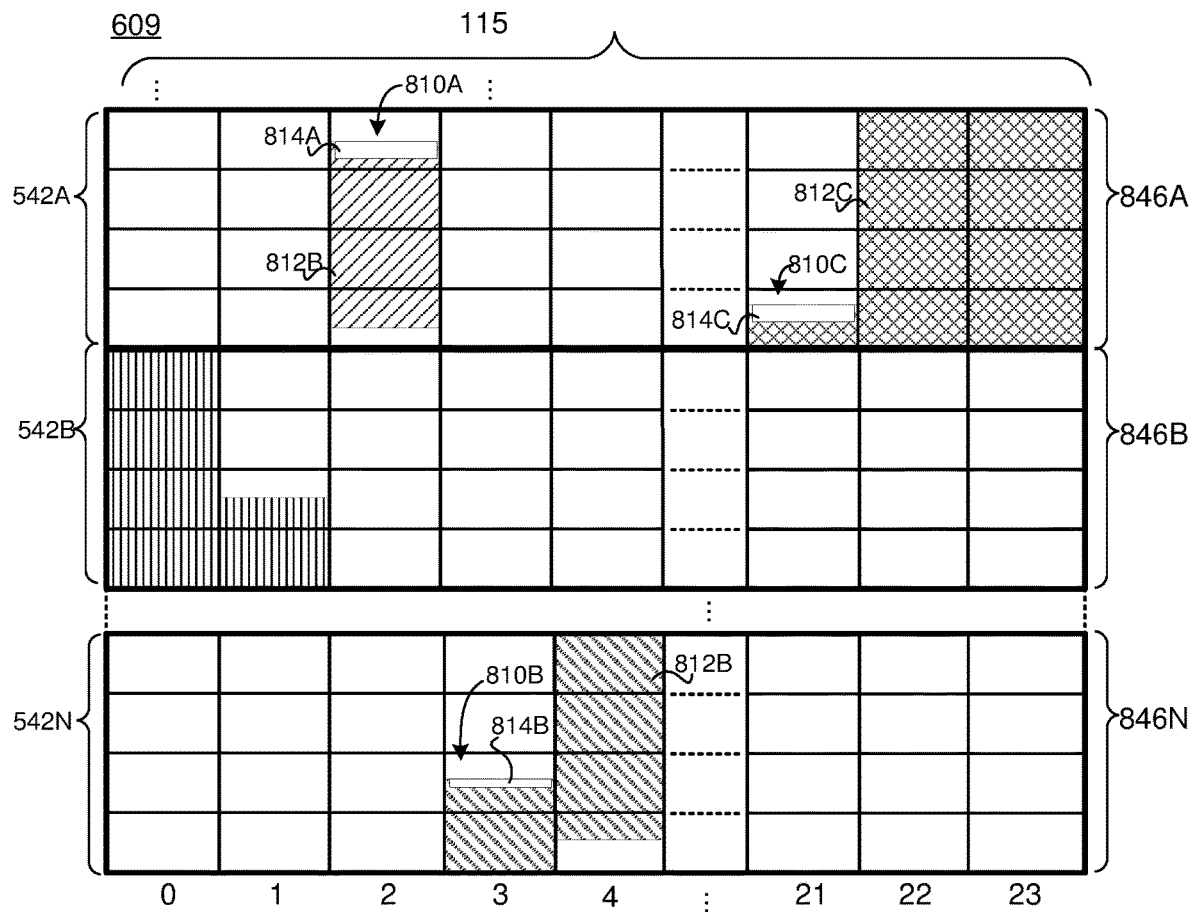
FIG. 6J depicts another embodiment of a vertical stripe configuration on a solid-state storage array.

As disclosed herein, data structures, such as data packets, may be stored within respective container data structures (ECC codewords), which may be spread across different columns 118 and/or rows 117 of the solid-state storage array 115. FIG. 6J depicts one embodiment 609 of a solid-state storage array 115 comprising a data structure (packet 810C) that is stored within a plurality of vertical stripes 846A-B. As illustrated in FIG. 6G, the adaptive write module 248 may be configured to arrange ECC codewords comprising the data structure 810C, such that portions of the data structure 810C are stored within the vertical stripe 846A and other portions are stored in a different vertical stripe 846B (ECC codewords comprising the packet 810C may wrap between different vertical stripes). In addition, portions of the data structure 810C may be stored on different rows 117 of the array 115 (e.g., within different logical pages 542A and 542B). In some embodiments, data structure 810C may span logical erase blocks and/or banks 119A-N; the logical page 542A may be within a different logical storage division 540 and/or different bank 119A-N than the logical page 542B. Moreover, header information stored with the data structures (e.g., headers 814A, 814B, and/or 814C) may be stored in separate ECC codewords than other portions of the corresponding packets 812A, 812B, and/or 812C).

In some embodiments, the ECC codewords comprising a particular data structure (e.g., data structure 810) may comprise relational information, which may allow the storage module to verify that different ECC codewords read from various different portions of the array 115 correspond to the same data structure 810C, despite the fact that the header information is distributed between different ECC codewords stored on different portions of the array 115. Referring back to FIG. 6I, the ECC write module 246 may comprise a relational module 646 configured to include relational information in the ECC codewords 620 generated thereby. The relational information may be configured to provide for identifying and/or verifying that certain ECC codewords 620 are related (e.g., provide for verifying that particular ECC codewords 620 comprise data of the same data structure 810C). The relational information may comprise any identifying data. In some embodiments, the relational information may be derived from the header 814C of the packet, such as the logical identifier(s) associated with the data structure 810C. The relational information pertaining to data structures processed by the ECC write module 646 may, therefore, be determined based on storage metadata 135 associated with the data, header information, or the like.

The relational module 646 may be configured to mark the ECC codewords 620 with relational information in any suitable format and/or using any suitable mechanism. Marking may comprise adding information to the ECC codewords 620 (e.g., in one or more fields, etc.). In some embodiments, the relational module 646 may be configured to mark ECC codewords 620 through Steganography and/or watermarking. Watermarking may comprise performing an XOR operation between relational information (e.g., a bitmask of one or more logical identifier(s) associated with the corresponding data structure) and the ECC codewords 620. As disclosed herein, an ECC data structure 620 may comprise portions of multiple different data structures; such ECC codewords 620 may include relational information associated with each data structure contained therein. Accordingly, in some embodiments, the relational module 646 may be configured to mark an ECC codeword 620 with multiple instances of relational information (e.g., multiple watermarks).

Figure 6L:
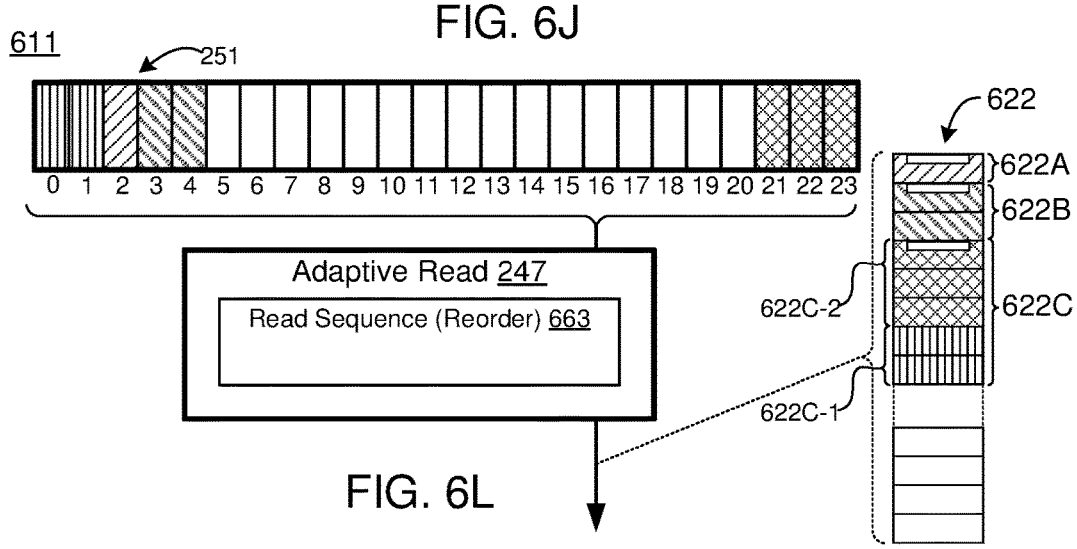
FIG. 6L is a block diagram of another embodiment of a system for adaptive data storage.
Figure 6K:
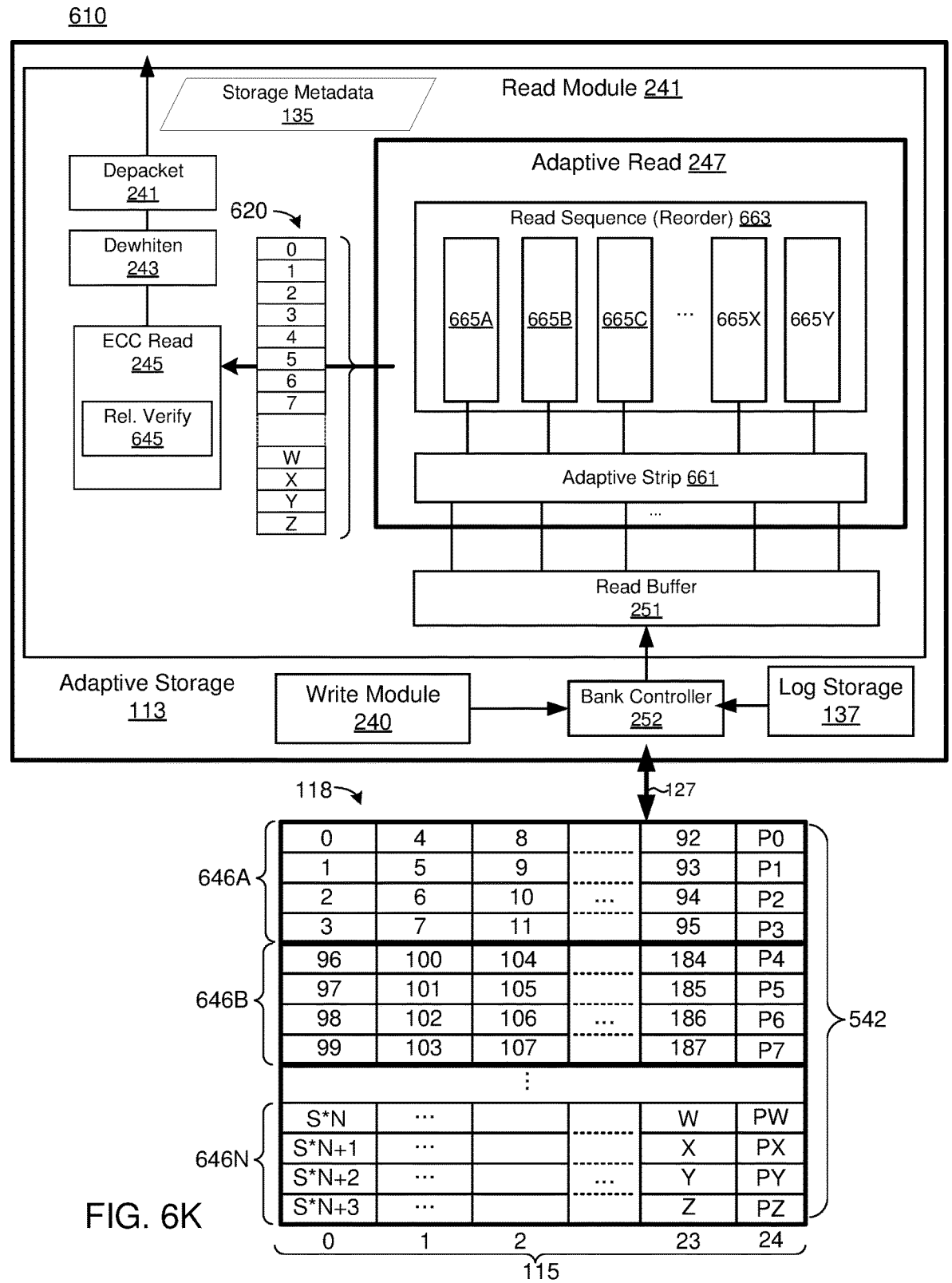
FIG. 6K is a block diagram of another embodiment of a system for adaptive data storage.

FIG. 6K is a block diagram of another embodiment of a system 610 for adaptive data storage. The system 610 illustrates one embodiment of a read module 241 configured to read data stored in a vertical stripe configuration on a solid-state storage array 115. The read module 241 may comprise an adaptive read module 247 configured to read data from rows of the array 115 (e.g., read data stored in vertical stripes 646A-N within logical pages 542 of the array 115). Data may be read into a read buffer 251 by use of the bus 127, bank controller 252, and/or log storage module 137.

The adaptive read module 247 may comprise an adaptive strip module 661 configured to remove and/or avoid data of columns that are OOS (based on the storage metadata 135, as disclosed above), which may comprise removing the data from an incoming data stream by use of a cross-point switch, or the like.

The read sequence module 663 may be configured to reorder and/or recombine ECC codewords 620 in sequence, which may comprise rotating vertical stripes read from the array 115 by use of respective buffers 665A-Y, as disclosed above (e.g., rotating and combining ECC codewords read from respective columns 118 of the array 115). The sequenced ECC codewords 620 may flow to other processing modules of the read module 241.

In some embodiments, the ECC read module 245 may comprise a relational verification module 647 configured to verify relational information on the ECC codewords 620 (e.g., verify and/or authenticate one or more markings on the ECC codewords 620). Verifying relational information my comprise performing an XOR operation between the ECC codewords 620 and respective logical identifier(s) associated with the data structures contained therein. Verifying relational information of an ECC codeword 620 that comprises portions of multiple packets may comprise performing multiple XOR operations, each corresponding to logical identifier(s) of a packet contained therein. The logical identifier information used to perform relational verification may be received via the storage metadata 135 and/or as part of a read request. In some embodiments, requests to read data on the solid-state storage array 115 may be accompanied by the logical identifier(s) associated with the request, which may be translated into physical addresses by use of, inter alia, the storage metadata 135. This logical identifier information may be used to perform relational verification on the corresponding ECC codewords 620. The logical identifier(s) of other data structures within a particular ECC codeword 620 that are not part of the read request (if any) may be determined by use of, inter alia, a reverse index, or the like, of the storage metadata 135.

If the relational verification module 647 fails to verify relational information of an ECC codeword 620, the solid-state adaptive storage module 113 may issue an interrupt, indicating that the data could not be read. In response, the data reconstruction module 170 may attempt to acquire the data from another source and/or from another portion of the solid-state storage array 115. In embodiments in which the relational module 645 watermarks ECC codewords 620 with logical identifier information, the relational verification module 647 may be configured to verify the relational information may performing an equivalent XOR operation. If the relational information differs between the XOR operation performed during storage and the XOR operation performed when the data is read, the corresponding ECC codeword(s) 620 may be corrupted, and the ECC read module 245 will detect uncorrectable errors there; in response, the storage module 130 may issue a read failure interrupt, as disclosed above.

FIG. 6L depicts one embodiment of data flow 611 of a read sequence operation. The data flow 611 depicted in FIG. 6L may be implemented by the adaptive read module 247 as disclosed herein. Referring to FIG. 6J, storage module 130 may receive requests to read data packets 810A, 810B, and 810C. The read sequence module 663 and/or log storage module 137 may configure the adaptive storage module 113 to read data from the columns 118 comprising the requested data (by use of the logical-to-physical translation layer 132). The adaptive storage module 113 may be configured to read the data packets 810A, 810B, and 810C in a single read operation on the array 115, which may comprise providing different addressing information to different sets of columns 118. In the FIG. 6J embodiment, columns 0 and 1 may be configured to read data from logical page 542B, column 2 may be configured to read data from logical page 542A, columns 3 and 4 may be configured to read data from logical page 542N, and columns 21-23 may be configured to read data from logical page 542A. The different addressing information may be sent to the independent columns 118 via the bus 127, as disclosed above.

The read operation may comprise transferring the contents of the specified logical pages into the read buffer 251. FIG. 6L depicts one embodiment of a read buffer comprising data of packets 810A, 810B, and 810C. Columns 0 through 23 of the of the buffer 251 may correspond to columns 118 of the array 115 and, as such, may comprise data read from read buffers of the respective solid-state storage elements 116A-Y comprising the array 115. The contents of columns 5 through 20 are not shown in FIG. 6L to avoid obscuring the details of the depicted embodiment. These columns could, however, comprise data corresponding to other data structures, OOS mask data, or no-op data, read from the corresponding solid-state storage elements 116F-V.

The read sequence module 663 may be configured to determine which portions of the buffer 251 comprise valid data (based on the logical-to-physical translation information, OOS metadata, and so on), and may reorder and/or mask the contents of the read buffer 251 to generate a sequence of ECC codewords 620 comprising the requested data. The read sequence module 663 may be further configured to order the data structures in accordance with an order of the request requests within, inter alia, the request buffer 136. The ECC codeword sequence 622 may comprise an ordered sequence of ECC codewords 622A comprising data structure 810A, followed by the ECC codewords 622B comprising data structure 810B, and the ECC codewords 622C comprising data structure 810C. As illustrated in FIG. 6C, the contents of columns 0 and 1 of logical page 542B (ECC sequence 622C-1) may be ordered after the contents of columns 21-23 (ECC sequence 622C-2) in the sequence 622.

Referring back to FIG. 1, the storage module 130 may comprise a request buffer 136 configured to receive storage requests from one or more storage clients 104. The storage requests may be queued in the request buffer 136, and serviced and/or executed by the storage module 130. In some embodiments, the storage module 130 comprises an adaptive schedule module 114 configured to determine an optimal schedule for storage operations based on, inter alia, the adaptive data configuration on the solid-state storage array 115. As used herein, an "optimal" schedule refers to a schedule that maximizes an objective criteria. In some embodiments, the objective criteria may be maximization of parallelism while maintaining data ordering constraints and/or avoiding hazards, such as read before write, write before read, or the like.

Figure 7:
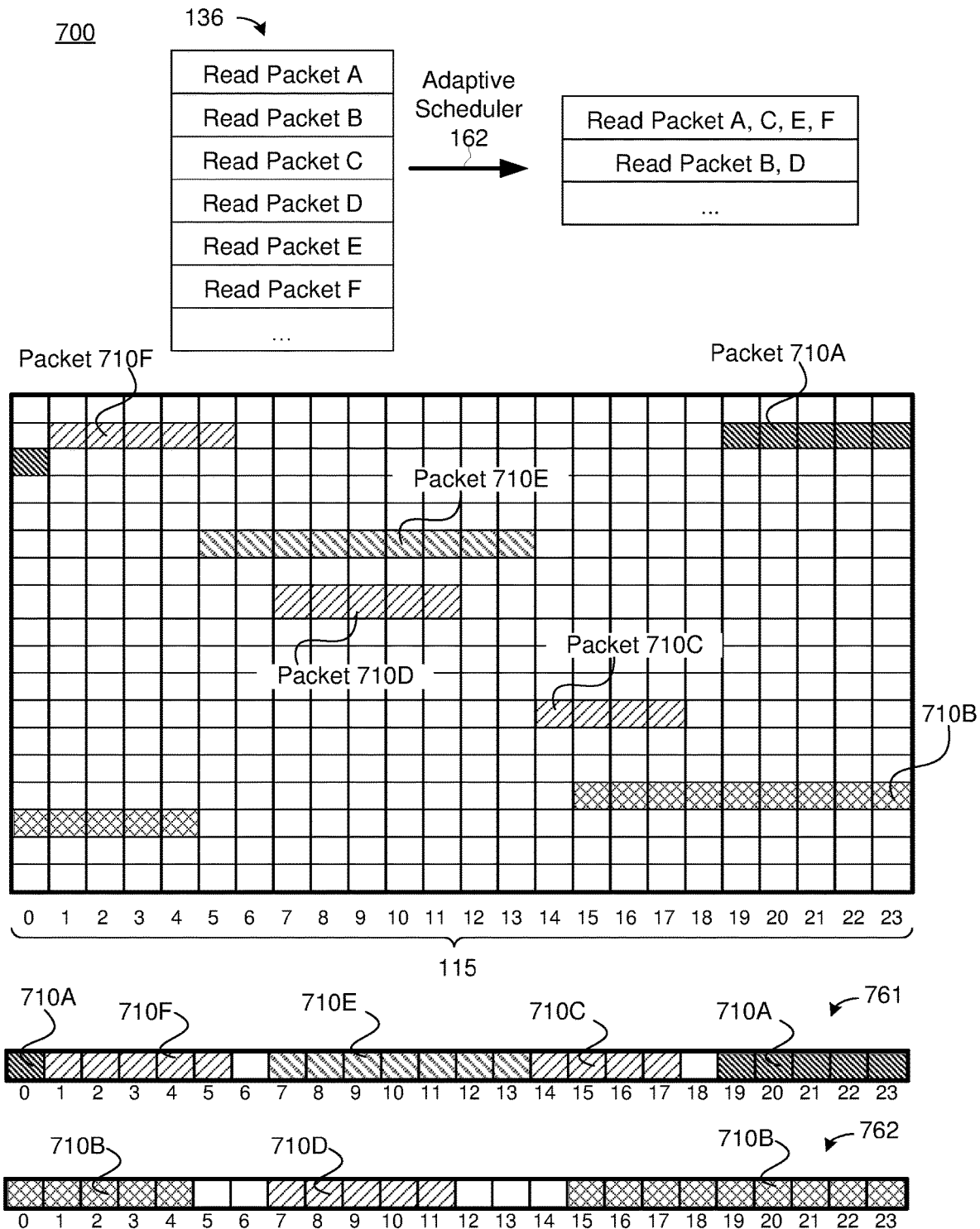
FIG. 7 depicts one embodiment of a system for adaptive scheduling.

FIG. 7 depicts one embodiment of adaptive scheduling performed by the adaptive schedule module 114. The adaptive schedule module 114 may be configured to schedule storage operations in accordance with the adaptive configuration of data structures on a solid-state storage array 115. As illustrated in FIG. 7, an ordered sequence of requests to read packets A, B, C, D, E, and F may be received at the storage module and buffered in the request buffer 136. The adaptive schedule module 114 may be configured to analyze the requests in the buffer 136, determine a layout of data corresponding to the requests on the solid-state storage array 115, and to combine and/or schedule the requests to maximize read parallelism, while avoiding data hazards.

The adaptive schedule module 114 may determine that the read requests correspond to the data layout depicted in FIG. 7, by use of, inter alia, the logical-to-physical translation layer 132 and storage metadata 135. The adaptive schedule module 114 may be further configured to identify column and/or channel conflicts between read requests, which may comprise identifying which read requests require use of columns that are needed by other read requests. As illustrated in FIG. 7, data packets 710A-F stored within overlapping columns of the array 115 may be considered to conflict with respect to read scheduling. In the FIG. 7 embodiment data packets 710A overlaps with (conflicts with) packet 710B, packet 710B overlaps with packet 710A and 710C, packet 710E overlaps with packet 710D and 710F, and so on. The adaptive schedule module 114 may identify channel conflicts by use of column bitmaps, or other technique. The adaptive schedule module 114 may be further configured to identify read requests that can be performed in parallel (e.g., read requests that do not conflict and/or require access to the same columns of the array 115). Non-conflicting read requests may be combined and/or aggregated into a single, composite read request. In the FIG. 7 embodiment, the requests to read packets A, C, E, and F may be combined into a single read operation 761. The requests to read packets B and D may combined into another read operation 762. Data of the read operations 761 and 762 may be processed by the read module 241, which may comprise reordering, ECC decoding, dewhitening, and/or depacketizing the data, as disclosed herein. As illustrated in FIG. 7, the combined read requests may change the order of read operations (perform the read of packets C, E, and F before packet B). The adaptive schedule module 114 may be configured combine, schedule and/or reorder operations to prevent data hazards, such as read-before-write and/or write-before write. Alternatively, the adaptive schedule module 114 may be configured to maintain the order of the requests in the buffer 136, which may limit the degree of parallelism that can be achieved through request scheduling and aggregation.

As disclosed herein, errors within ECC codewords may be detected and/or corrected by the ECC read module 245 as data is read from the solid-state storage array 115. Some ECC codewords, however, may comprise more errors than can be corrected by the ECC algorithm. As disclosed above, in response to detecting an uncorrectable ECC codeword, the adaptive storage module 113 may issue an interrupt to the data recovery module 170, which may attempt to recover the data using, inter alia, parity data stored on the solid-state storage array. In some cases, uncorrectable errors may be cause by the failure of a portion of the solid-state storage array 115. Such errors may occur within specific columns, and as such, error conditions may result in losing the data of portions of a column 118 within the array 115.

Figure 8:
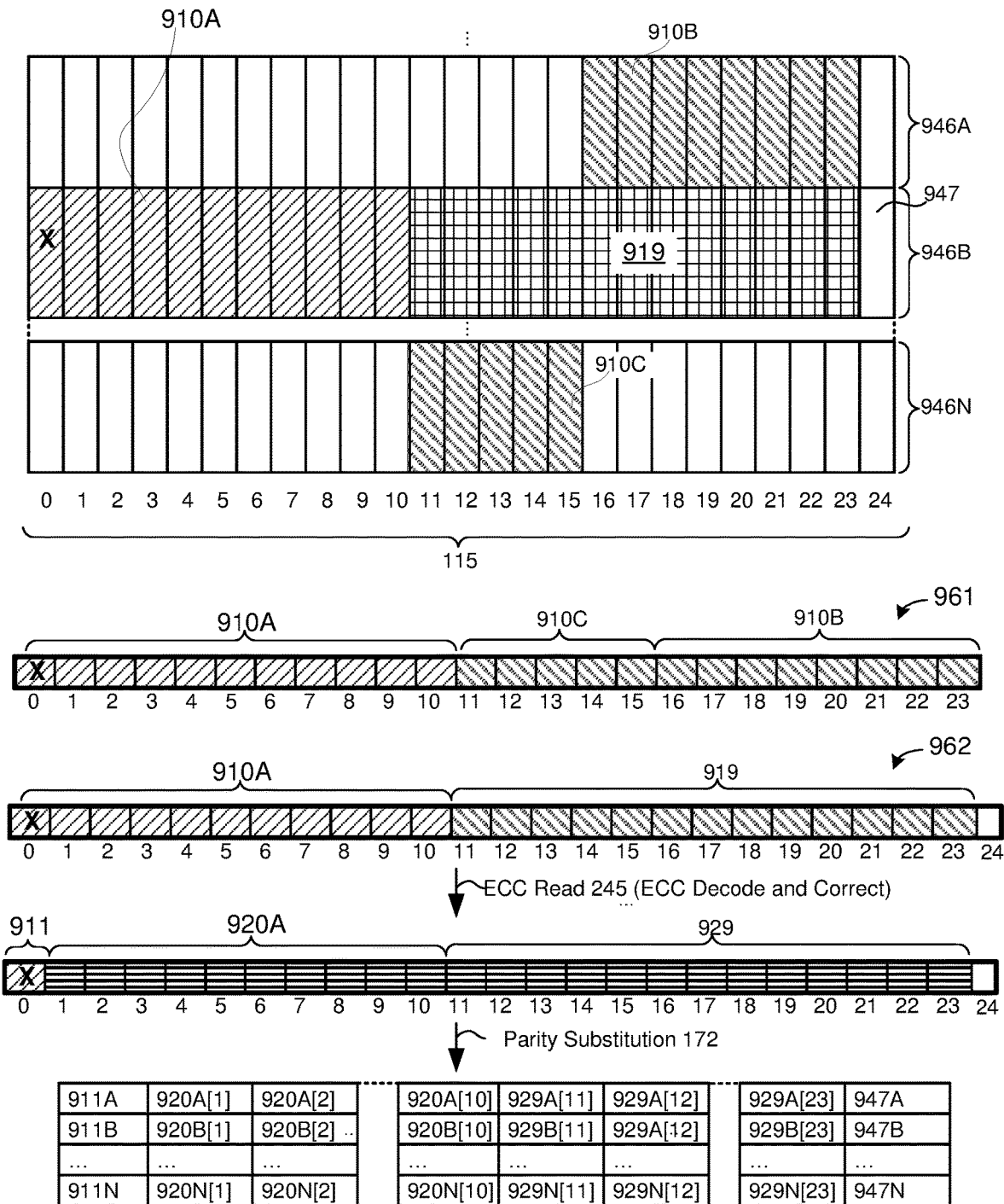
FIG. 8 depicts one embodiment of a system for adaptive data reconstruction.

FIG. 8 is a block diagram of one embodiment of a system 800 for reconstructing data stored on a failed column of a solid-state storage array 115 using, inter alia, parity substitution. Data of packet 910A may be read from the array 115 in a read operation. Data of the packet 910A may be stored within vertical stripe 946B. The read operation 961 may include reading other data packets 910B and 910C within other logical pages 946A and 946N. Data of the other packets 910B and 910C may not comprise uncorrectable errors, and may be processed through the read module 241, as disclosed above.

The ECC codewords in column 0 of the vertical stripe 946B, comprising data of packet 910A, may comprise errors that cannot be corrected by the ECC read module 245. In response, the adaptive storage module 113 may issue an interrupt to the data reconstruction module 170. The data reconstruction module 170 may be configured to determine the source of the uncorrectable error by use of the logical-to-physical translation layer 132, and to reconstruct data of column O in the vertical stripe 946B by use of, inter alia, other ECC codewords and/or the parity data stored within the vertical stripe 946B.

The data reconstruction module 170 may be configured to issue another read operation 962 to read the other ECC codewords 919 within the vertical stripe 946B. The read operation 962 may further comprise reading parity data 947B of the vertical stripe 946B. The data acquired in the read operation 962 may be processed by the adaptive read module 248, which may comprise stripping padding data (if any) from the read buffer 251, as disclosed above. The ECC read module 245 may be configured identify and/or correct errors in the ECC codewords 910A and 919, which may comprise decoding the ECC codewords 910A and 919 and/or generating corrected ECC codewords 920A and 929.

The data reconstruction module 170 may comprise a parity substitution module, which may be configured to reconstruct the ECC codewords 911A-N in column 0 by use of the corrected ECC codewords 920A-N corresponding to columns I through 10, corrected ECC codewords 929A-N corresponding to columns 11-23, and parity data 947A-N: ECC codeword 911A may be reconstructed by use of corrected ECC codewords 920A[1 through 10], corrected ECC codewords 929A[11 through 23], and parity data 947A, ECC codeword 911B may be reconstructed by use of corrected ECC codewords 920B[1 through 10], corrected ECC codewords 929B[11 through 23], and parity data 947B, and so on. As disclosed above, use of the corrected ECC codewords 919A-N and 929A-N may prevent error aggregation during parity substitution operations.

In some embodiments, parity substitution module 172 may be configured to perform a byte-wise parity substitution operation corresponding to the byte-wise parity generation embodiments disclosed in conjunction with FIGS. 6A-6F, 6I and 6K. Following reconstruction of the ECC codewords of column 0, data packet 910A may processed by the read module 241 and returned to the requester, as disclosed herein, which may comprise discarding the other ECC codewords 919 and 929 read from the vertical stripe 946B.

Figure 9:
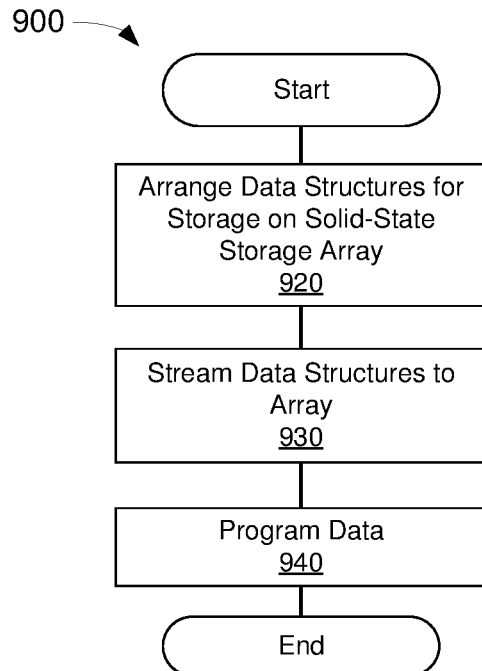
FIG. 9 is a flow diagram of one embodiment of a method for adaptive storage on a solid-state storage array.

FIG. 9 is a flow diagram of one embodiment of a method 900 for adaptive data storage. The method 900, and the other methods disclosed herein, may comprise steps configured for execution by a machine, such as a computing device 101, storage module 130, and/or adaptive storage module 113 as disclosed herein. Steps of the disclosed methods may be embodied as a computer program product, including a computer-readable storage medium comprising instructions configured for execution by a computing device to perform one or more method steps.

The method 900 may start and/or be initialized, which may comprise initializing communication resources, loading computer-executable instructions, and so on.

Step 920 may comprise arranging data for storage on a solid-state storage array 115. The solid-state storage array 115 may comprise a plurality of independent columns 118 (e.g., solid-state storage elements 116A-Y), which may be communicatively coupled to a adaptive storage module 113 in parallel by, inter alia, a bus 127.

In some embodiments step 920 may further comprise generating data structures for storage on the array 115. Step 920 may comprise generating one or more packets 310 comprising data for storage on the array 115, by use of a packet module 242. The packets 310 may comprise contextual metadata pertaining to the data, such as one or more logical identifiers associated with the data, and so on, as disclosed above. Step 920 may further comprise whitening the data packets, by use of a whiten module 244. Step 920 may comprise generating one or more ECC codewords comprising the packets. The ECC codewords may comprise ECC codewords, ECC codewords, ECC symbols, or the like. In some embodiments, step 920 further comprises including relational information in the ECC codewords, which may comprise watermarking the ECC codewords within a bit-mask (or other data) derived from a logical identifier associated with the data packets.

Arranging the data at step 920 may comprise buffering one or more data structures, such that the data structures layout within portions of the solid-state storage array 115. Arranging the data structures at step 920 may, therefore, comprise configuring the data structures to layout in a horizontal, vertical, and/or hybrid configuration within the solid-state storage array 115. Step 820 may comprise a 24 byte by 10 byte buffer of the horizontal embodiment of FIG. 6A. Alternatively, step 920 may comprise arranging the data structures for a vertical data structure layout, as disclosed in conjunction with FIG. 6C; step 920 may comprise using a buffer capable of buffering 24 240 byte ECC codewords 620 (or other data structures) for storage on respective columns of the logical storage element. Step 920 may further comprise arranging the data structures in a hybrid, independent channel configuration as disclosed in conjunction with FIG. 6E; step 920 may comprise buffering data structures in a write buffer capable of buffering 24/N 240 byte ECC codewords 620 data structures where N is the number of independent columns of the hybrid storage arrangement. The data structures may comprise ECC codewords 620. The arrangement of step 920 may comprise configuring data of the same ECC codeword for storage on two of more different independent columns 118 of the array 115. Alternatively, the arrangement of step 920 may comprise configuring data of the ECC codewords for storage within respective columns 118 of the array 115.

Alternatively, or in addition, buffering the data structures at step 920 may comprise configuring the data structures to layout within vertical stripes of the solid-state storage array 115. Step 920 may comprise buffering the data in accordance with a selected vertical stripe depth and/or length, which may correspond to an integral factor of data structures and/or page size of the solid-state storage medium 110. Step 920 may, therefore, comprise streaming ECC codewords 620 into vertical FIFO buffers 662A-X as disclosed in conjunction with FIG. 6I. The vertical stripe configuration may comprise storing ECC codewords 620 within respective columns 118 of the array 115. However, data structures contained within the ECC codewords 620 (e.g., packets) may be configured for storage on two or more different columns 118.

In some embodiments, step 920 further comprises adapting the data layout to avoid portions of the array 115 that are out of service. Step 920 may comprise injecting padding data into the buffer(s) to mask OOS columns 118 of the array (in accordance with the storage metadata 135), as disclosed above.

Step 930 may comprise streaming the data arranged at step 920 to the solid-state storage array 115, as disclosed above. Step 830 may comprise byte-wise streaming bytes to program buffers of a plurality of independent columns 118 of the array 115. Step 930 may further comprise generating byte-wise parity information for storage on a parity column of the array 115, as disclosed above.

Step 940 may comprise programming the contents of the program buffers streamed at step 930 onto a logical page of the solid-state storage array 115. Step 940 may comprise issuing a program command to the solid-state storage array 115 via the bus 127. In response to the command, each of the plurality of independent columns 118 of the array may be configured to perform a program operation concurrently and/or in parallel with other columns 118 within the array 115. Steps 920-940 may further comprise updating the logical-to-physical translation layer 132 to indicate the physical storage locations of the data structures stored on the array 115. The physical storage locations may indicate the bank 119A-N, array 115A-N, logical page 542, offset, and the like, of the data structures. The logical-to-physical translation metadata may comprise any-to-any associations between logical addresses, such as logical identifiers, and addresses of physical storage locations within the array 115.

Figure 10:
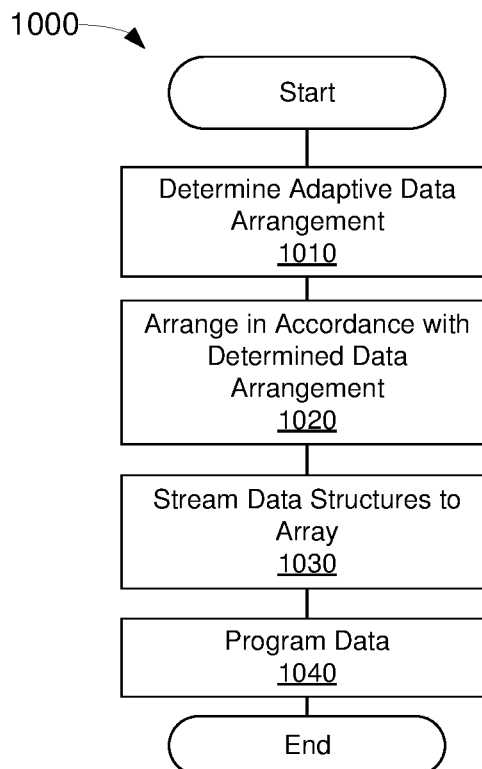
FIG. 10 is a flow diagram of another embodiment of a method for adaptive storage on a solid-state storage array.

FIG. 10 is a flow diagram of another embodiment of a method 1000 for adaptive data storage. The method 1000 may start and/or be initialized as disclosed above.

Step 1010 may comprise determining an adaptive data arrangement for use within a solid-state storage array 115. The determination of step 1010 may be based on, inter alia, a read time Tr of the solid-state storage medium 110, a stream time Ts of the adaptive storage module 113, data access characteristics of storage clients 104, desired IOPS characteristics, data reconstruction characteristics, and so on. The determination of step 1010 may comprise selecting between one or more of: a) a horizontal data arrangement that reduces stream time Tr, but reduces availability of read-parallelism, b) a vertical data arrangement that increases read-parallelism, but may increase stream time Tr, c) a hybrid, independent channel configuration, and/or d) a vertical stripe configuration having a particular vertical stripe depth.

Step 1010 may comprise generating a profile of data storage operations by, inter alia, the adaptive storage profiling module 160. As used herein, profiling data operations refers to gathering information (e.g., storage metadata 135) pertaining to the storage operations performed by storage clients 104 through the storage interface 131. Profiling data may comprise data access patterns, characteristics of the solid-state storage medium 110, bus 127, and so on, which may be used to determine an optimal adaptive data structure layout on the solid-state storage array 115. The adaptive storage profiling module 160 may be configured to gather such profiling information and/or generate recommendations regarding data layout in response to the profiling information. For example, applications that exhibit a large number of data accesses to relatively small data segments and/or packets, may be suited to a vertical configuration, a hybrid, independent channel configuration (e.g., 2 or 4 column channel configuration), and/or a vertical stripe configuration. In another example, the storage medium 110 may exhibit relatively high stream times as compared to read times Tr, and as such, a horizontal and/or wide channel configuration may result in improved performance.

The determination of step 1010 may be based on data reconstruction characteristics of various adaptive data layouts. Over time, the solid-state storage medium 110 may become less reliable and, as such, data structure configuration that provides better data reconstruction performance may be preferred over other configurations. For example, highly vertical configurations, including the vertical stripe configurations, may reduce error aggregation during parity reconstruction operations as compared to horizontal data layouts and, as such, may provide improved data reconstruction performance.

In some embodiments, step 1010 may comprise determining an adaptive data layout by use of an objective function. The objective function may be configured to quantify the performance of different adaptive data layout configurations in view of the profiling data gathered by the adaptive storage profiling module 160 and/or other considerations (e.g., data reconstruction characteristics). The adaptive data configuration that provides the highest utility per the objective function may be identified as the optimal data configuration for the particular set of profiling data and/or other considerations.

Step 1010 may further comprise automatically configuring the storage module 130 to implement the determined adaptive data arrangement. Alternatively, step 1010 may comprise providing information pertaining to the determined adaptive data arrangement to a user, administrator, or other entity, which may determine whether any changes should be implemented.

Steps 1020, 1030, and 1040 may comprise arranging data for storage on the solid-state storage array in accordance with the determined, adaptive data arrangement, streaming the data structures to the array 115, and programming the data to the array 115, as disclosed above.

Figure 11:
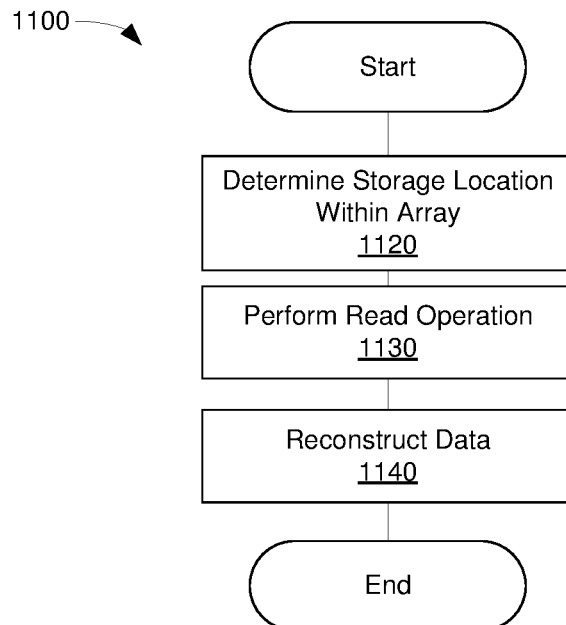
FIG. 11 is a flow diagram of another embodiment of a method for adaptive storage on a solid-state storage array.

FIG. 11 is a flow diagram of another embodiment of a method 1100 for adaptive data storage. Step 1120 may comprise determining the storage location of requested data within the array 115. Step 1120 may comprise determining the storage location by use of a logical-to-physical translation layer 132, which may include storage metadata 135, such as a forward index, map, or the like. The storage location may indicate an adaptive layout configuration of the data structure on the array 115 which, as disclosed herein, may include, but is not limited to: a horizontal configuration, a vertical configuration, a hybrid, independent channel configuration, a vertical stripe configuration, or the like.

Step 1130 may comprise reading the data from the determined storage locations and/or in accordance with the determined data structure configuration. The read operation may comprise reading data from one or more independent columns 118 comprising the array 115 (e.g., reading data from one or more solid-state storage elements 116A-Y), as disclosed herein. Step 1130 may comprise providing columns 118 of the array 115 with respective physical addresses (as determined at step 1120). The physical address may be the same (or equivalent) for each of the solid-state storage elements 116A-Y (e.g., in a horizontal data arrangement). Alternatively, the physical addresses may differ (e.g., for a vertical, hybrid, independent channel, and/or certain vertical stripe configurations). Step 1130 may incur a read latency Tr, as described above.

Step 1130 may further comprise streaming the ECC codewords from read buffer(s) of the array into a adaptive storage module 113. Streaming the data structures may comprise streaming sufficient data to reconstruct a data structure, such as a plurality of ECC codewords 620 comprising one or more packets comprising the requested data. Each cycle of the bus 127 may be configured to transfer a single byte from each column 118 of the array. The number of bus cycles needed to transfer the requested ECC codewords may depend on the arrangement of the data: data arranged horizontally may require ten (10) cycles to transfer a 240 byte ECC codeword from 24 columns 118; data arranged vertically may require two hundred forty (240) cycles to transfer the same 240 byte ECC codeword from a single column 118; data arranged in a hybrid, independent channel arrangement may require 240/N cycles, where N is the number of independent, horizontal columns in the arrangement; and data arranged in vertical stripes may require 240 cycles. In the vertical, hybrid, independent channel, and vertical stripe configurations, however, multiple ECC codewords may be streamed concurrently.

Step 1140 may comprise reconstructing the requested data by use of the adaptive storage module 130 (e.g., an adaptive read module 247). Step 1140 may comprise buffering data read from the array 115, reordering the data, stripping padding data corresponding to 00S columns 118 (if any), and so on as disclosed herein. Step 1140 may further comprise performing ECC error detection and/or on ECC codewords comprising the data packet, by use of the ECC read module 245. ECC processing may further comprise verifying relational information associated with the ECC codewords, such as a watermark on the ECC codewords, which may be derived from one or more logical identifiers associated with the requested data. Step 1140 may further comprise dewhitening the data packets, by use of the dewhite module 243 and depacketizing the data by use of the depacket module 241, as disclosed herein.

Figure 12:
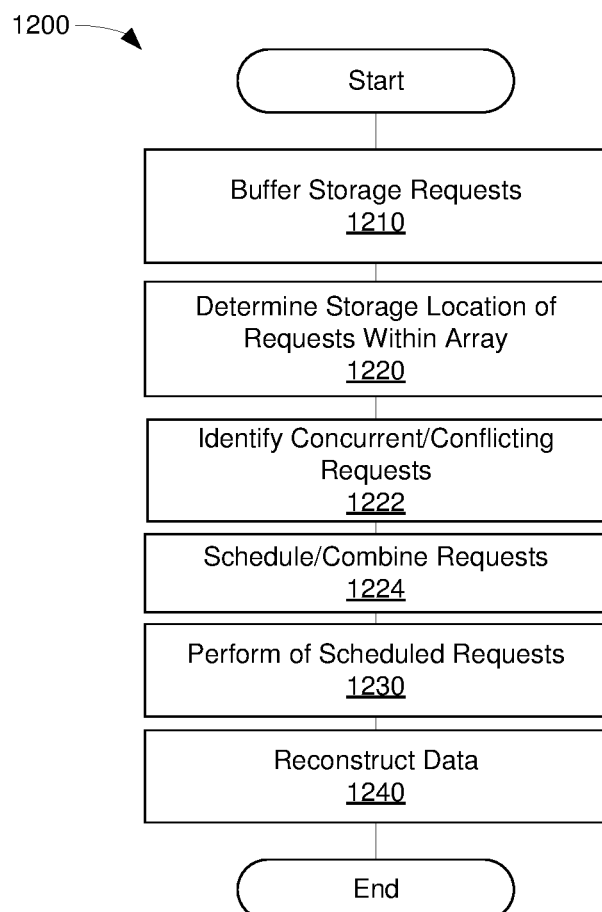
FIG. 12 is a flow diagram of one embodiment of a method for adaptive scheduling of storage requests.

FIG. 12 is a flow diagram of another embodiment of a method 1200 for adaptive request scheduling. Step 1210 may comprise buffering storage requests within a request buffer 136 of the storage module 130. The requests may be ordered within the buffer 136.

Step 1220 may comprise determining storage location(s) corresponding to the requests within the array 115, as disclosed above.

Step 1222 may comprise identifying storage requests that can be executed concurrently (e.g., do not conflict). As disclosed above, a storage request conflict refers to storage requests that cannot be performed concurrently within the same bank 119 and/or array 115. A storage request conflict may result from data structures associated with the requests overlapping within the array 115, such that the storage requests pertain to data stored within one or more of the same columns 118 within the array 115. Storage requests that can be executed concurrently may refer to storage requests that pertain to data stored on different independent columns 118 of the array 115.

Step 1224 may comprise scheduling and/or combining the requests in accordance with the concurrencies and/or conflicts identified at step 1222. Step 1224 may comprise combining requests that can be performed concurrently (e.g., do not conflict). Combining requests may comprise reordering requests within the buffer (e.g., changing the order of the requests within the buffer 136), as disclosed above, in order to combine concurrent requests and/or avoid request conflicts. Accordingly, step 1224 may comprise determining that the scheduled storage requests and/or storage request combinations do not create data hazards, such as read-before-write hazards, write-before-read hazards, or the like. In some embodiments, step 1224 may be limited to combining requests without changing request ordering, to ensure that data hazards do not occur.

Step 1230 may comprise performing the scheduled requests, which may comprise performing one or more combined read operations, as disclosed herein. Step 1240 may comprise reconstructing data of the requests by use of a read module 241, adaptive read module 247, and so on, as disclosed herein.

Figure 13:
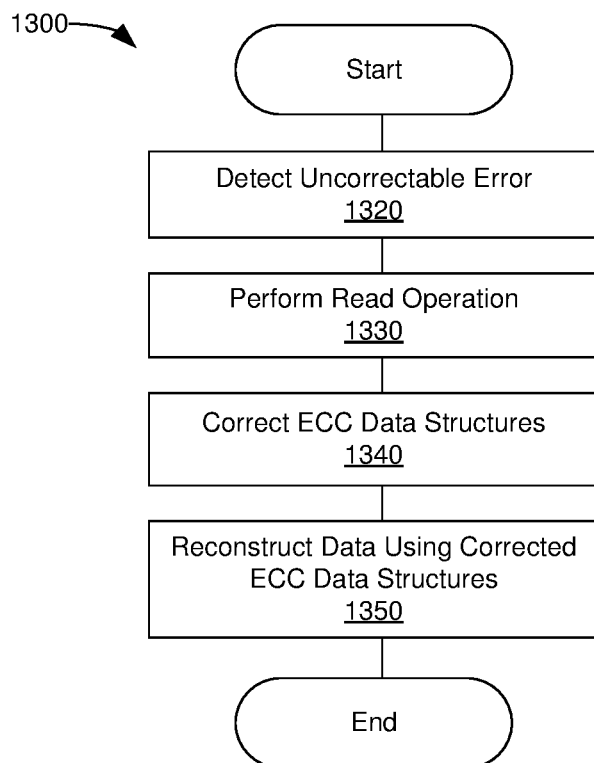
FIG. 13 is a flow diagram of one embodiment of a method for adaptive data recovery.

FIG. 13 is a flow diagram of one embodiment of a method 1300 for adaptive data reconstruction. Step 1320 may comprise detecting an uncorrectable error in an ECC codeword. Step 1320 may comprise detecting the error by use of an ECC read module 245 of the read module 241. Step 1320 may further comprise issuing an interrupt to a data reconstruction module 170, as disclosed herein. In some embodiments, step 1320 further comprises determining the source of the uncorrectable error, which may include identifying the column 118 (e.g., particular solid-state storage element 116A-Y) from which the uncorrectable data was read. Determining the source of the error may comprise referencing storage metadata 135, such as the logical-to-physical translation between the data and physical storage location. Alternatively, identifying the source of the error may comprise iterative parity substitution, as disclosed above.

Step 1330 may comprise performing a read operation to read ECC codewords within the same vertical stripe as the uncorrectable error, as disclosed above in conjunction with FIG. 8. Alternatively, step 1330 may comprise performing a read operation to read ECC codewords within other columns 118 of a vertical data configuration and/or within other channels of a hybrid, independent channel configuration. Step 1330 may further comprise reading parity data corresponding to the vertical stripe, vertical data configuration, and/or hybrid, independent channel configuration, as disclosed herein.

Step 1340 may comprise correcting ECC codewords in the vertical stripe and/or other columns 118. Correcting the ECC codewords may comprise processing the ECC codewords using the ECC read module 245 and/or relational verification module 647, as disclosed above. In some embodiments, step 1340 may be omitted, and the reconstruction step 1350 may proceed without first decoding and/or correcting the ECC codewords of the other columns 118.

Step 1350 may comprise reconstructing the uncorrectable data by use of the corrected ECC codewords and parity data. Step 1350 may comprise a byte-wise parity substitution operation between the corrected ECC codewords and the parity data. In hybrid, independent channel configurations, step 1350 may further comprise determining the source of the uncorrectable error using iterative parity substitution within the independent channel comprising the uncorrectable error. In a two-channel configuration, iterative parity substitution may comprise determining which of the two channels is the source of the error. Other hybrid, independent channel configurations may involve additional iterations, in accordance with the width of the channels.

Step 1350 may further comprise reconstructing the data by, inter alia, decoding the ECC codewords, including the reconstructed ECC codewords, dewhitening, and depacketizing the data, as disclosed above.

Figure 14:
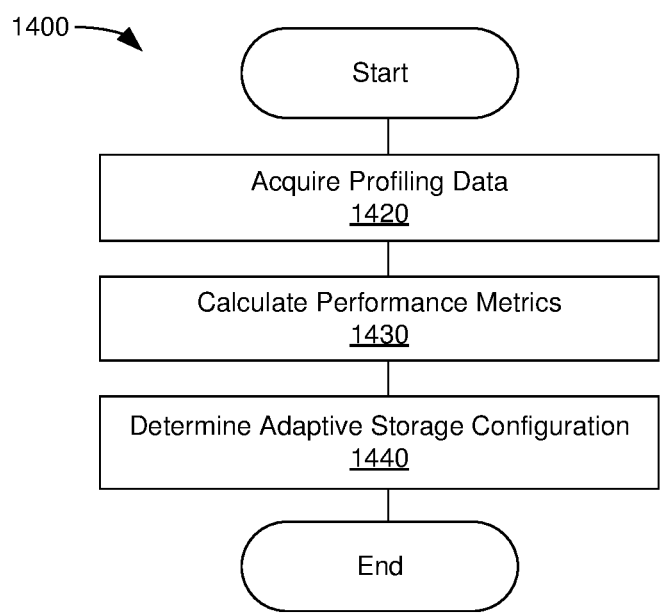
FIG. 14 is a flow diagram of one embodiment of a method for determining an adaptive data storage configuration.

FIG. 14 is a flow diagram of one embodiment of a method 1400 for determining an adaptive storage configuration. Step 1420 may comprise acquiring profiling data 1420. Step 1420 may comprise accessing profiling data generated by the storage module 130, stored, in a log storage format, on the solid-state storage medium 110, and/or the like. The profiling data may include an ordered history of storage operations and/or requests received at the storage module 130.

Step 1430 may comprise determining performance metrics of one of more adaptive data storage configurations. Step 1430 may comprise replaying and/or simulating the history of storage requests in one or more different adaptive storage configurations, which may include, but are not limited to: a horizontal configuration, a vertical configuration, a hybrid, independent channel configuration, a vertical stripe configuration (of various vertical stripe depths), and/or the like. Step 1430 may comprise determining the simulating the contents of various portions of the solid-state storage array 115 under the different adaptive data configurations, scheduling read operations according to the adaptive layout (using the adaptive schedule module 114), and/or the like. The performance metrics may be based on one or more of a desired IOPS metric, a read time Ts, a stream time Ts, and so on, as disclosed above.

Step 1440 may comprise determining an adaptive storage configuration. Step 1440 may comprise determining an optimal adaptive storage configuration based on the performance metrics and/or one or more objective functions. The determination of step 1440 may include various metrics and/or considerations, including the performance metrics calculated at step 1430, data reconstruction characteristics of various data layout configurations, and so on. Step 1440 may further comprise providing an indication of the determined storage configuration (to a user, administrator, or other entity), automatically configuring the adaptive storage module 113 to operate in accordance with the determined adaptive storage configuration, and/or the like.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

Furthermore, the described features, operations, or characteristics may be combined in any suitable manner in one or more embodiments. It will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of medium/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc., that perform one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

It will be understood by those having skill in the art that many changes may be made to the details of the above-described embodiments without departing from the underlying principles of the disclosure.

What is claimed is:

1. A method, comprising:
    managing, via a storage module, storage operations for a solid-state storage array comprising a plurality of independent data columns, wherein each independent data column comprises a solid-state storage element;
    generating, via an error-correcting code (ECC) write module, a plurality of ECC codewords comprising data for storage on the solid-state storage array;
    determining, via an adaptive profiling module:
        performance metrics corresponding to a plurality of adaptive data storage configurations; and
        an optimal adaptive data storage configuration based on the determined performance metrics;
    storing, via an adaptive write module, the plurality of ECC codewords on the solid-state storage elements of the solid-state storage array according to the optimal adaptive data storage configuration;
    identifying an uncorrectable ECC codeword stored within one of the plurality of solid-state storage elements;
    correcting one or more ECC codewords stored within others of the plurality of solid-state storage elements;
    generating, via a parity module, respective parity data for the uncorrectable ECC codeword and the corrected ECC codewords; and
    reconstructing, via a data reconstruction module, an uncorrectable ECC codeword using the corrected ECC codewords and the respective parity data.

2. The method of claim 1, further comprising:
    detecting, via an ECC read module, the uncorrectable ECC codeword in response to a first read operation;
    recovering, via a data recovery module, the uncorrectable ECC codeword by reading other ECC codewords within a vertical stripe with the uncorrectable ECC codewords in a second read operation;
    decoding the other ECC codewords; and
    reconstructing the uncorrectable ECC codeword using the decoded ECC codewords and parity data of the vertical stripe.

3. The method of claim 1, further comprising performing, via a grooming module, grooming operations.

4. The method of claim 3, wherein the grooming operations comprise reclaiming storage resources, erasure, wear leveling, refreshing data stored on the solid-state storage array, or some combination thereof.

5. The method of claim 1, wherein the solid-state storage array comprises flash memory.

6. The method of claim 1, wherein the solid-state storage array comprises a plurality of physical storage cells configured for persistent data storage.

7. The method of claim 6, wherein the plurality of physical storage cells is arranged in groups.

8. The method of claim 7, wherein each group of the groups comprises a page.

9. The method of claim 7, wherein the groups are partitioned into storage divisions.

10. The method of claim 9, wherein each storage division of the storage divisions comprises an erase block.

11. The method of claim 1, further comprising:
    queuing storage requests for the solid-state storage array in an ordered request buffer; and
    reordering the storage requests in the ordered request buffer;
    wherein:
    the storage module comprises the ordered request buffer; and
    the ordered request buffer is configured to receive the storage requests from one or more store clients, and to buffer the storage requests received via a bus comprising a peripheral component interconnect express bus.

12. The method of claim 1, wherein the storage module comprises a logical-to-physical translation layer comprising any-to-any mappings.

13. The method of claim 1, wherein managing the storage operations for the solid-state storage array further comprises actively scanning the solid-state storage array to identify sections of the solid-state storage array to be taken out of service.

14. The method of claim 1, wherein:
    reconstructing the uncorrectable ECC codeword using the corrected ECC codewords and the respective parity data further comprises reconstructing the uncorrectable ECC codeword based on a horizontal stripe configuration, a vertical stripe configuration, the parity, or some combination thereof; and wherein:

the plurality of adaptive data storage configurations corresponds to storage of the ECC codewords in one of a horizontal configuration, a vertical configuration, a hybrid configuration, or a vertical stripe configuration.

15. The method of claim 1, further comprising combining, via an adaptive schedule module, two or more read operations into a combined read operation, wherein the two or more read operations correspond to ECC codewords stored within different sets of the storage elements of the solid-state storage array.

16. An apparatus, comprising:
a bus;
a storage module comprising:
    a logical-to-physical translation layer; and
    an ordered request buffer;
an error-correcting code (ECC) write module configured to generate a plurality of ECC codewords comprising data for storage on the solid-state storage array;
an adaptive profiling module configured to determine:
    performance metrics corresponding to a plurality of adaptive data storage configurations; and
    an optimal adaptive data storage configuration based on the determined performance metrics;
an adaptive write module configured to store the plurality of ECC codewords within a plurality of solid-state storage elements of the solid-state storage array according to the optimal adaptive data storage configuration;
a parity module configured to generate respective parity data for an uncorrectable ECC codeword stored within one of the plurality of solid-state storage elements and a plurality of correctable ECC codewords stored within others of the plurality of solid-state storage elements; and
a data reconstruction module configured to reconstruct the uncorrectable ECC codeword using the correctable ECC codewords and the respective parity data.

17. The apparatus of claim 16, further comprising:
an ECC read module configured to detect the uncorrectable ECC codeword in response to a first read operation; and
a data recovery module configured to:
    recover the uncorrectable ECC codeword by reading other ECC codewords within a vertical stripe with the uncorrectable ECC codeword in a second read operation;
    decode the other ECC codewords; and
    reconstruct the uncorrectable ECC codeword using the decoded ECC codewords and parity data of the vertical stripe.

18. The apparatus of claim 16, further comprising a groomer module configured to perform grooming operations.

19. The apparatus of claim 18, wherein the grooming operations comprise reclaiming storage resources, erasure, wear leveling, refreshing data stored on the solid-state storage array, or some combination thereof.

20. The apparatus of claim 16, wherein the solid-state storage array comprises flash memory.

21. The apparatus of claim 16, wherein the solid-state storage array comprises a plurality of physical storage cells configured for persistent data storage.

22. The apparatus of claim 21, wherein the plurality of physical storage cells is arranged in groups.

23. The apparatus of claim 22, wherein each group of the groups comprises a page.

24. The apparatus of claim 22, wherein the groups are partitioned into storage divisions.

25. The apparatus of claim 24, wherein each storage division of the storage divisions comprises an erase block.

26. The apparatus of claim 16, wherein the bus comprises a peripheral component interconnect express bus.

27. The apparatus of claim 16, wherein the logical-to-physical translation layer comprises any-to-any mappings.

28. The apparatus of claim 16, wherein the storage module is configured to actively scan the solid-state storage array to identify sections of the solid-state storage array to be taken out of service.

29. The apparatus of claim 16, wherein the data reconstruction module is configured to reconstruct the uncorrectable ECC codeword based on a horizontal stripe configuration, a vertical stripe configuration, the parity, or some combination thereof.

30. The apparatus of claim 16, further comprising an adaptive schedule module configured to combine two or more read operations into a combined read operation, wherein the two or more read operations correspond to ECC codewords stored within different sets of storage elements of the solid-state storage array.

* * * * *